United States Patent
Ros et al.

(10) Patent No.: US 11,867,644 B2
(45) Date of Patent: Jan. 9, 2024

(54) DEVICE FOR TUNING MICROFLUIDIC DROPLET FREQUENCY AND SYNCHRONIZING PHASE FOR SERIAL FEMTOSECOND CRYSTALLOGRAPHY

(71) Applicant: ARIZONA BOARD OF REGENTS ON BEHALF OF ARIZONA STATE UNIVERSITY, Scottsdale, AZ (US)

(72) Inventors: Alexandra Ros, Phoenix, AZ (US); Daihyun Kim, Mesa, AZ (US); Austin Echelmeier, Tempe, AZ (US); Jorvani Cruz Villarreal, Tempe, AZ (US); Ana Egatz-Gomez, Phoenix, AZ (US); Sebastian Quintana, Phoenix, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 345 days.

(21) Appl. No.: 17/220,357

(22) Filed: Apr. 1, 2021

(65) Prior Publication Data
US 2021/0302334 A1 Sep. 30, 2021

Related U.S. Application Data

(63) Continuation of application No. 16/616,189, filed as application No. PCT/US2018/033989 on May 22, 2018, now Pat. No. 10,969,350.
(Continued)

(51) Int. Cl.
*G01N 23/20025* (2018.01)
*B33Y 80/00* (2015.01)
(Continued)

(52) U.S. Cl.
CPC ...... *G01N 23/20025* (2013.01); *B01L 3/0241* (2013.01); *B01L 3/50273* (2013.01);
(Continued)

(58) Field of Classification Search
CPC . G01N 23/20025; C30B 29/58; B01L 3/0241; B01L 3/0268; B01L 3/502784
See application file for complete search history.

(56) References Cited

U.S. PATENT DOCUMENTS

5,105,843 A 4/1992 Condron et al.
6,174,469 B1 1/2001 Ganan-Calvo
(Continued)

FOREIGN PATENT DOCUMENTS

WO WO-2009091416 A2 ‡ 7/2009
WO WO2009091416 A2 7/2009
(Continued)

OTHER PUBLICATIONS

Nakano et al., "Temporal and Spatial Temperature Measurement in Insulator-based Dielectrophoretic Devices," Analytical Chemistry (2014) 86, 65166524.‡
(Continued)

*Primary Examiner* — Reinaldo Sanchez-Medina
(74) *Attorney, Agent, or Firm* — Michael Best & Friedrich LLP

(57) ABSTRACT

Methods and systems are provided for serial femtosecond crystallography for reducing the vast amount of waste of injected crystals practiced with traditional continuous flow injections. A micrometer-scale 3-D printed water-in-oil droplet generator device includes an oil phase inlet channel, an aqueous phase inlet channel, a droplet flow outlet channel, and two embedded non-contact electrodes. The inlet and outlet channels are connected internally at a junction. The electrodes comprise gallium metal injected within the 3-D
(Continued)

printed device. Voltage across the electrodes generates water-in-oil droplets, determines a rate for a series of droplets, or triggers a phase shift in the droplets. An external trigger generates the droplets based on the frequency of an XFEL utilized in droplet detection, thereby synchronizing a series of droplets with x-ray pulses for efficient crystal detection. The generated droplets can be coupled to an SFX with XFEL experiment compatible with common liquid injector such as a GDVN.

16 Claims, 74 Drawing Sheets

Related U.S. Application Data

(60) Provisional application No. 62/630,105, filed on Feb. 13, 2018, provisional application No. 62/509,538, filed on May 22, 2017.

(51) Int. Cl.
*B01L 3/02* (2006.01)
*B01L 3/00* (2006.01)

(52) U.S. Cl.
CPC ....... *B33Y 80/00* (2014.12); *B01L 2300/0867* (2013.01); *G01N 2223/602* (2013.01)

(56) References Cited

U.S. PATENT DOCUMENTS

| | | | |
|---|---|---|---|
| 6,221,654 B1 ‡ | 4/2001 | Quake | B01L 3/502761 366/DIG. 3 |
| 6,822,180 B2 ‡ | 11/2004 | Fujii et al. | B01D 57/02 209/128 |
| 6,976,590 B2 ‡ | 12/2005 | Deshpande | F15C 5/00 209/631 |
| 7,341,211 B2 ‡ | 3/2008 | Ganan Calvo et al. | B05B 5/0255 239/371 |
| 7,584,857 B2 ‡ | 9/2009 | Böhm et al. | B07C 5/34 209/155 |
| 7,708,949 B2 | 5/2010 | Stone et al. | |
| 8,272,576 B2 ‡ | 9/2012 | Doak et al. | B05B 7/0475 239/8 |
| 8,658,367 B2 ‡ | 2/2014 | Quake | G01N 15/1484 435/6.12 |
| 8,827,548 B2 ‡ | 9/2014 | Roukes et al. | G01N 33/5029 374/31 |
| 8,844,570 B2 ‡ | 9/2014 | Glick | F15C 1/00 137/807 |
| 9,038,919 B2 ‡ | 5/2015 | Link | B01F 13/0074 239/3 |
| 9,192,944 B2 ‡ | 11/2015 | Ros et al. | B03C 7/02 |
| 9,227,200 B2 ‡ | 1/2016 | Chiou et al. | G01N 27/44791 |
| 9,289,787 B2 ‡ | 3/2016 | Doak et al. | B01L 3/0268 |
| 9,387,488 B2 ‡ | 7/2016 | Chou et al. | B03C 5/005 |
| 9,446,360 B2 ‡ | 9/2016 | Mazutis | B01F 13/0062 |
| 9,643,136 B2 ‡ | 5/2017 | Hansen et al. | B01F 5/00 |
| 9,839,922 B2 ‡ | 12/2017 | Doak et al. | B05B 1/08 |
| 10,166,542 B2 ‡ | 1/2019 | Ros et al. | B01L 3/502761 |
| 10,413,920 B2 ‡ | 9/2019 | Doak et al. | B05B 7/0475 |
| 10,557,807 B2 ‡ | 2/2020 | Ros et al. | B01L 3/5027 |
| 2007/0003442 A1 ‡ | 1/2007 | Link | B01F 13/0074 422/400 |
| 2007/0012891 A1 | 1/2007 | Maltezos et al. | |
| 2007/0080062 A1 ‡ | 4/2007 | Harnett et al. | B03C 5/005 204/450 |
| 2007/0228049 A1 ‡ | 10/2007 | Nordmeyer et al. | G01N 23/207 220/560.07 |
| 2008/0105565 A1 ‡ | 5/2008 | Davalos et al. | B03C 5/005 205/775 |
| 2009/0235990 A1 ‡ | 9/2009 | Beer | G05D 7/0694 137/3 |
| 2010/0163116 A1 ‡ | 7/2010 | Fang et al. | B41J 2/1642 137/334 |
| 2010/0196892 A1 ‡ | 8/2010 | Quake | C12Q 1/6816 435/6.12 |
| 2010/0224255 A1 ‡ | 9/2010 | Mathies et al. | B01L 3/50273 137/1 |
| 2010/0224493 A1 ‡ | 9/2010 | Davalos et al. | G01N 27/44791 204/547 |
| 2010/0303687 A1 ‡ | 12/2010 | Blaga et al. | F16K 99/0001 422/504 |
| 2012/0021523 A1 ‡ | 1/2012 | Fowler et al. | G01N 23/20025 436/4 |
| 2012/0085649 A1 ‡ | 4/2012 | Sano et al. | B01L 3/502715 204/547 |
| 2012/0196288 A1 * | 8/2012 | Beer | B01L 3/502761 435/6.12 |
| 2012/0266986 A1 ‡ | 10/2012 | Wimberger-Friedl et al. | F04B 19/006 137/565.01 |
| 2013/0032235 A1 ‡ | 2/2013 | Johnstone et al. | F04B 43/02 137/833 |
| 2013/0295653 A1 ‡ | 11/2013 | Quake et al. | B01F 13/0093 435/283.1 |
| 2013/0308756 A1 ‡ | 11/2013 | Bogan | H01J 49/167 378/86 |
| 2013/0313336 A1 ‡ | 11/2013 | Doak et al. | B05B 7/04 239/8 |
| 2014/0038279 A1 ‡ | 2/2014 | Ingber et al. | C12M 23/38 435/297.2 |
| 2014/0091012 A1 ‡ | 4/2014 | Ros et al. | B01L 3/502753 209/129 |
| 2014/0263693 A1 ‡ | 9/2014 | Doak et al. | B05B 7/2483 239/1 |
| 2014/0295572 A1 ‡ | 10/2014 | Fraden et al. | B01L 3/502784 436/180 |
| 2015/0087559 A1 ‡ | 3/2015 | Putnam et al. | B01L 3/502738 506/39 |
| 2015/0258520 A1 * | 9/2015 | Griffiths | B01F 33/3011 506/40 |
| 2016/0051995 A1 ‡ | 2/2016 | Weierstall et al. | B05B 7/064 239/8 |
| 2016/0129443 A1 ‡ | 5/2016 | Tovar | B01L 3/0268 506/27 |
| 2016/0136643 A1 * | 5/2016 | Larson | B01L 3/502784 204/451 |
| 2016/0151784 A1 ‡ | 6/2016 | Chiou et al. | B01L 3/502715 204/451 |
| 2016/0341675 A1 ‡ | 11/2016 | Doak et al. | G01N 23/20008 |
| 2016/0370306 A1 ‡ | 12/2016 | Conrad | C30B 29/58 |
| 2017/0274380 A1 ‡ | 9/2017 | Weierstall et al. | B01F 3/04007 |
| 2017/0297024 A1 ‡ | 10/2017 | Ros et al. | B01L 3/502761 |
| 2018/0154380 A1 ‡ | 6/2018 | Doak et al. | B05B 7/0475 |
| 2018/0193829 A1 * | 7/2018 | Boitard | B01L 3/0241 |
| 2018/0321130 A1 * | 11/2018 | Wu | G01N 15/1459 |
| 2019/0134631 A1 ‡ | 5/2019 | Ros et al. | B01L 3/502715 |
| 2019/0178822 A1 ‡ | 6/2019 | Ros et al. | B01L 3/502715 |
| 2019/0184395 A1 ‡ | 6/2019 | Ros et al. | B03C 5/005 |
| 2019/0224689 A1 ‡ | 7/2019 | Ros et al. | B03C 5/026 |
| 2020/0141886 A1 | 5/2020 | Ros et al. | |
| 2020/0360944 A1 | 11/2020 | Ros et al. | |
| 2020/0363348 A1 | 11/2020 | Ros et al. | |
| 2021/0001359 A1 | 1/2021 | Kirian et al. | |

FOREIGN PATENT DOCUMENTS

| | | |
|---|---|---|
| WO | WO-2011150368 A1 ‡ | 12/2011 |
| WO | WO2011150368 A1 | 12/2011 |
| WO | WO2013075081 A2 | 5/2013 |
| WO | WO-2013075081 A2 ‡ | 5/2013 |
| WO | WO2014151231 A1 | 9/2014 |
| WO | WO-2014151231 A1 ‡ | 9/2014 |
| WO | WO-2016044545 A1 ‡ | 3/2016 |
| WO | WO2016044545 A1 | 3/2016 |
| WO | WO2016164562 A1 | 10/2016 |
| WO | WO-2016164562 A1 ‡ | 10/2016 |

(56) References Cited

FOREIGN PATENT DOCUMENTS

| WO | WO-2017003725 | A1 | ‡ | 1/2017 |
|---|---|---|---|---|
| WO | WO2017003725 | A1 | | 1/2017 |
| WO | WO-2018013685 | A1 | ‡ | 1/2018 |
| WO | WO2018013685 | A1 | | 1/2018 |
| WO | WO-2018217793 | A1 | ‡ | 11/2018 |
| WO | WO2018217793 | A1 | | 11/2018 |
| WO | WO-2018217831 | A1 | ‡ | 11/2018 |
| WO | WO2018217831 | A1 | | 11/2018 |

OTHER PUBLICATIONS

Nakano et al., Immunoglobulin G and bovine serum albumin streaming dielectrophoresis in a microfluidic device. Electrophoresis 2011, 32 (17), 2314-2322.‡
Navratil et al., Giant mitochondria do not fuse and exchange their contents with normal mitochondria. Exp Cell Res 2008, 314 (1), 164-72.‡
Nelson et al., "Three-dimensional-printed gas dynamic virtual nozzles for x-ray laser sample delivery". Optics Express, 2016, 24, 11515-11530.‡
Novak J P. et al., "Purification of Molecularly Bridged Metal Nanoparticle Arrays by Centrifugation and Size Exclusior Chromatography", Analytical Chemistry, vol. 73, Issue 23, pp. 5758-5761 (2001).‡
Ozuna-Chacon S et al., "Performance characterization of an insulator-based dielectrophoretic microdevice", Electrophoresis, vol. 29, Issue 15, pp. 3115-3122 (2008).‡
Morgan et al., Separation of submicron bioparticles by dielectrophoresis. Biophysical Journal 1999, 77 (1), 516-525.‡
Muller T. et al., "A 3-D microelectrode system for handling and caging single cells and particles", Biosensors & Bioelectronics, vol. 14, Issue 3, pp. 247-256 (1999).‡
Nakano A. et al., "Tuning direct current streaming dielectrophoresis of proteins", Biomicrofluidics, vol. 6, Issue 3, pp. 34108 (2012).‡
Matias et al., Giant mitochondria and intramitochondrial inclusions in benign thyroid lesions. Ultrastruct Pathol 1991, 15 (3), 221-9.‡
McFaul et al., Cell separation based on size and deformability using microfluidic funnel ratchets. Lab on a Chip 2012, 12 (13), 2369-2376.‡
Michelsen et al., Isolation of Subcellular Organelles and Structures. Methods in Enzymology 2009, 463, 305-28.‡
Pohl, Dielectrophoresis : The Behavior of Neutral Matter in Non-uniform Electric Fields. Cambridge ; New York : Cambridge University Press 1978.‡
Pommer M.S. et al., "Dielectrophoretic separation of platelets from diluted whole blood in microfluidic channels", Electrophoresis, vol. 29, issue 6, pp. 1213-1218 (2008).‡
Redecke L. et al., "Natively Inhibited Trypanosoma brucei Cathepsin B Structure Determined by Using an X-ray Laser", Science, vol. 339, Issue 6116, pp. 227-230 (2013)‡
Regtmeier et al., "Dielectrophoretic manipulation of DNA: Separation and polarizability," A. Anal. Chem. 2007, 79, 39253932.‡
Regtmeier et al., Acceleration of absolute negative mobility. Journal of Separation Science 2007, 30 (10), 1461-1467.‡
Roessler, C. et al., "Acoustic Injectors for Drop-On-Demand Serial Femtosecond Crystallography", Structure, Apr. 2016 [available online Mar. 2016], vol. 24, No. 4, pp. 631-6410, S1-S19.‡
Safarik et al., Magnetic techniques for the isolation and purification of proteins and peptides. Biomagn Res Technol 2004, 2, 7, 18 pages.‡
Pethig, Review Article-Dielectrophoresis: Status of the theory, technology, and applications. Biomicrofluidics 2010, 4 (2) 022811-1-022811-35.‡
Pohl H.A. et al., "Di Electrophoresis of Cells", Biophysical Journal, vol. 11, pp. 711-727 (1971).‡
Pohl H.A. et al., "Dielectrophoretic Force", J Theor. Biol., vol. 37, pp. 1-13 (1972).‡

Pamme N. et al., "Continuous sorting of magnetic cells via on-chip free-flow magnetophoresis", Lab on a Chip, vol. 6, Issue 8, pp. 974-980 (2006).‡
Pamme N. et al., "On-Chip Free-Flow Magnetophoresis: Continuous Flow Separation of Magnetic Particles and Agglomerates", Analytical Chemistry, vol. 76, Issue 24, pp. 7250-7256 (2004).‡
Papadimitriou et al., Giant mitochondria with paracrystalline inclusions in paraganglioma of the urinary bladder: correlation with mitochondrial abnormalities in paragangliomas of other sites. Ultrastruct Pathol 1994, 18 (6), 559-64.‡
Lin et al., Highly selective biomechanical separation of cancer cells from leukocytes using microfluidic ratchets and hydrodynamic concentrator Biomicrofluidics 2013, 7 (3) ; 034111.‡
Loutherback et al., Deterministic Microfluidic Ratchet. Physical Review Letters 2009, 102, 045301.‡
Lundstrom K., "Structural genomics and drug discovery", Journal of Cellular and Molecular Medicine, vol. 11, Issue 2, pp. 224-238 (2007).‡
Latham A.H. et al., "Capillary Magnetic Field Flow Fractionation and Analysis of Magnetic Nanoparticles", Analytical Chemistry, vol. 77, Issue 15, pp. 5055-5062 (2005).‡
Li N. et al., "Parallel mixing of photolithographically defined nanoliter volumes using elastomeric microvalve arrays", Electrophoresis, 26, 3758-3764 (2005).‡
Liao et al., "Nanoscale Molecular Traps and Dams for Ultrafast Protein Enrichment in High-Conductivity Buffers," J. Am. Chem. Soc. 2012, 134, 8742 8745.‡
Majewski P. et al., "Synthesis, Surface Modifications, and Size-Sorting of Mixed Nickel-Zinc Ferrite Colloidal Magnetic Nanoparticles", Chemistry: a European journal, vol. 14: Issue 26, pp. 7961-7968 (2008).‡
Marquet et al., Rectified motion of colloids in asymmetrically structured channels. Physical Review Letters 2002, 88 (16) 168301.‡
Martinez-Duarte R. et al., "Microfabrication technologies in dielectrophoresis applications—A review", Electrophoresis, vol. 33, Issue 21, pp. 3110-3132 (2012).‡
Martinez-Lopez et al., "Characterization of electrokinetic mobility of microparticles in order to improve dielectrophoretic concentration," Anal. Bioanal. Chem. 2009, 394, 293302.‡
Luo et al., Insulator-based dielectrophoresis of mitochondria. Biomicrofluidics 2014, 8 (2), 021801.‡
Luo, J. H.; Muratore, K. A.; Arriaga, E. A.; Ros, a., Deterministic Absolute Negative Mobility for Micro- and Submicrometer Particles Induced in a Microfluidic Device. Analytical Chemistry 2016, 88 (11), 5920-5927.‡
Mafune, F, et al., "Microcrystal Delivery by Pulsed Liquid Droplet for Serial Femtosecond Crystallography ", Acta Crystallographica Section D, Apr. 2016 [available online Mar. 2016], vol. 72, Part 4, pp. 520-523 <DOI: 10.1107/52059798316001480>.‡
Kim et al., "Deterministic Ratchet for Sub-micrometer (Bio)particle Separation," Anal. Chem., 2018, 90 (7), pp. 4370-4379.‡
Kim et al., "Dynmanic Constriction Insulator-Based Dielectrophoresis for Particle Manipulation," 2016, 1 page.‡
Kissick D.J. et al., "Second-Order Nonlinear Optical Imaging of Chiral Crystals", Annual Review of Analytical Chemistry, vol. 4, pp. 419-437 (2011).‡
Kralj J.G. et al., "Continuous Dielectrophoretic Size-Based Particle Sorting", Analytical Chemistry, vol. 78, Issue 14, pp. 5019-5025 (2006).‡
Kung, Y-C. et al., "Tunable dielectrophoresis for sheathless 3D focusing", IEEE International Conference on Micro Electro Mechanical Systems (Estoril, Portugal, Jan. 18-22, 2015), 2015 (Date added to IEEE Xplore: Mar. 2015), pp. 196-199 <DOI:10.1109/MEMSYS. 2015.7050920>.‡
Lapizco-Encinas B.H. et al., "Insulator-based dielectrophoresis for the selective concentration and separation of live bacteria in water", Electrophoresis, vol. 25, Issue 10-11, pp. 1695-1704 (2004).‡
Jores K. et al., "Investigations on the structure of solid lipid nanoparticles (SLN) and oil-loaded solid lipid. nanoparticles by photon correlation spectroscopy, field-flow fractionation and transmission electron microscopy",. Journal of Controlled Release, vol. 95, Issue 2, pp. 217-227 (2004).‡

(56) References Cited

OTHER PUBLICATIONS

Kale et al., Continuous-flow dielectrophoretic trapping and patterning of colloidal particles in a ratchet microchannel. Journal of Micromechanics and Microengineering 2014, 24 (7) 6 pages.‡

Kang et al., Separation of mitochondria by flow field-flow fractionation for proteomic analysis. Analyst 2008, 133 (4), 505-515.‡

Jeon N.L. et al., "Generation of Solution and Surface Gradients Using Microfluidic Systems", Langmuir, 16, 8311-8316 (2000).‡

Jones et al., "Continuous Separation of DNA Molecules by Size Using Insulator-Based Dielectrophoresis," Anal. Chem. 2017, 89, 15311539.‡

Jordan P. et al., "Three-dimensional structure of cyanobacterial photosystem I at 2.5 a resolution", Nature, vol. 411, Jun. 21, pp. 909-917 (2001).‡

Gerion D. et al., "Sorting Fluorescent Nanocrystals with DNA", Journal of the American Chemical Society, vol. 124, Issue 24, pp. 7070-7074 (2002).‡

Giddings, "Unified Separation Science," Wiley ; New York 1991.‡

Gonzalez et al., Gonzalez, C. F.; Remcho, V. T., Fabrication and evaluation of a ratchet type dielectrophoretic device for particle analysis. Journal of Chromatography A 2009, 1216 (52), 9063-9070.‡

Gorre-Talini et al., Dielectrophoretic ratchets. Chaos 1998, 8(3), 650-656.‡

Green N.G. et al., "Dielectrophoresis of Submicrometer Latex Spheres. 1. Experimental Results", Journal of Physical Chemistry B, vol. 103, Issue 1, pp. 41-50 (1999).‡

Haenggi et al., Artificial Brownian motors: Controlling transport on the nanoscale. Reviews of Modern Physics 2009, 81 (1), 387-442.‡

Fromme P. et al., "Femtosecond nanocrystallography using X-ray lasers for membrane protein structure determination", Current Opinion in Structural Biology, vol. 21, Issue 4, pp. 509-516 (2011).‡

Gan et al., "Six Helix Bundle and Triangle DNA Origami Insulator-Based Dielectrophoresis," Anal. Chem. 2013, 85, 1142711434.‡

Gascoyne P.R. et al., "Particle separation by dielectrophoresis", Electrophoresis, vol. 23, Issue 13, pp. 1973-1983 (2002).‡

Fernández-Vizarra et al., Isolation of biogenetically competent mi ochondria from mammalian tissues and cultured cells. Methods 2002, 26 (4), 292-297.‡

Fiedler S. et al., "Dielectrophoretic Sorting of Particles and Cells in a Microsystem", Analytical Chemistry, vol. 70, Issue 9, pp. 1909-1915 (1998).‡

Fromme P et al., "Improved isolation and crystallization of Photosystem I for structural analysis", Biochimica et Biophysica Acta, vol. 1365, Issue 1-2, pp. 175-184 (1998).‡

Hunter M.S. et al., "Toward structure determination using membrane-protein nanocrystals and microcrystals", Methods, vol. 55, Issue 4, pp. 387-404 (2011).‡

Hunter M.S. et al., "X-ray Diffraction from Membrane Protein Nanocrystals", Biophysical Journal, vol. 100, Issue 1, pp. 198-206 (2011).‡

International Preliminary Report on Patentability for Application No. PCT/US2017/041708 dated Jan. 24, 2019, 8 pages.‡

International Preliminary Report on Patentability for Application No. PCT/US2018/033989 dated Dec. 5, 2019, 7 pages.‡

International Search Report and Written Opinion for Application No. PCT/US2015/050616 dated Jan. 18, 2016, 11 pages.‡

International Search Report and Written Opinion for Application No. PCT/US2017/041708 dated Oct. 23, 2017, 9 pages.‡

International Search Report and Written Opinion for Application No. PCT/US2018/033944 dated Sep. 26, 2018, 14 pages.‡

Holzel et al., "Trapping Single Molecules by Dielectrophoresis," Phys. Rev. Lett. 2005, 95, 128102.‡

Hornig-Do et al., "Isolation of functional pure mitochondria by superparamagnetic microbeads," Anal. Biochem. 2009, 389, 15.‡

Huang et al., "Current-monitoring method for measuring the electroosmotic flow rate in capillary zone electrophoresis," Anal. Chem. 1988, 60, 18371838.‡

Heffner et al., The early effects of ischemia upon skeletal muscle mitochondria. J Neurol Sci 1978, 38 (3), 295-315.‡

Hellmich W. et al., "Poly(oxyethylene) Based Surface Coatings for Poly(dimethylsiloxane) Microchannels", Langmuir, vol. 21, Issue 16, pp. 7551-7557 (2005).‡

Holmes D. et al., "On-chip high-speed sorting of micron-sized particles for high-throughput analysis", IEE proceedings. Nanobiotechnology, vol. 152, Issue 4, pp. 129-135 (2005).‡

Cordelières, "Manual Tracking," ImageJ plugin, 2005, <https://imagej-nihgov.ezproxy1lib.asu.edu/ij/plugins/track/track.html> 3 pages.‡

Cummings E.B. et al., "Dielectrophoresis in Microchips Containing Arrays of Insulating Posts: Theoretical and Experimental Results", Analytical Chemisiry, vol. 75, Issue 18, pp. 4724-4731 (2003).‡

Davalos et al., "Performance impact of dynamic surface coatings on polymeric insulator-based dielectrophoretic particle separators," Anal. Bioanal. Chem. 2008, 390, 847855.‡

Cheng I.F. et al., "A continuous high-throughput bioparticle sorter based on 3D traveling-wave dielectrophoresis", Lab on a chip, vol. 9, Issue 22. pp. 3193-3201 (2009).‡

Chinen et al., Nanoparticle Probes for the Detection of Cancer Biomarkers, Cells, and Tissues by Fluorescence. Chemical Reviews 2015, 115 (19), 10530-10574.‡

Chung et al., Ultrastructural changes of mitochondria in the skeletal muscle of patients with amyotrophic lateral sclerosis. Ultrastruct Pathol 2002, 26 (1), 3-7.‡

Drews et al., Ratcheted electrophoresis for rapid particle transport. Lab on a Chip 2013, 13 (22), 4295-4298.‡

Duffy et al., "Determination of Properties of Individual Liposomes by Capillary Electrophoresis with Postcolumn Laser-Induced Fluorescence Detection," Anal. Chem. 2001, 73, 18551861.‡

Eguchi et al., Giant mitochondria in acute lymphocytic leukemia. Exp Mol Pathol 1987, 47(1), 69-75.‡

Dertinger S.K.W. et al., "Generation of Gradients Having Complex Shapes Using Microfluidic Networks", Anal. Chem., 73, 1240-1246 (2001).‡

Devaraju, N. et al., "Pressure driven digital logic in PDMS based microfluidic devices fabricated by multilayer soft lithography", Lab on a Chip, Nov. 2012, vol. 12, No. 22, pp. 4809-4815 <DOI:10.1039/c21c21155f>.‡

Doak R.B. et al., "Microscopic linear liquid streams in vacuum: Injection of solvated biological samples into X-ray free electron lasers", AIP Conference Proceedings, vol. 1501, pp. 1314-1323 (2012).‡

Boutet S. et al., "High-Resolution Protein Structure Determination by Serial Femtosecond Crystallography", Science, vol. 337, Issue 6092, pp. 362-364 (2012).‡

Calzolai L. et al., "Separation and characterization of gold nanoparticle mixtures by flow-field-flow fractionation", Journal of Chromatography A, vol. 1218, Issue 27, pp. 4234-4239 (2011).‡

Cesaro-Tadic et al., High-sensitivity miniaturized immunoassays for tumor necrosis factor a using microfluidic systems. Lab on a Chip 2004, 4 (6), 563-569.‡

Chapman H. N. et al., "Femtosecond X-ray protein nanocrystallography", Nature-London, vol. 470, Issue 7332, pp. 73-77 (2011).‡

Chapman H.N., "X-ray imaging beyond the limits", Nature Materials, vol. 8, Issue 4, pp. 299-301 (2009).‡

Chen G. et al., "High-Purity Separation of Gold Nanoparticle Dimers and Trimers", Journal of the American Chemical Society, vol. 131, Issue 12, pp. 4218-4219 (2009).‡

Bligh M. et al., "Sorting microparticles into lateral streams using a two-phase rectangular electrokinetic array", Journal of Micromechanics and Microengineering, vol. 18, Issue 4, pp. 045002 (2008).‡

Boekema E.J. et al., "Evidence for a trimeric organization of the photosystem I complex from the thermophilic cyanobacterium *Synechococcus* sp.", FEBS Letters, vol. 217, Issue 2, pp. 283-286 (1987).‡

Bogunovic et al., Particle sorting by a structured microfluidic ratchet device with tunable selectivity: theory and experiment. Soft Matter 2012, 8 (14), 3900-3907.‡

Akthakul A. et al., "Size fractionation of metal nanoparticles by membrane filtration", Advanced Materials, vol. 17, Issue 5, pp. 532-535 (2005).‡

(56) References Cited

OTHER PUBLICATIONS

Almen M.S. et al., "Mapping the human membrane proteome: a majority of the human membrane proteins can be classified according to function and evolutionary origin", BMC Biology, vol 7, Issue 1, pp. 50 (2009).‡
Bhattacharya S. et al., "Insulator-based dielectrophoretic single particle and single cancer cell trapping", Electrophoresis, vol. 32, Issue 18, pp. 2550-2558 (2011).‡
Wampler R.E. et al., "Selective Detection of Protein Crystals by Second Harmonic Microscopy", Journal of the American Chemical Society, vol. 130, Issue 43, pp. 14076-14077 (2008).‡
Weierstall U. et al., "Injector for scattering measurements on fully solvated biospecies", Review of Scientific Instruments. vol. 83, Issue 3, pp. 035108 (2012).‡
Yamada et al. "Differential Permeabilization Effects of Ca2+ and Valinomycin on the Inner and Outer Mitochondrial Membranes as Revealed by Proteomics Analysis of Proteins Released from Mitochondria," Mol. Cell Proteomics, 2009, 8, 12651277.‡
Vidal, C. et al., "Fabrication of Pneumatic Microvalves for PDMS Microfluidic Devices", International Congress of Mechanical Engineering (Gramado, Brazil, Nov. 15-20, 2009), 2009, 7 pages.‡
Viefhues M. et al., "Physisorbed surface coatings for poly(dimethylsiloxane) and quartz microfluidic devices", Analytical and Bioanalytical Chemistry, vol. 401, Issue 7, pp. 2113-2122 (2011).‡
Unger et al., "Monolithic microfabricated valves and pumps by multilayer soft lithography," Science, 288, 113-16 (2000).‡
Yates et al, "Proteomics of organelles and large cellular structures," Nat. Rev. Mol. Cell Biol. 2005, 6, 702714.‡
Zhu J. et al., "Dielectrophoretic focusing of particles in a microchannel constriction using DC-biased AC flectric fields", Electrophoresis, vol. 30, Issue 15 pp. 2668-2675 (2009).‡
U.S. Appl. No. 15/930,239, filed May 12, 2020, Ros et al.‡
U.S. Appl. No. 15/930,313, filed May 12, 2020, Ros et al.‡
Yang et al., High Speed Size Sorting of Subcellular Organelles by Flow Field-Flow Fractionation. Analytical Chemistry 2015, 87 (12), 6342-6348.‡
Yang J. et al., "Size sorting of Au and Pt nanoparticles from arbitrary particle size distributions", Analytica Chimica Acta, vol. 546, Issue 2, pp. 133-138 (2005).‡
Yang et al., "Toward Analysis of Proteins in Single Cells: A Quantitative Approach Employing Isobaric Tags with MALDI Mass Spectrometry Realized with a Microfluidic Platform," Anal. Chem. 2016, 88, 66726679.‡
Sturm et al., Ratchets in hydrodynamic flow: more than waterwheels. Interface Focus 2014, 4 (6) 9 pages.‡
Sugiura, Y. et al., "Fabrication of Microfluidic Valves Using a Hydrogel Molding Method", Scientific Reports, Aug. 2015, vol. 5, No. 13375, 7 pages <DOI:10.1038/srep13375>.‡
Srivastava S.K. et al., "Direct current insulator-based dielectrophoretic characterization of erythrocytes: ABO-Rh human blood typing", Electrophoresis, vol. 32, Issue 18, pp. 2530-2540 (2011).‡
Thoenes et al., On matrix-rich giant mitochondria. Electron microscopic observations on tubular epithelium of the human kidney in the nephrotic syndrome. Z Zellforsch Mikrosk Anat 1966, 75 (2), 422-33.‡

Tice, J. et al., "A monolithic poly(dimethylsiloxane) electrostatic actuator for controlling integrated pneumatic microsystems", Sensors and Actuators A: Physical, Jul. 2013 (available online Mar. 2013), vol. 196, pp. 22-29 <DOI:10.1016/j.sna.2013.03.020>.‡
Tang, S. et al., "Basic Microfluidic and Soft Lithographic Techniques", in: Optofluidics: Fundamentals, Devices and Applications (Ed. Y. Fainmain), 2010, Ch. 2, pp. 7-31.‡
Spence J.C. et al., "X-ray lasers for structural and dynamic Biology", Rep Prog Phys, vol. 75, Issue 10, p. 102601 (2012).‡
Srivastava S.K. et al., "A continuous DC-insulator dielectrophoretic sorter of microparticles", Journal of chromatography. A, vol. 1218, Issue 13, pp. 1780-1789 (2011).‡
Srivastava S.K. et al., "DC insulator dielectrophoretic applications in microdevice technology: a review", Analytical and Bioanalytical Chemistry, vol. 399, Issue 1, pp. 301-321 (2011).‡
Schubert W.D. et al., "Photosystem I of Synechococcus elongatus at 4 A Resolution: Comprehensive Structure Analysis", Journal of Molecular Biology, vol. 272, Issue 5, pp. 741-769 (1997).‡
Shafiq et al., Giant mitochondria in human muscle with inclusions. Arch Neurol 1967, 17 (6), 666-71.‡
Salomon S. et al., "A dielectrophoretic continuous flow sorterusing integrated microelectrodes coupled to a channel constriction", Electrophoresis, vol. 32, Issue 12, pp. 1508-1514 (2011).‡
International Search Report and Written Opinion received in International Application No. PCT/US2018/033989, dated Jul. 20, 2018 (7 pages).‡
Cummings E.B. et al., "Dielectrophoresis in Microchips Containing Arrays of Insulating Posts: Theoretical and Experimental Results", Analytical Chemistry, vol. 75, Issue 18, pp. 4724-4731 (2003).
Devaraju, N. et al., "Pressure driven digital logic in PDMS based microfluidic devices fabricated by multilayer soft lithography", Lab on a Chip, Nov. 2012, vol. 12, No. 22, pp. 4809-4815 <DOI:10.1039/c2lc21155f>.
Fernández-Vizarra et al., Isolation of biogenetically competent mitochondria from mammalian tissues and cultured cells. Methods 2002, 26 (4), 292-297.
International Search Report and Written Opinion for Application No. PCT/US2018/033989 dated Jul. 20, 2018, 13 pages.
Jordan P. et al., "Three-dimensional structure of cyanobacterial photosystem I at 2.5 A resolution", Nature, vol. 411, Jun. 21, pp. 909-917 (2001).
Li N. et al., "Parallel mixing of photolithographically defined nanoliter vols. using elastomeric microvalve arrays", Electrophoresis, 26, 3758-3764 (2005).
Lin et al., Highly selective biomechanical separation of cancer cells from leukocytes using microfluidic ratchets and hydrodynamic concentrator. Biomicrofluidics 2013, 7 (3) ; 034114.
Mafune, F, et al., "Microcrystal Delivery by Pulsed Liquid Droplet for Serial Femtosecond Crystallography", Acta Crystallographica Section D, Apr. 2016 [available online Mar. 2016], vol. 72, Part 4, pp. 520-523 <DOI:10.1107/S2059798316001480>.
Salomon S. et al., "A dielectrophoretic continuous flow sorterusing integrated microelectrodes coupled to a channel cnstriction", Electrophoresis, vol. 32, Issue 12, pp. 1508-1514 (2011).
Schubert W.D. et al., "Photosystem l of Synechococcus elongatus at 4 A Resolution: Comprehensive Structure Analysis", Journal of Molecular Biology, vol. 272, Issue 5, pp. 741-769 (1997).

\* cited by examiner
‡ imported from a related application

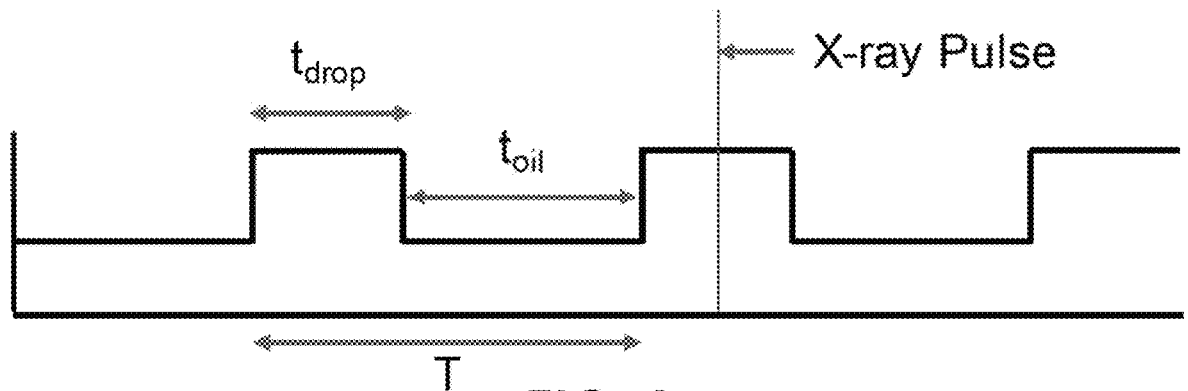
FIG. 4
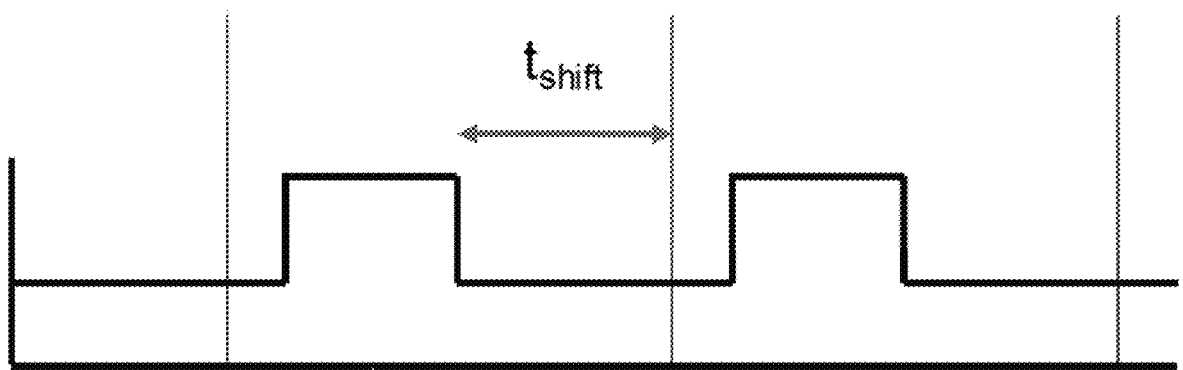
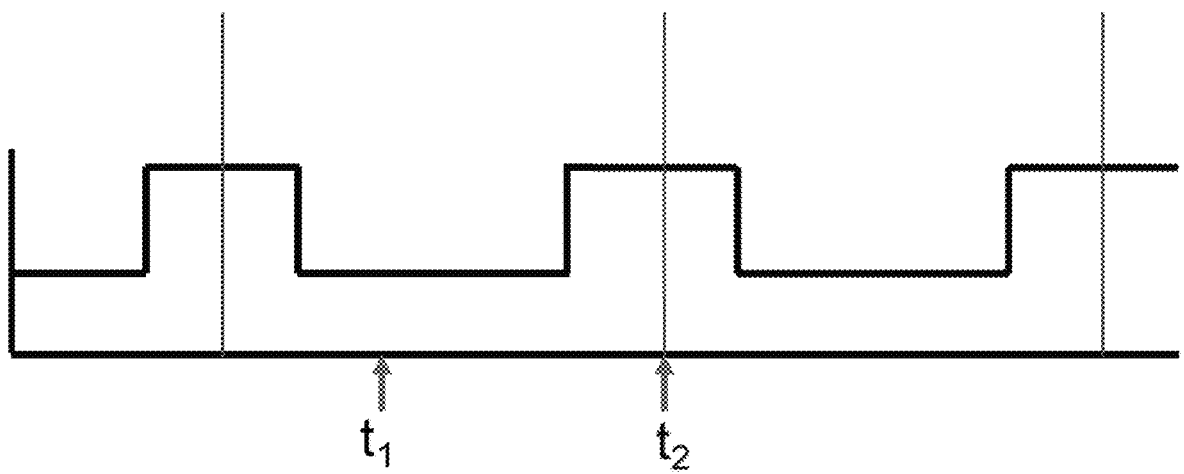
FIG. 5

Serial Femtosecond Crystallography (SFX) with XFELs...
... a sample intensive technique
- 1 day of beam time (12 h) @ XFEL
- sample flow rate @ ~40 µL/min
- 120 Hz (XFEL @ LCLS), fs pulses
- 300 pL droplets
→ Majority of sample (95%) is wasted!
→ @ EuXFEL, 10Hz pulse train repetition about 99% sample wasted
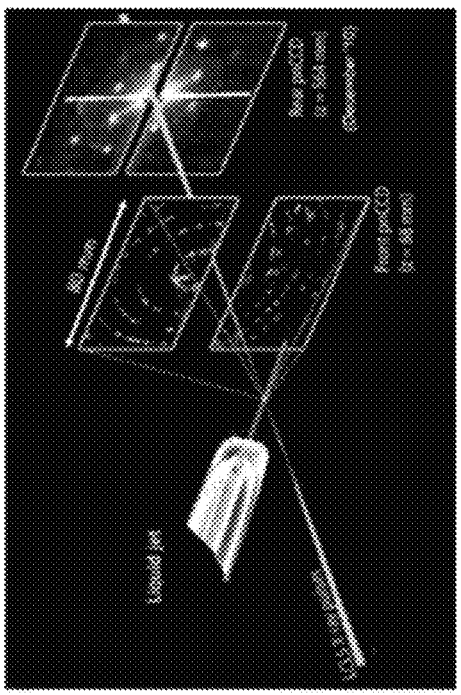
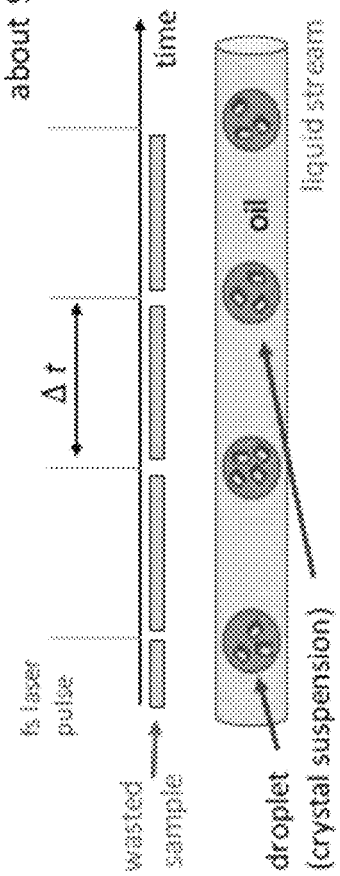
FIG. 9

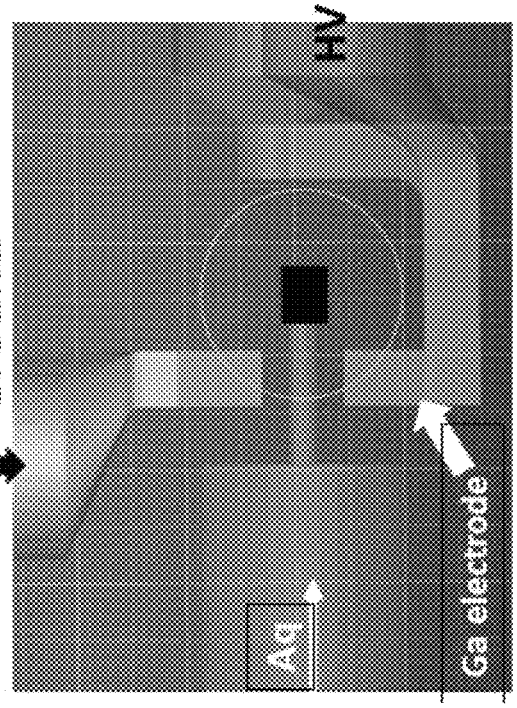
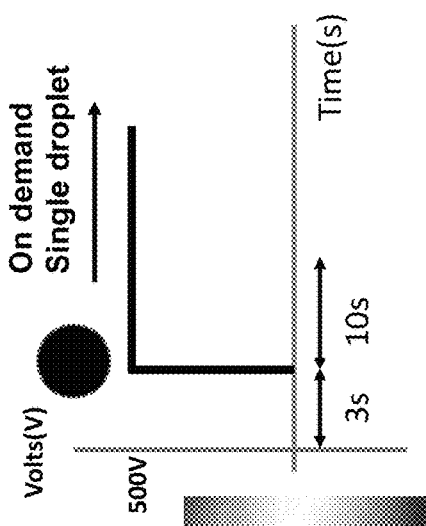
FIG. 19

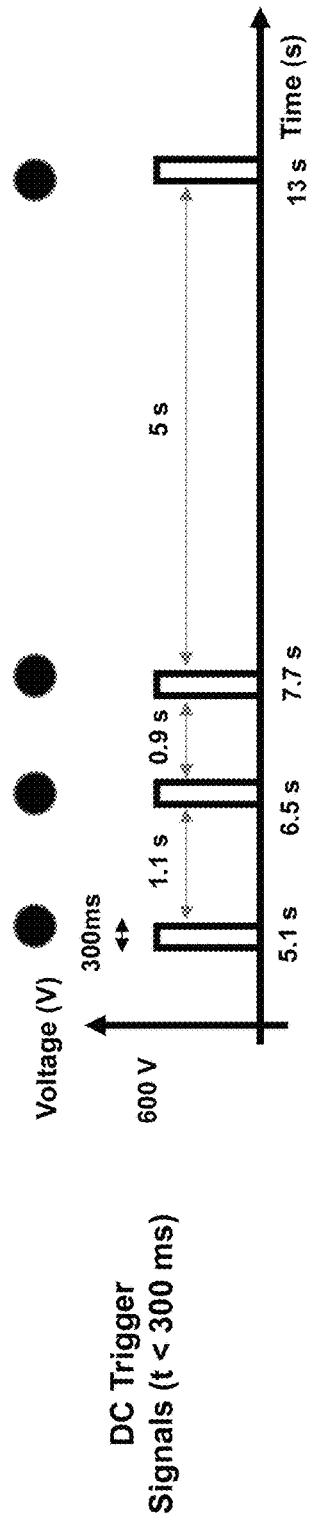
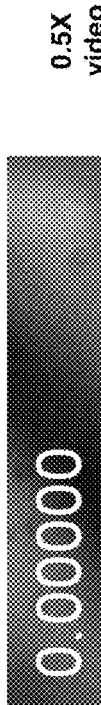
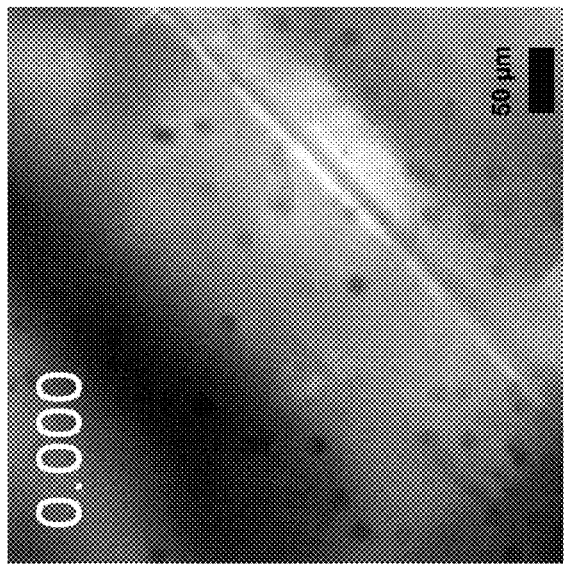
FIG. 34

2. Droplet Phase shift by the electric triggering

Experimental setup description:

1. T-split connectors used for both Aq line and Oil line to reduce the fluctuation of flow rate originated from HPLC pump. Split ratio and hydraulic resistance can be calculated and tuned by the length and diameter of capillary. So we could generate consistence and stable droplets and generation frequency.

2. DAQ(Data acquisition) and ADC(Analog to Digital convertor), Powerlab and labchart used for measuring the flow rates from the flow rate sensors and droplet signal from the droplet detector. Both flow rates and droplet signal can be detected easily.

3. Droplet detector is used for detecting droplet signal and calculate the droplet generation frequency using lab chart software. Other calculation such as droplet generation frequency, period of droplet, phase shift, and droplet width(volume) can be calculated using this software.

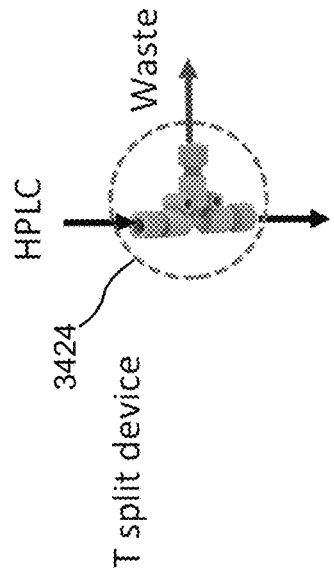

FIG. 38

Result 2: Electric signal = 100 ms
Phase shift of ~ 3 ms to 88 ms achieved by electric triggering signal
There are no change of droplet width and frequency before and after the trigger signal Droplet Phase shift by the electric triggering
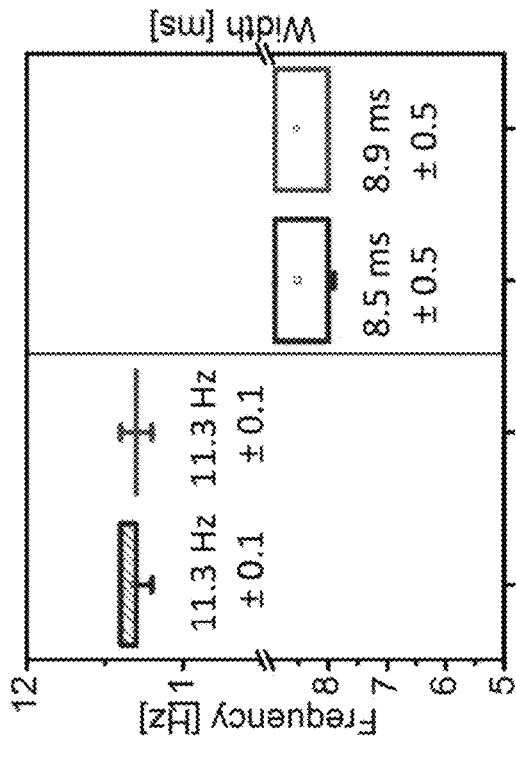
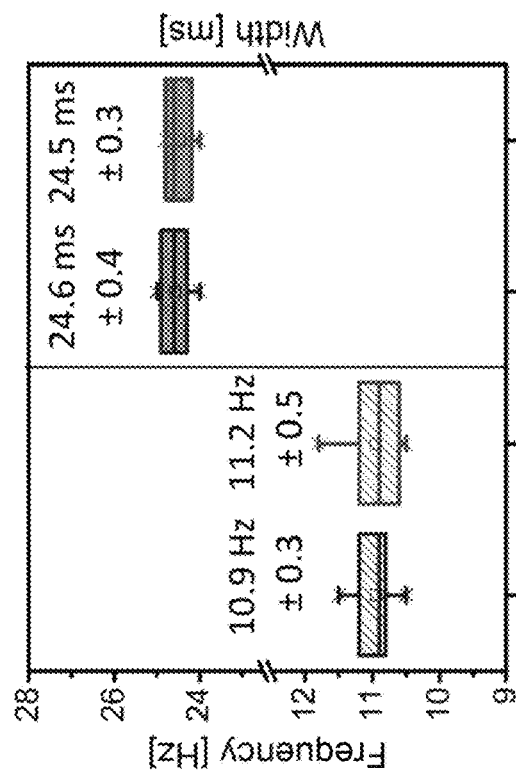
Above : Short pulse trigger signals (10 ms and 100 ms) cause no change of the droplet generation frequency [Hz] and the droplet width [ms].
FIG. 44

Electrical droplet triggering and frequency tuning possible
AC voltage(100V, 200V, 250V and 300V with 300 Hz) applied(Green)
Droplet responses were confirmed that the droplets are triggered by
The electric trace(trigger AC pulse signal)
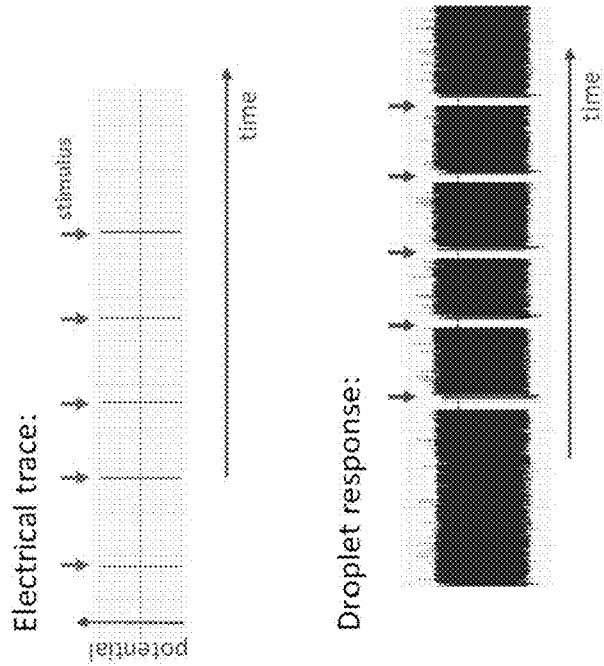
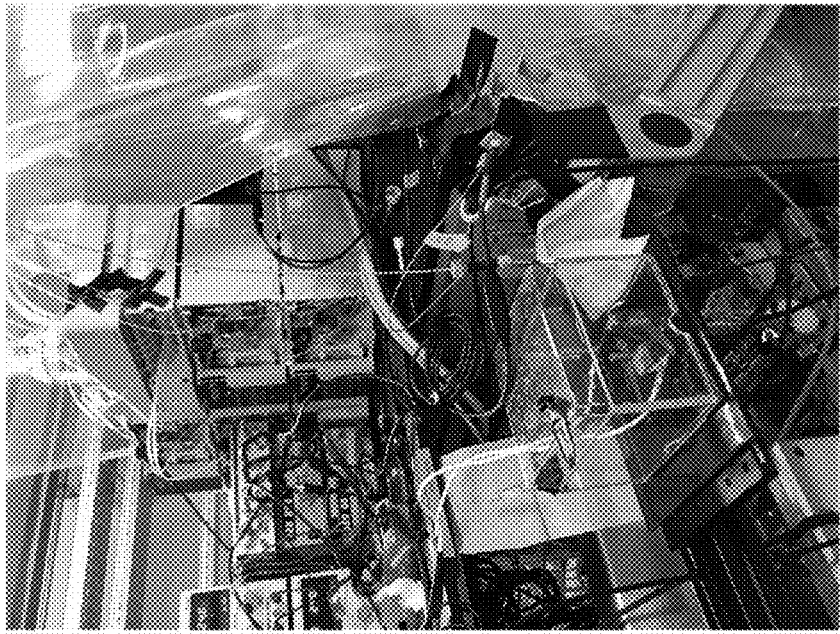
FIG. 52

| Name | Composition | | |
|---|---|---|---|
| KDO8 Buffer<br>σ = 0.4 S/m | 46mM KCl<br>8mM Tris-HCl<br>7.2% PEGME 5K | PEGME | Poly(ethylene glycol) methyl ether m.w 5k |
| PSI buffer<br>σ = 0.03 S/m | 5mM MES<br>pH 6.4<br>0.02%v/v bDDM | MES | 2-(N-Morpholino)ethanesulfonic acid, 4-Morpholineethanesulfonic acid monohydrate |
| | | b-DDM | n-Dodecyl β-D-maltoside |

Phosphate Buffer(10mM) + 1uL Fluorescein Sodium Salt(1uM)= 0.05 S/m
DI water = 0.0009 S/m

FIG. 54

DEVICE FOR TUNING MICROFLUIDIC DROPLET FREQUENCY AND SYNCHRONIZING PHASE FOR SERIAL FEMTOSECOND CRYSTALLOGRAPHY

CROSS-REFERENCE TO RELATED APPLICATIONS

This application is a continuation of U.S. patent application Ser. No. 16/616,189, filed on Nov. 22, 2019, entitled "METAL ELECTRODE BASED 3D PRINTED DEVICE FOR TUNING MICROFLUIDIC DROPLET GENERATION FREQUENCY AND SYNCHRONIZING PHASE FOR SERIAL FEMTOSECOND CRYSTALLOGRAPHY," which is a U.S. National Phase of international application No. PCT/US2018/033989, which claims the benefit of U.S. Provisional Patent Application No. 62/509,538, filed on May 22, 2017, and U.S. Provisional Patent Application No. 62/630,105, filed on Feb. 13, 2018, all of which are hereby incorporated by reference in their entireties.

STATEMENT REGARDING FEDERALLY SPONSORED RESEARCH OR DEVELOPMENT

This invention was made with government support under R21 GM095583 awarded by the National Institutes of Health and under 1231306 awarded by the National Science Foundation. The government has certain rights in the invention.

TECHNICAL FIELD

The present invention relates to systems and methods for performing serial femtosecond crystallography (SFX), and to systems and methods for tuning droplet generation frequency.

BACKGROUND OF THE INVENTION

Proteins operate to perform most of the work of living cells and are involved in every cellular process. For example, proteins can replicate and transcribe DNA, and can produce, process, and secrete other proteins. Proteins not only control cell division and metabolism, but also oversee the flow of material and information into and out of the cell.

A protein's structure may be characterized to understand how it functions. A common method of protein structure determination utilizes X-ray crystallography. Recent advancements have led to serial femtosecond crystallography (SFX). SFX is a method of X-ray crystallography that uses an X-ray free electron laser (XFEL) to irradiate a protein crystal with a femtosecond pulse of high energy photons in order to obtain a diffraction pattern before the protein crystal is destroyed. This diffraction-before-destruction technique requires many crystals to be injected into the path of the laser in order to obtain a complete dataset for constructing an electron density map of a protein crystal's structure. The pulse structure of currently available XFELs ranges from 10 Hz up to 120 Hz. However, conventional sample delivery methods that use continuous liquid injectors result in a large amount of wasted protein crystals between laser pulses. SFX can also be carried out with other pulsed x-ray sources, where pulse durations surmount the fs time scale.

SUMMARY OF THE INVENTION

Sample waste resulting from the slow pulse frequency of x-ray free electron lasers (XFELs) remains a critical issue for serial femtosecond crystallography (SFX) of proteins. Protein crystals are cumbersome to obtain in suspensions of adequate concentration and large volumes (>1 mL) for full datasets. Current XFELs function at pulse frequencies up to 120 Hz at LCLS, 60 Hz at SACLA, and 30 Hz at PAL-XFEL, or pulse trains of 10 Hz frequency at the new European XFEL. Delivering the precious protein crystals by a continuous stream is a highly inefficient process, since most of the crystals are not hit by the femtosecond x-ray pulses.

In some embodiments, a system is provided that utilizes a microfluidic droplet generator coupled to a nozzle to reduce the volume of sample required to collect a full data set for SFX experiments with XFELs. By generating small water-in-oil droplets through a microfluidic shearing process at a frequency synchronized with the XFEL, the system/method reduces the amount of sample volume required for a full SFX data set when compared to a traditional GDVN alone.

In some embodiments, instead of controlling a phase adjustment to be made at the point of droplet generation, the invention decouples droplet frequency from the phase of the droplets. Furthermore, instead of using active methods (e.g., piezoelectric, acoustic, etc.) to adjust the phase, some embodiments of the invention use a passive approach with a continuous introduction of sacrificial oil. In some embodiments, the method can be applied at existing XFEL facilities around the world and will also be applicable for newer generation XFELs.

By decoupling droplet generation frequency from the droplet phase adjustment, more freedom is available to adjust droplet generation conditions. This flexibility translates to more tenability with droplet size and channel geometries. This ability to adjust these parameters can result in reduced sample consumption and a decreased risk of clogging, both of which depend on the protein crystal system being studied. Thus, in some embodiments, the invention provides a method that is widely applicable to different sizes of protein crystals.

In some embodiments, a system is provided for performing serial femtosecond crystallography (SFX). A microfluidic T-junction, upstream of an in-line water-in-oil droplet generator, is utilized to synchronize the phase of the water-in-oil droplets in a continuous stream with the phase of pulses of a downstream x-ray free electron laser by adding a sacrificial oil phase to the sample delivery line.

In some embodiments, the T-junction interfaced between the upstream microfluidic droplet generator and the downstream x-ray free electron laser (XFEL) facilitates adjustment of the flow rate of the oil phase for water in droplet streams by adding additional oil at a rate counteracting the phase lag between water droplets and the XFEL laser. A splitting junction before the T-junction allows for fine flow rate control (order of 0.01 µL/min), below what a typical pressure source (e.g., an HPLC pump) can provide. Downstream of the T-junction is a detector for real-time feedback of the droplet phase.

In some embodiments, a 3-D printed microfluidic device tunes or adjusts water-in-oil droplet generation frequency. Gallium metal based non-contact metal electrodes embedded in the 3-D printed device are used to induce local electric fields that change the water-in-oil interface. Fabrication of the gallium metal in the 3d printed device is simple and does not require complex fabrication tools and steps. In some systems, tunable frequency ranges in droplet generation by the device may increase 10-fold from an original generation frequency.

In some embodiments, a method for fabricating a water-in-oil droplet generator device comprises 3-D printing a water-in-oil droplet generator including an oil phase inlet channel, an aqueous phase inlet channel, a droplet flow outlet channel, and a metal inlet, wherein the oil phase inlet channel, the aqueous phase inlet channel, and the droplet flow outlet channel are connected at a junction within the droplet generator device. Conductive material is injected in the metal inlet to form two non-contact electrodes embedded in the 3-D printed droplet generation device.

In some embodiments, a 3-D printed water-in-oil droplet generator device includes an oil phase inlet channel, an aqueous phase inlet channel, a droplet flow outlet channel, and two embedded non-contact electrodes. The oil phase inlet channel, the aqueous phase inlet channel, and the droplet flow outlet channel are connected at a junction within the water-in-oil droplet generator device.

In some embodiments, a system for initiating generation of aqueous sample droplets for serial femtosecond crystallography includes a droplet generator device comprising a micrometer scale 3-D printed water-in-oil droplet generation system with two embedded non-contact electrodes, an oil phase inlet channel, an aqueous phase inlet channel, and a droplet flow outlet channel. The two embedded non-contact electrodes are operable to induce an electric field for initiating generation of an aqueous sample droplet. The system further includes an x-ray free electron laser. A capillary system is connected to the droplet flow output channel of the droplet generator device. The capillary system transmits the aqueous sample droplet in an oil medium and is positioned to receive an x-ray pulse train from the x-ray free electron laser. A droplet detector detects crystal characteristics of a crystal within the aqueous sample droplet transmitted by the capillary system when a beam of the x-ray pulse train laser impinges on the crystal.

In some embodiments, a system for controlling a phase shift and frequency of aqueous droplets in an oil medium for serial femtosecond crystallography comprises a droplet generator device comprising metal electrodes and a T-junction. The T-junction includes an oil phase inlet channel, an aqueous phase inlet channel, and an output channel for outputting aqueous droplets in an aqueous droplet in oil flow. The metal electrodes are operable to induce an electric field in the T-junction for controlling generation of the aqueous droplets. A droplet detector detects the aqueous droplets in the aqueous droplet in oil flow based on laser pulses from an x-ray free electron laser. Droplet generation in the droplet generator is synchronized with the laser pulses by trigger signals generated across the metal electrodes of the droplet generator.

Other aspects of the invention will become apparent by consideration of the detailed description and accompanying drawings.

BRIEF DESCRIPTION OF THE DRAWINGS

FIG. 4 is a graph of droplet frequency relative to x-ray pulses generated by the XFEL in the system of FIG. 1, according to some embodiments.

FIG. 5 is a pair of graphs of droplet frequency out-of-phase and in-phase with the XFEL in the system of FIG. 1, according to some embodiments.

FIG. 9 illustrates serial femtosecond crystallography (SFX) apparatus and process that utilizes an X-ray free electron laser (XFEL), according to some embodiments.

FIG. 19 includes a side view of a droplet generator device design with metal electrodes and results of an experiment for on demand droplet generation, according to some embodiments.

FIG. 34 illustrates four short pulse trigger signals for on-demand droplet generation by electric triggering, according to some embodiments.

FIGS. 37 and 38 illustrate a system and method for droplet phase shifting by electric triggering, according to some embodiments.

FIG. 44 illustrates droplet signal frequency (Hz) and droplet widths (ms) before and after 10 ms and 100 ms trigger signal pulse widths, according to some embodiments.

FIG. 52 includes a photograph of an experimental setup in EuXFEL, an AC trigger pulse signal, and droplet response, according to some embodiments.

FIG. 54 illustrates protein crystal buffer information, according to some embodiments.

DETAILED DESCRIPTION

Figure 1:
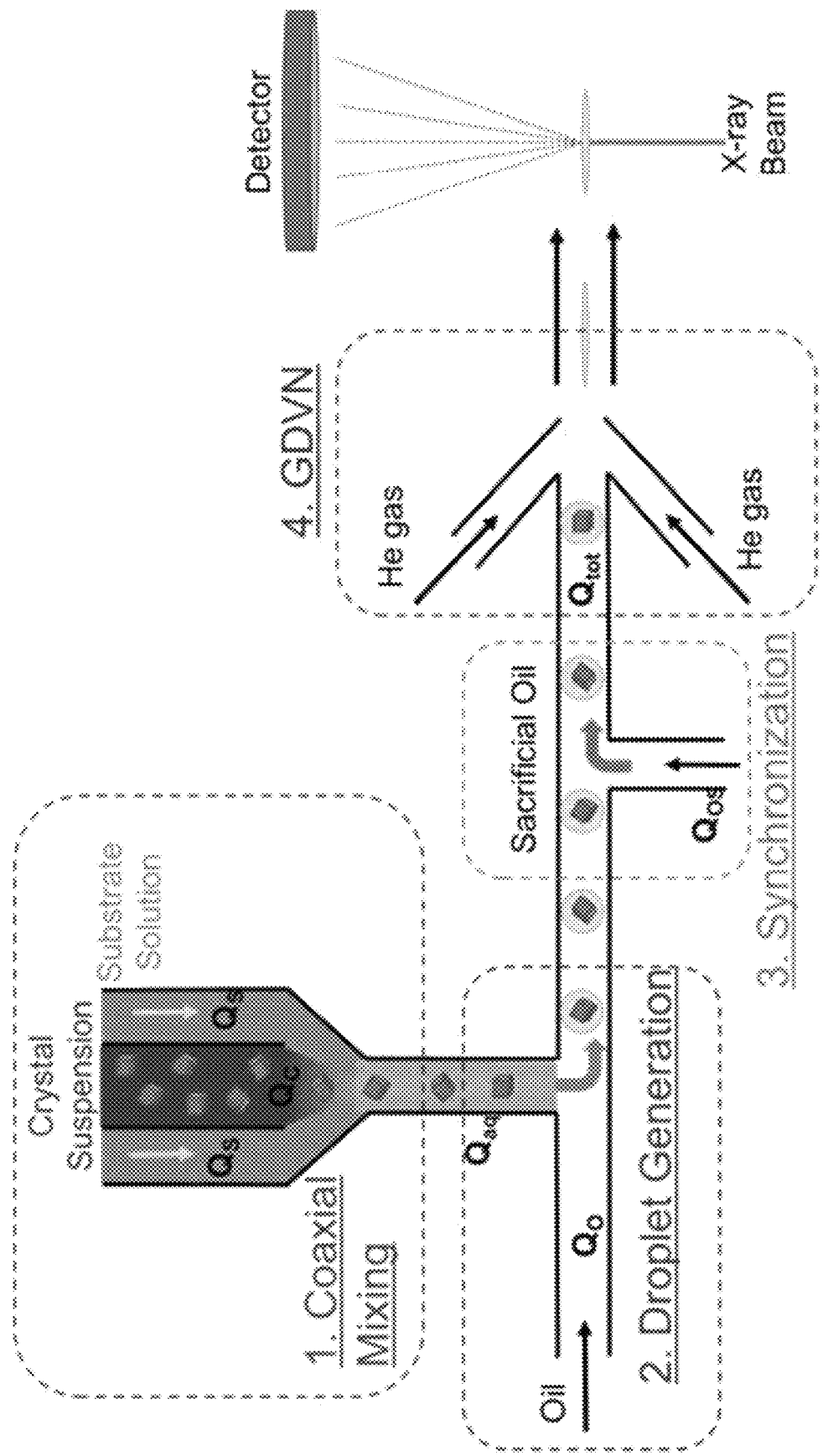
FIG. 1 is a functional block diagram of the system for synchronizing droplets with the operating frequency of an x-ray free electron laser, according to some embodiments.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing of the present invention. All publications, patent applications, patents and other references mentioned herein are hereby incorporated by reference in their entirety. The materials, methods, and examples disclosed herein are illustrative only and not intended to be limiting.

For the recitation of numeric ranges herein, each intervening number therebetween with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

"About" is used synonymously herein with the term "approximately." Illustratively, the use of the term "about" indicates that values slightly outside the cited values, namely, plus or minus 10%. Such values are thus encompassed by the scope of the claims reciting the terms "about" and "approximately."

Furthermore, it should also be noted that a plurality of hardware and software based devices, as well as a plurality of different structural components, may be used to implement various embodiments. In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic based aspects may be implemented in software (e.g., stored on non-transitory computer-readable medium) executable by one or more processors. As such, it should be noted that a plurality of hardware and software based devices, as well as a plurality of different structural components may be utilized to implement various embodiments. Furthermore, and as described in subsequent paragraphs, the specific configurations illustrated in the drawings are intended to exemplify embodiments and that other alternative configurations are possible. For example, "controllers" described in the specification can include standard processing components, such as one or more processors, one or more computer-readable medium modules, one or more input/output interfaces, and various connections (e.g., a system bus) connecting the components. In some instances, the controllers described in the specification may be implemented in one of or a combination of a general processor, an application specific integrated circuit (ASIC), a digital signal processor (DSP), a field programmable gate array (FPGA), or the like.

FIG. 1 illustrates a system and method for controlling droplet formation and delivery for performing serial femtosecond crystallography. A crystal suspension is mixed with a substrate solution using, for example, a coaxial mixer (step 1—"Coaxial Mixing"). The mixed sample is then pinched into droplets by an oil carrier phase (step 2—"Droplet Generation"). Sacrificial oil is then introduced into the droplet line to synchronize the droplet phase frequency with the x-ray pulse frequency of the x-ray free electron laser (XFEL) (step 3—"Synchronization"). The water-in-oil droplets are injected into the path of the x-ray by helium focusing gas within a gas dynamic virtual nozzle (GDVN) (step 4—"GDVN"). The droplets are elongated in this jet.

Figure 2:
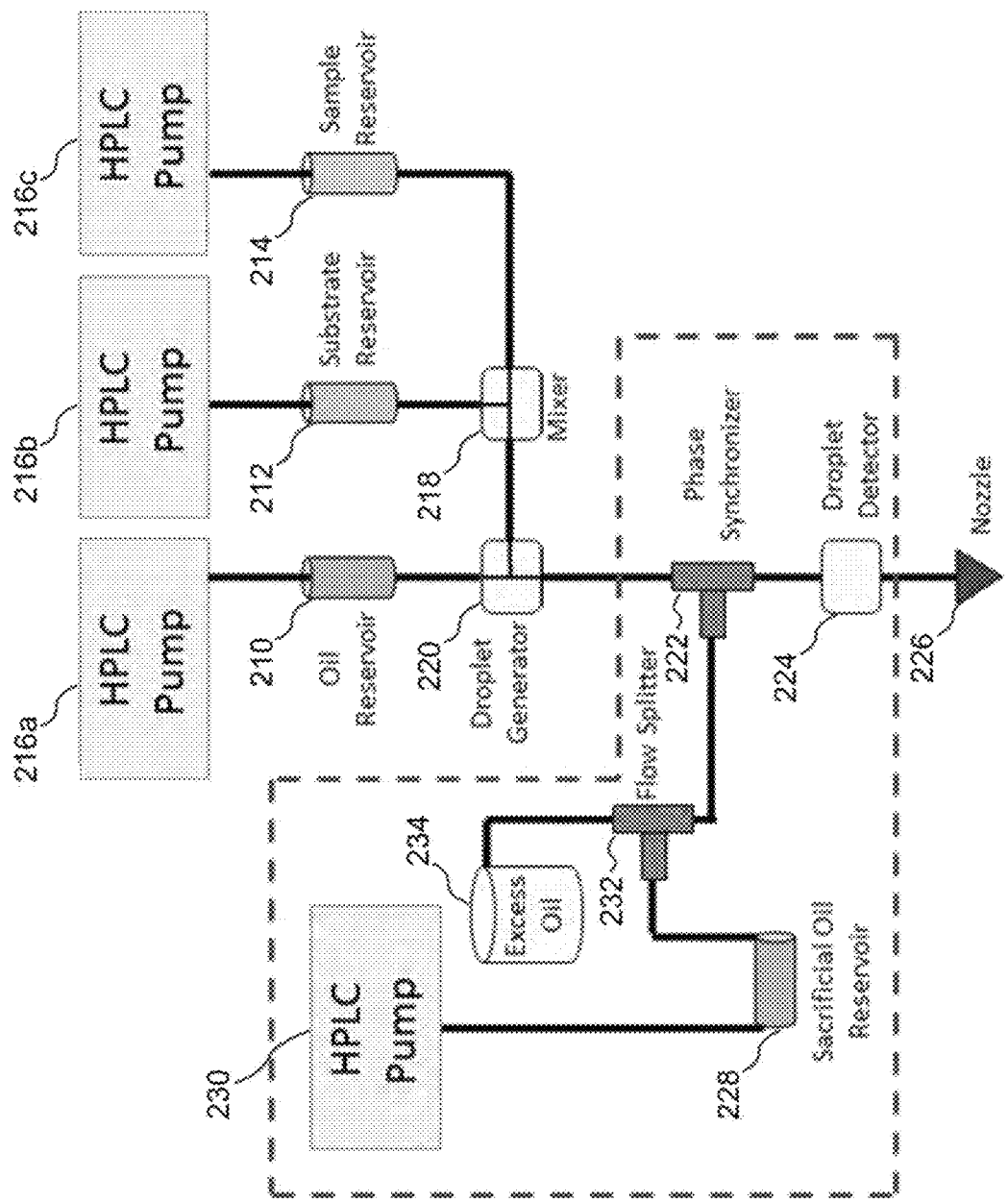
FIG. 2 is a schematic diagram of the system of FIG. 1, according to some embodiments.

FIG. 2 illustrates the system of FIG. 1 in further detail. An oil reservoir 210, a substrate reservoir 212, and a sample reservoir 214 are each coupled to a HPLC pump 216a, 216b, and 216c respectively. The sample fluid from the sample reservoir 214 (e.g., the crystal suspension) and the substrate solution from the substrate reservoir 212 are both pumped into a mixer 218 (e.g., step 1 of FIG. 1). The mixed solution from the mixer 218 proceeds into the droplet generator 220 where it joins a stream of oil pumped from the oil reservoir 210 to form droplets of the solution in the oil stream (e.g., step 2 of FIG. 1). The stream of droplets in oil continues to travel downstream through a phase synchronizer 222 and a droplet detector 224 (e.g., step 3 of FIG. 1 and as described in further detail below) before being expelled through the nozzle 226 (e.g., step 4 of FIG. 1).

The phase synchronizer 222 introduces a stream of sacrificial oil into the stream of droplets-in-oil in order to adjust the frequency of the droplets (e.g., the distance between droplets in the stream). Sacrificial oil is controllably pumped from a sacrificial oil reservoir 228 by an HPLC pump 230 into a flow splitter 232. From the flow splitter 232, part of the stream of the sacrificial oil proceeds to the phase synchronizer 222 while the rest is diverted into an excess oil reservoir 234. The flow splitter 232 enables smaller increases in the sacrificial oil flow rate than the HPLC pump 230 alone, thus increasing the resolution of the phase synchronizer 222.

The introduction of more oil (i.e., the sacrificial oil) into the stream of droplets increases the distance between droplets in the stream. The stream of droplets then proceeds to the droplet detector 224 that is configured to detect the phase changes between oil and droplet to determine the droplet flow rate (e.g., the time between each new droplet passing through the droplet detector 224).

Figure 3:
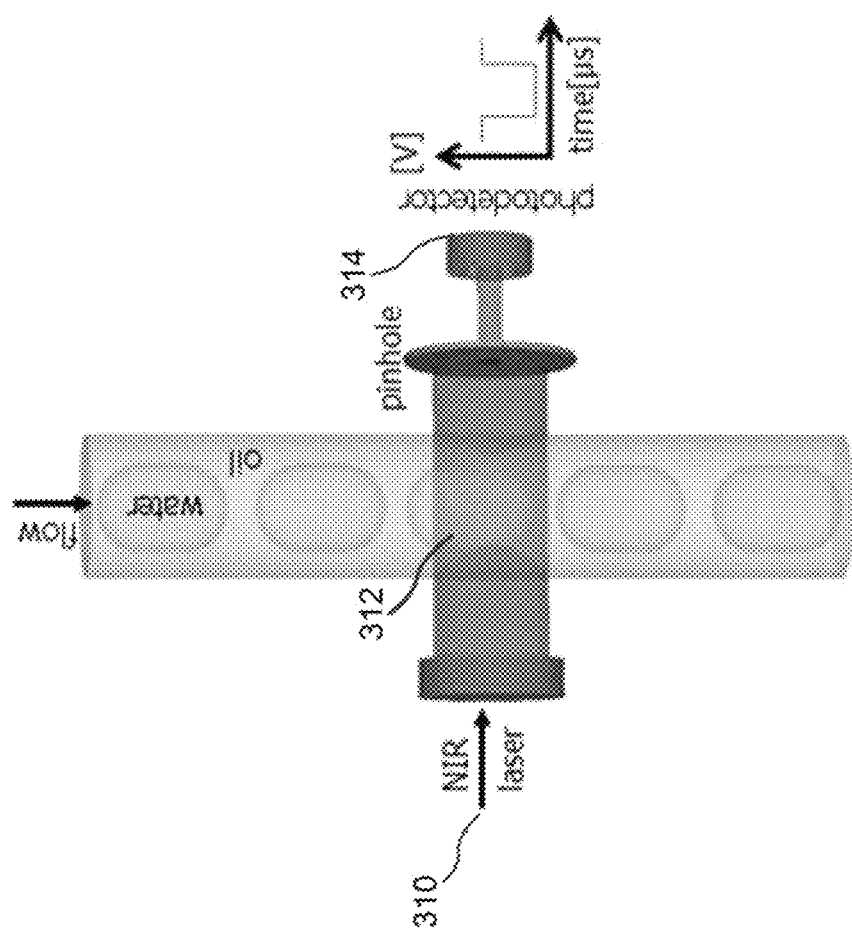
FIG. 3 is a partially transparent overhead view of a frequency and phase detector of the system of FIG. 1, according to some embodiments.

FIG. 3 illustrates an example of the droplet frequency and phase detector 224 in further detail. A NIR laser 310 illuminates a transparent fused silica capillary 312 containing the droplet stream and the absorbance is detected by a photodetector 314. The absorbance will change depending on whether oil or droplet is located between the laser 310 and the photodetector 314. This change in absorbance results in a voltage change in the output of the photodetector 314 which denotes a boundary of the droplet. The droplet frequency and phase can be determined based on the monitored voltage change and, once calculated, can be compared to the XFEL frequency and phase for real time adjustments of droplet generation and droplet synchronization.

The graphs of FIGS. 4 and 5 illustrate the result of the synchronization. As discussed above, the voltage output of the photodetector 314 will change depending on whether a droplet is present in the detector 314 (i.e., $t_{drop}$) or oil is present in the detector 314 (i.e., $t_{oil}$). To perform serial femtosecond crystallography (SFX) analysis using the system of FIG. 1, the x-ray pulse of the XFEL would be generated when a droplet is in the x-ray interaction region of the XFEL as shown in the graph of FIG. 4. Both frequency and phase of the droplet stream are synchronized to the x-ray pulse of the XFEL by the system of FIG. 1.

The graph labelled "Out of Phase" in FIG. 5 illustrates an example where x-ray pulses and droplets in the stream have the same frequency, but are out-of-phase. As illustrated in this example, a droplet will never be hit by the x-ray without some adjustment or control. As illustrated in the graph labelled "In Phase" in FIG. 5, a time shift can adjust the droplet phase to be in phase with the x-ray pulses of the XFEL. This time shift (as well as the frequency of the droplets in the stream) can be adjusted with the droplet synchronizer (i.e., FIG. 1, step 3—"Synchronization") or the phase synchronizer 222 of FIG. 2.

Figure 6A:
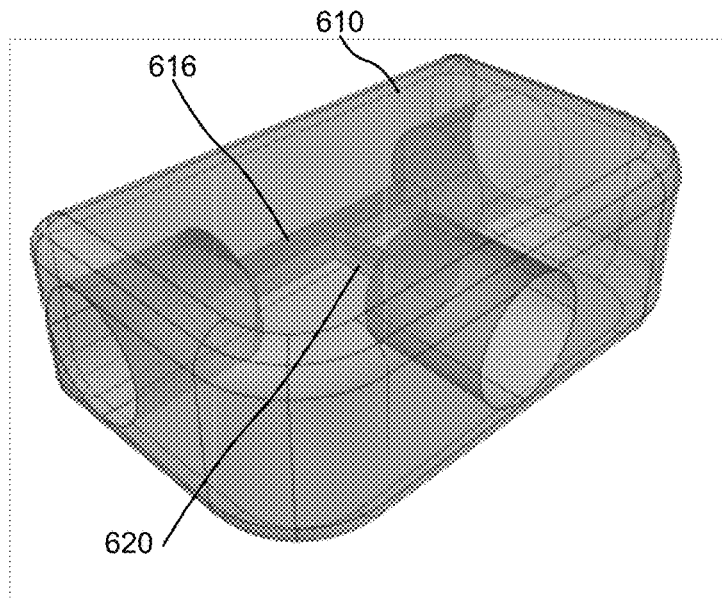
FIG. 6A is a partially transparent perspective view of a phase synchronizer T-junction of the system of FIG. 1, according to some embodiments.
Figure 6B:
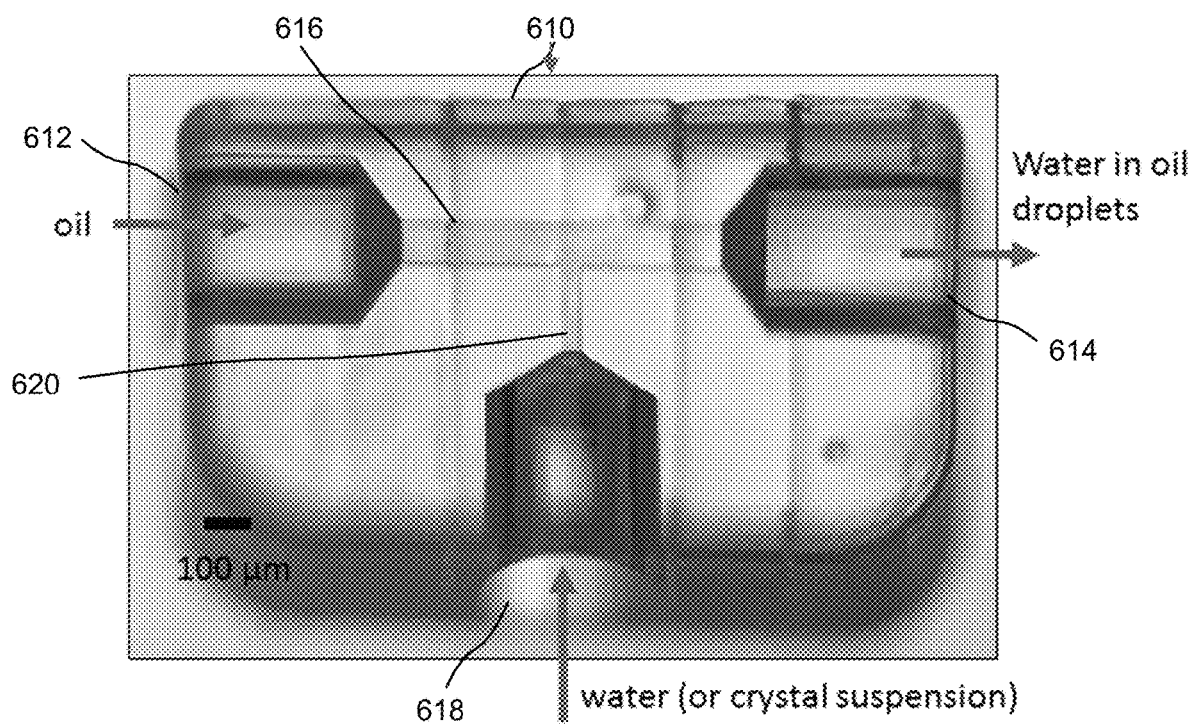
FIG. 6B is a partially transparent overhead view of the phase synchronizer T-junction of FIG. 6A, according to some embodiments.

FIGS. 6A and 6B illustrate and example of a T-junction component 610 that can be implemented as the droplet synchronizer in the system of FIG. 1 (step 3—"Synchronization"). In some implementations, this T-junction component 610 can also be utilized as the flow splitter 232 and/or the droplet generator 220 in the example of FIG. 2. The T-junction component 610 in this example is a 3D printed component that includes two cylindrical channels (an inlet channel 612 and an outlet channel 614) that each gradually taper into a first rectangular channel 616. A second inlet channel 618 is also provided that tapers into a second rectangular channel 620 that couples to the first rectangular channel 616 to join the main stream. In this example, the width of the first rectangular channel 616 is 100 μm while the width of the second rectangular channel 618 is 75 μm. Both rectangular channels are 75 μm tall. Both of the inlet channels 612 and 618, and the outlet channel 614 have a diameter of 380 μm. The entire 3D printed component illustrated in FIGS. 6A and 6B is 1 mm wide, 1.5 mm long, and 0.6 mm high. The droplet generator 220 may have the same geometry as shown in FIGS. 6A and 6B. Thus, this device can be employed both for synchronization of water droplets by adding oil to water in oil segmented flow, or to generate the water droplets in oil. In FIG. 6B, if employed under "synchronization mode" oil would be added to the inlet 618 and the segmented oil water solution would be delivered to the inlet 612.

Figure 7:
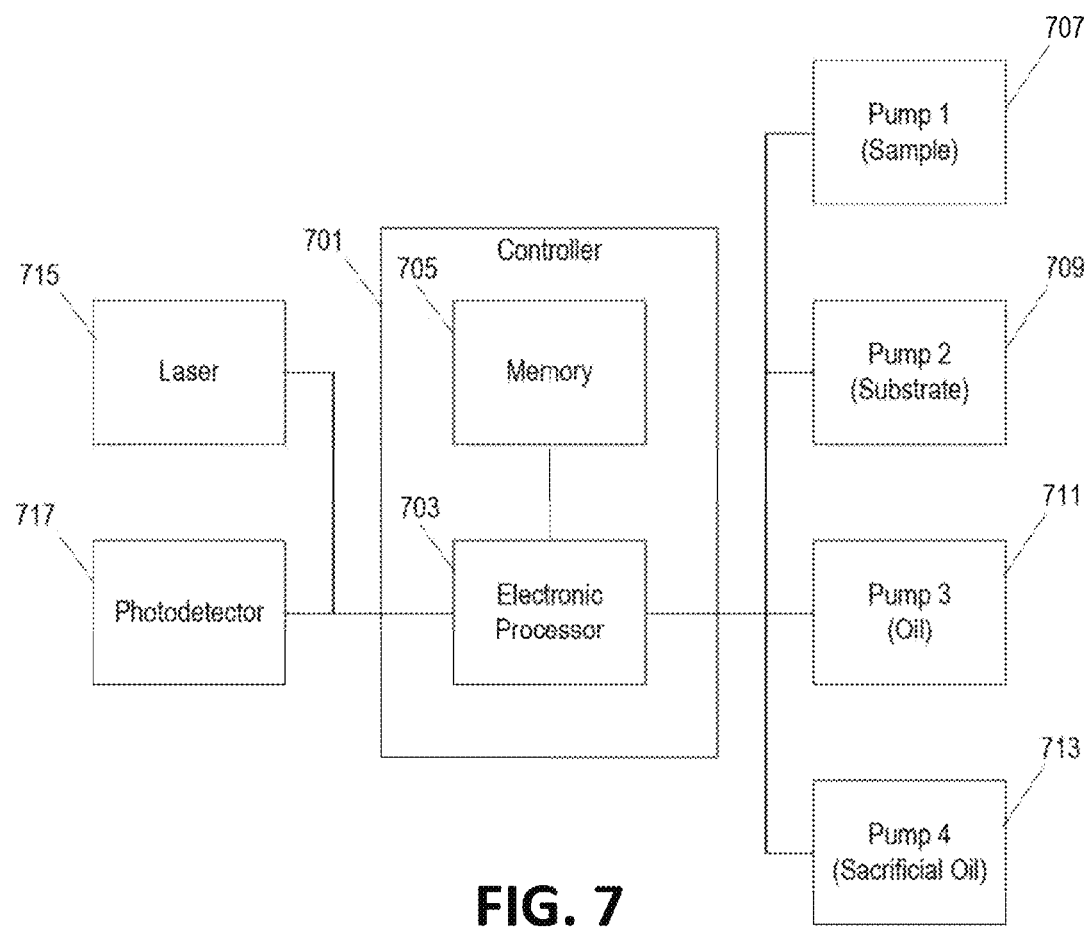
FIG. 7 is a block diagram of a control system for the system of FIG. 1, according to some embodiments.

FIG. 7 illustrates an example of a control system configured to operate the SFX system of FIG. 1. A controller 701 includes an electronic processor 703 and a non-transitory computer-readable memory 705. The memory 705 stores instructions that are executed by the electronic processor 703 to provide the functionality of the controller 701. The controller 701 is coupled to each of the four pumps 707, 709, 711, 713 as illustrated in FIG. 2. The controller 701 is also coupled to the laser 715 and the photodetector 717 of the droplet detector illustrated in FIG. 3.

Figure 8:
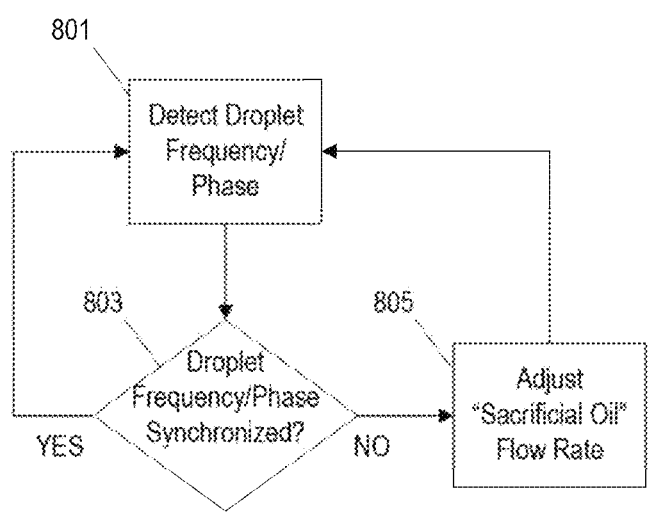
FIG. 8 is a flowchart of a method for synchronizing the droplet flow performed by the control system of FIG. 7, according to some embodiments.

FIG. 8 illustrates an example of a method executed by the controller 701 of FIG. 7 to adjust the frequency and phase of the droplets in the output stream. The controller 701 monitors the output of the photodetector 717 to determine a frequency and phase of the droplets in the stream passing through the droplet detector (step 801). Based on this determined frequency & phase of the droplets and a known frequency/phase of the x-ray pulses of the XFEL, the controller 701 determines whether the droplet stream has the same frequency and the same phase as the x-ray pulses (step 803). If the frequency and/or the phase are not synchronized, the controller 701 adjusts the sacrificial oil pump 713 which, in turn, alters the frequency and/or phase of the droplets in the output stream (step 805). This control loop is repeated by the controller 701 until the phase and frequency of the droplet stream both match the phase and frequency of the x-ray pulses of the XFEL.

In serial femtosecond crystallography (SFX) experimentation utilizing X-ray free electron laser (XFEL) detection for the investigation of protein crystal structures, the volume of wasted sample material between laser pulses may be reduced by synchronizing the protein crystal delivery rate with the x-ray beam repetition rate.

Methods and systems are provided for fabrication of a 3D-printed water-in-oil droplet generator. The generator device can initiate and tune droplet generation frequency by inducing local electric fields from embedded Gallium (Ga) metal-based electrodes in a micrometer-scale 3D-printed device. The non-contact gallium electrodes can prevent degradation and damage of biological samples such as precious protein crystals. These electrodes can also reduce various problems, such as Joule heating, and can avoid hydrolysis. The Ga metal electrode design can be easily adapted to many different configurations of 3D-printed microfluidic devices. These methods do not require complex fabrication processes such as deposition or microfabrication methods.

The initiating droplet generation and tuning droplet generation frequency in a 3D-printed device is achieved by polarizing an oil-water interface utilizing an application of alternating current (AC) potential, thereby adjusting interfacial tension to induce droplet breakup. This active droplet generation 3D-printed device offers increased control of droplet frequency and droplet size, and possesses the ability to synchronize the phase of droplet generation. Phase synchronization is accomplished utilizing an external trigger, such as that of an X-ray free electron laser used in serial femtosecond crystallography. Furthermore, the generated droplets may be coupled to an SFX with XFELs experiment compatible with a common liquid injector such as a gas dynamic virtual nozzle (GDVN).

FIG. 9 illustrates serial femtosecond crystallography (SFX) apparatus and process that utilizes an X-ray free electron laser (XFEL). Referring to FIG. 1, a serial femtosecond (fs) crystallography experiment utilizes short fs XFEL laser pulses that intersect with a liquid sample stream (jet). Front and rear CCD detectors capture the interactions of the sample and the XFEL laser pulses. XFEL lasers currently in use, for example, LCLS in Stanford, EuXFEL in Germany, PAL-XFEL in Korea, or SACLA in Japan, and a future XFEL laser SwissFEL in Switzerland, pulse at repetition rates of 10 Hz up to 120 Hz. During the time periods when a laser is not pulsing, for example, in between pulses, sample in the injected liquid stream is wasted, thus wasting precious protein crystal samples.

The present method and system provides a droplet generator that delivers droplets of crystal containing solution intersected by an oil phase, and tunes the frequency of the droplets. For example, the frequency of the droplets may be tuned to a frequency between 10 and 120 Hz, depending on the XFEL instrument. However, the system is not limited to any specific frequency range and the system may be tuned to other frequencies.

Figure 10:
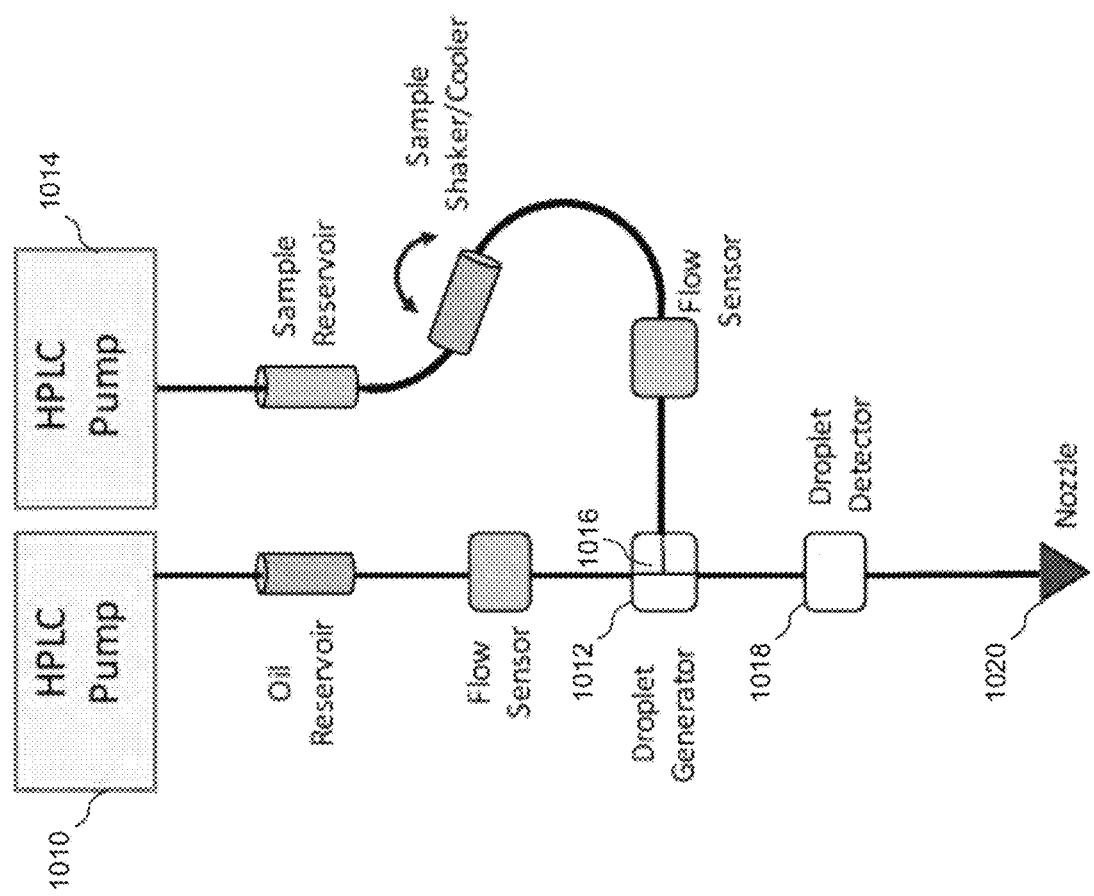
FIG. 10 a flow chart for a SFX droplet generation experiment using an XFEL, according to some embodiments.

FIG. 10 is a flow chart for an exemplary SFX droplet generation experiment using an XFEL. As shown in FIG. 2, pressure applied by an HPLC pump 1010 forces oil to flow into a droplet generator 1012. The oil serves as a medium for carrying droplets of a sample. Another HPLC pump 1014 provides pressure to force sample material carried in a liquid, for example, crystals in an aqueous liquid, to a T junction 1016 in the droplet generator 1012, where the droplet generator 1012 injects droplets of the sample liquid into the oil medium. The sample droplets in the oil medium flow to a droplet detector 1018 and out of a nozzle 1020. Pressure from the HPLC pumps 1010 and 1014 may influence the frequency of droplets in the flow.

In some embodiments, an electric field is induced within the droplet generator 1012 to initiate sample droplet generation, or to vary the frequency of sample droplets flowing away from the droplet generator 1012. For example, the droplet generator 1012 may comprise non-contact conductive electrodes. Direct current (DC) or alternating current (AC) potentials may be applied to the electrodes to induce the local electric fields to modify the frequency of the droplets.

The pump pressures may influence the droplet frequency without the applied electric potential. Typically, the flow rate ratio of oil to water determines an established droplet frequency. Upon application of an AC or DC potential, that frequency is altered. The system can also be operated under constant pressure conditions. In this case, a pressure ratio of the oil and water lines determines a "base" frequency. In further regime, droplets are not generated under the constant pressure mode, but are initiated via the applied electric potential.

An applied field may cause an electrowetting effect that may change the contact angle of the oil/water/device interface. This in turn may change the likelihood of droplet release. At higher frequencies, high speed videos show an instability (fluctuation) of the oil/droplet interface, which then leads to droplet breakup. At even higher frequencies, dielectric breakdown may happen, spraying many small droplets into the oil phase.

In some embodiments, the droplet generator 1012 comprises a 3-D printed device. The electrodes of the droplet generator 1012 may comprise gallium (Ga) metal based non-contact electrodes embedded in the 3-D printed device. The embedded electrodes may be fabricated by injecting the Ga metal into inlets of the 3-D printed device. The embedded electrodes may be used to induce the local electric fields that initiate droplets or tune the frequency of the droplets, and may change the water-in-oil interface. In some embodiments, the droplets may be generated based on a trigger for applying a potential across the electrodes. For example, the trigger may be based on the frequency of the XFEL laser. Such a method may be referred to as on demand droplet generation.

In some systems, a power source, such as a function generator in combination with a voltage amplifier, are utilized to generate the DC or AC waveforms applied to the droplet generator 1012 electrodes. For example, the voltage source devices may be connected via wires and conductive adhesive to the metal electrodes embedded in the 3D printed droplet generator 1012. See FIG. 10 for an example of an experimental setup.

A contact angle of the water/oil/device interface, and its changes, may be referred to as wetting properties. Electrowetting effects may lead to extension of an aqueous droplet to an opposite device wall or a droplet dragging on a wall of the device. When an electric potential is not applied in the device, the device walls are hydrophobic and the hydrophilic droplet does not attach or stick to the wall. With an electric potential applied, the droplet can touch the adjacent device wall before it releases. This may typically occur at higher frequencies of applied electric potential.

The device walls may be hydrophobic because they are coated with a coating agent, for example, Novec 1720 (a product of 3M). The device material may be proprietary. A resist may be used in printing. The measured the contact angle of the material has been found to be hydrophilic. Therefore the device walls are rendered hydrophobic to avoid droplets sticking to the wall in a regular (no potential) droplet generation device.

Figure 11:
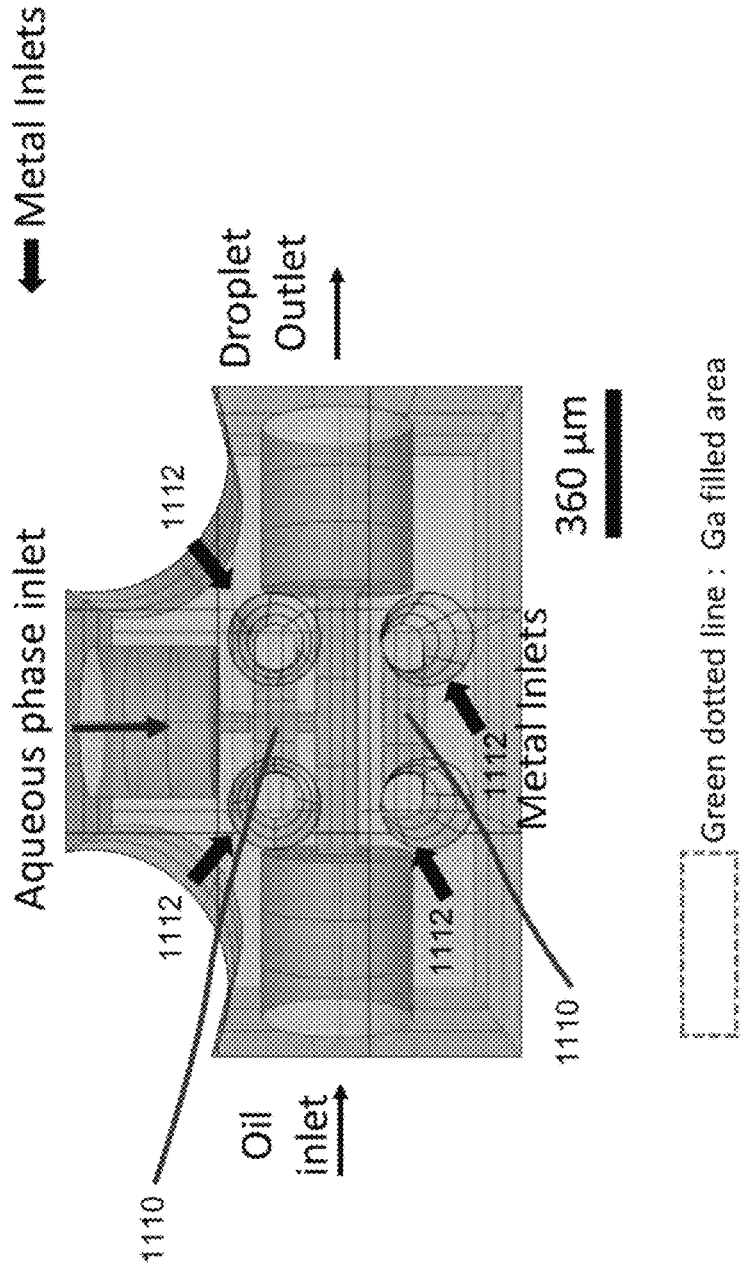
FIG. 11 is a perspective cut-away view of a design for a micrometer-scale 3D-printed droplet generator device with metal-based electrodes for initiating and tuning droplet generation, according to some embodiments.

FIG. 11 is a perspective cut-away view of a design example for a micrometer-scale 3D-printed droplet generator device with metal inlets 1112 for embedding (injecting) gallium (Ga) metal-based electrodes 1110 in the 3D printed device. The electrodes 1110 are utilized to induce electric fields in the device for initiating droplet generation and/or tuning the frequency of droplet generation.

Figure 12:
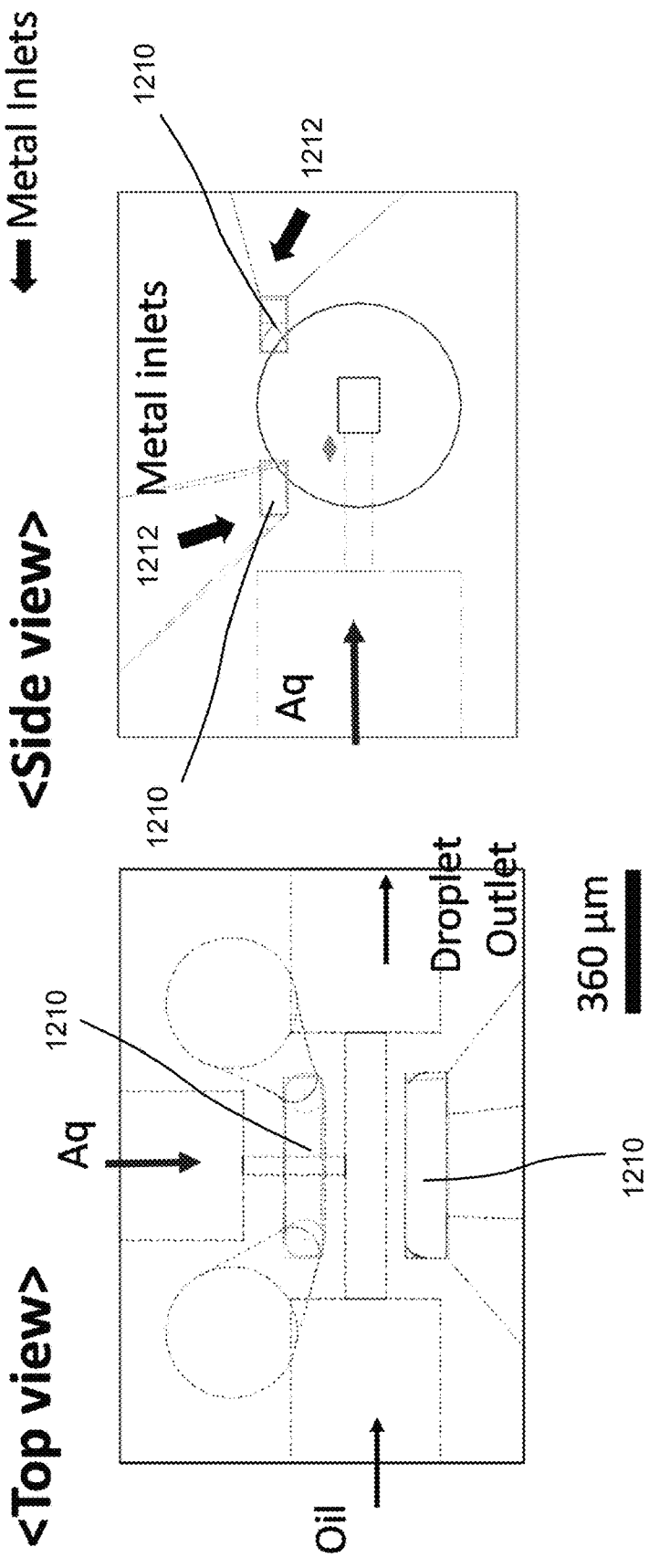
FIG. 12 is a top view and side view of a design for a micrometer-scale 3D-printed droplet generator device with metal-based electrodes for initiating and tuning droplet generation, according to some embodiments.

FIG. 12 is a top view and side view of a design example for a micrometer-scale 3D-printed droplet generator device with metal inlets 1212 for embedded GA metal-based electrodes 1210 utilized for initiating droplet generation and/or tuning the frequency of droplet generation by inducing local electric fields in the 3D-printed device.

Figure 13:
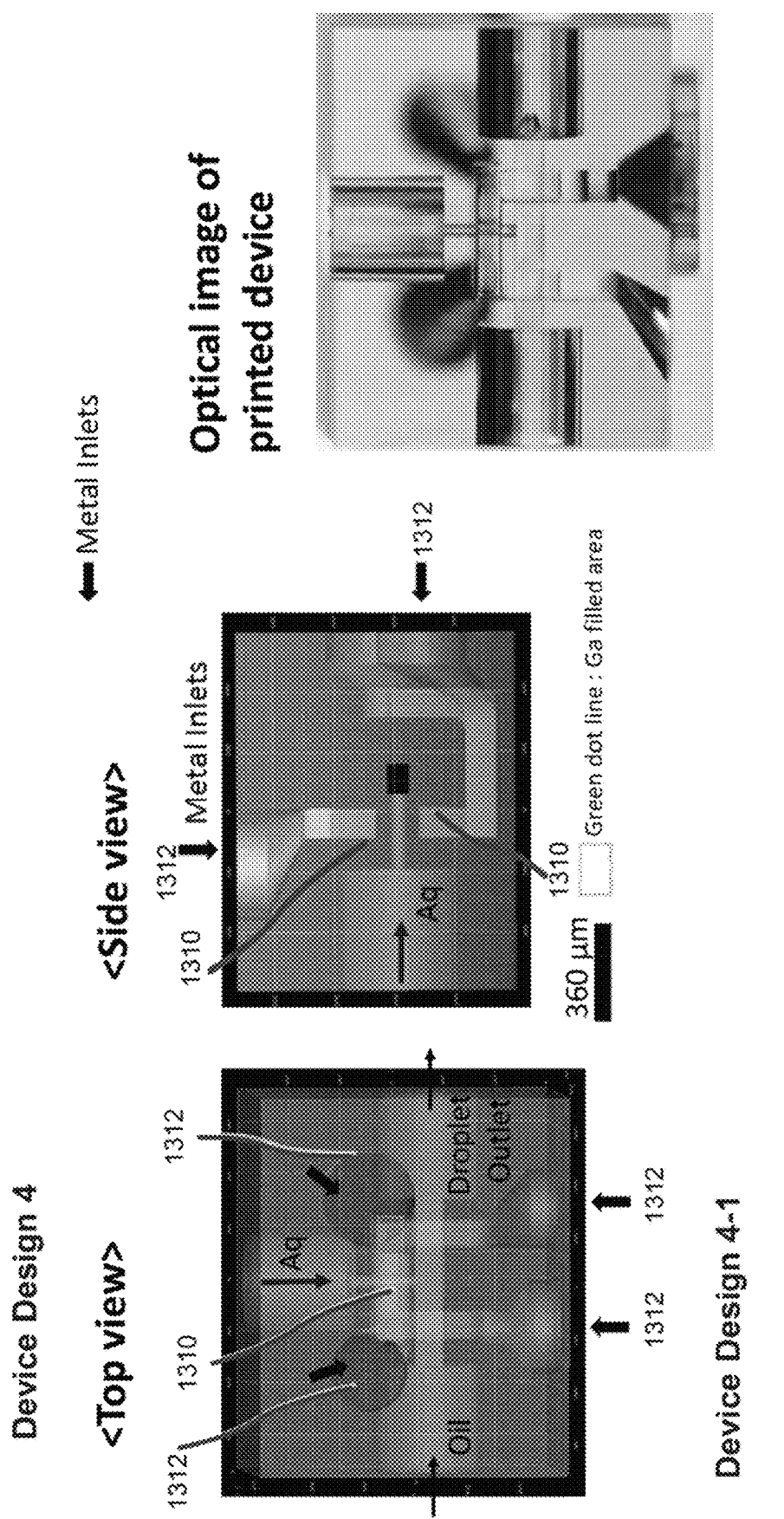
FIG. 13 includes 1) a top view and side view of a design for a micrometer-scale 3D-printed droplet generator device with metal-based electrodes for initiating and tuning droplet generation, 2) an optical image of a printed device based on the design, and 3) a description of a variation on the design, according to some embodiments.

FIG. 13 includes 1) a top view and side view of a device design 4 for a micrometer-scale 3D-printed droplet generator device with metal inlets 1312 for embedded Ga metal-based electrodes 1310 utilized for initiating droplet generation and/or tuning the frequency of droplet generation by inducing local electric fields, 2) an optical image of a printed device based on the design, and 3) a description of a variation 4-1 on the device design 4.

Figure 14:
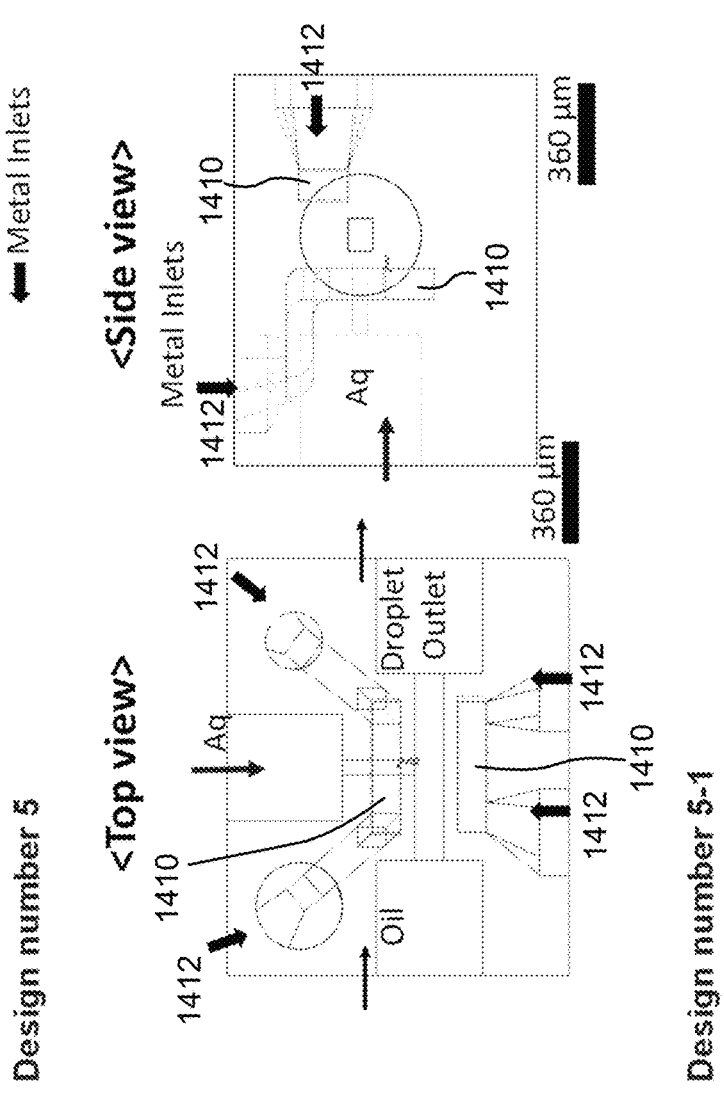
FIG. 14 includes 1) a top view and side view of a design for a micrometer-scale 3D-printed droplet generator device with metal-based electrodes for initiating and tuning droplet generation, 2) an optical image of a printed device based on the design, and 3) a description of a variation on the design, according to some embodiments.

FIG. 14 includes a top view and side view of a design for a micrometer-scale 3D-printed droplet generator device. The design includes metal inlets 1412 for injecting Ga metal-based material to form the electrodes 1410 that are utilized for initiating droplet generation and/or tuning the frequency of droplet generation by inducing local electric fields. FIG. 6 further includes an optical image of a printed device based on the design, and a description of a variation on the design.

Figure 15:
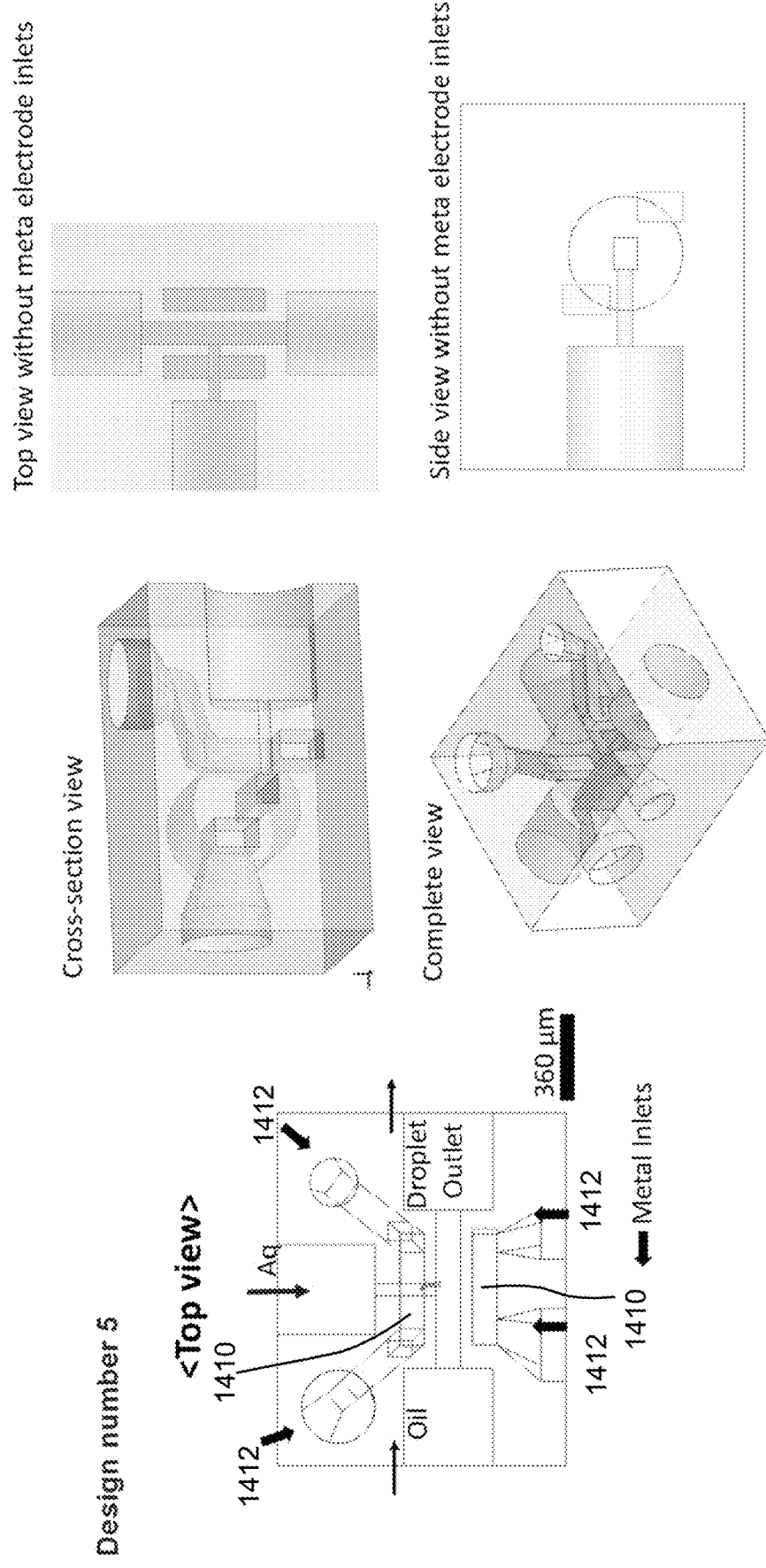
FIG. 15 includes the top view of the design of FIG. 14, a 3-D model cross-section view of the same design, a 3-D model complete perspective view of the same design, a top view of the same design 3-D model, and a side view of the same design 3-D model, according to some embodiments.

FIG. 15 includes the top view of the design shown in FIG. 14, a 3-D model cross-section view of the same design, a 3-D model complete perspective view of the same design, a top view of the same design 3-D model without metal electrode inlets, and a side view of the same design 3-D model without metal electrode inlets.

Figure 16:
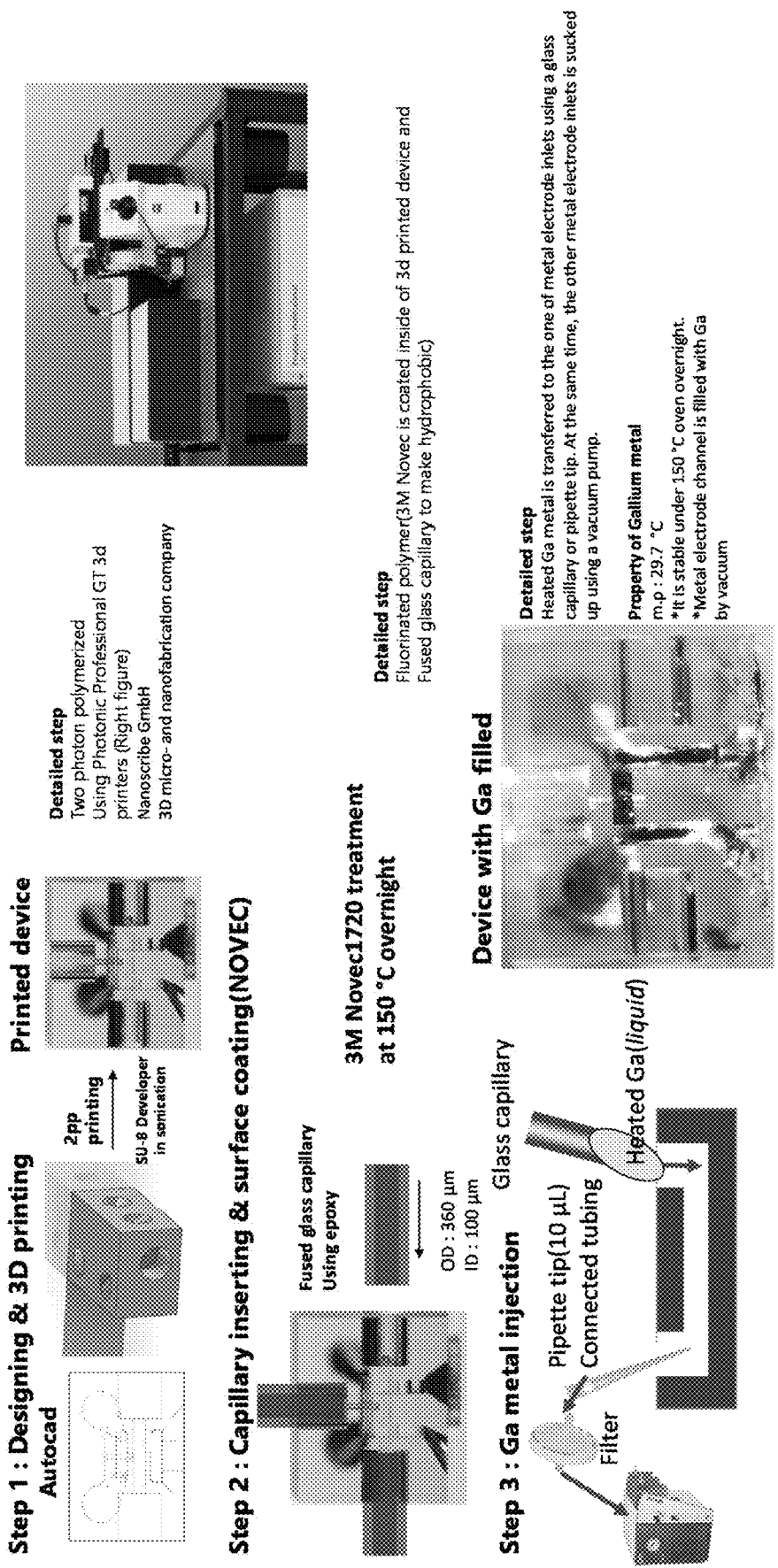
FIG. 16 illustrates a fabrication method and procedure including 1) designing and 3-D printing a droplet generator device with metal inlets for embedded Ga metal-based electrodes, 2) inserting fused silica capillaries, and 3) injecting Ga metal into the metal inlets of the 3-D printed device, and a photo of the device with the Ga filled electrodes, according to some embodiments.

FIG. 16 illustrates a method and procedure for fabricating a droplet generator device with metal electrodes, including 1) designing and 3-D printing the droplet generator device with metal inlets for injecting Ga metal-based electrodes, 2) inserting fused silica capillaries into the device ports, and 3) injecting Ga metal into the metal inlets. Also shown is a photo of the device with the Ga filled electrodes.

Figure 17:
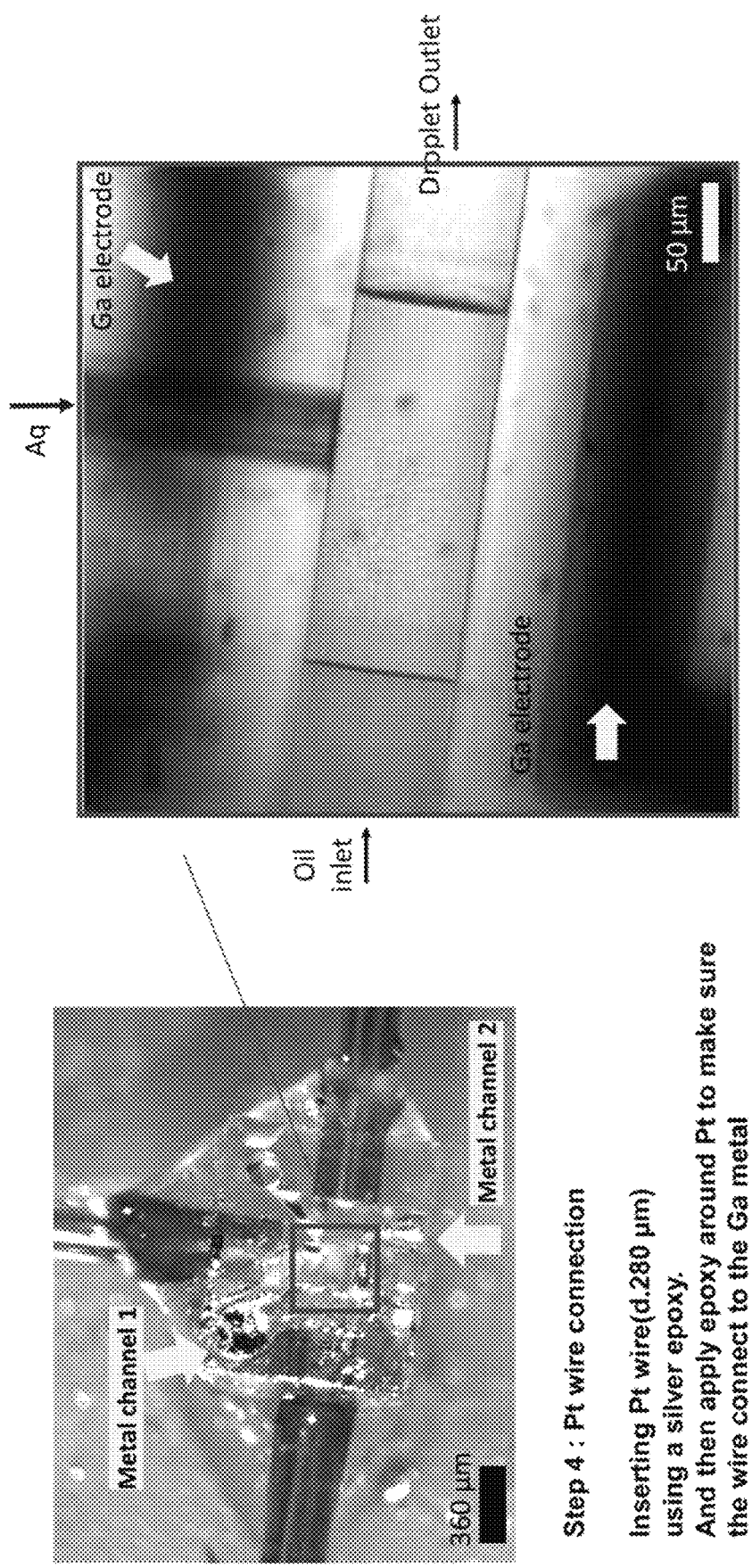
FIG. 17 illustrates a fabrication method and procedure for inserting a platinum (Pt) wire to connect to a Ga metal electrode in a 3-D printed droplet generator device, including a top view and top view detail of the device, according to some embodiments.

FIG. 17 illustrates a method and procedure for inserting a platinum (Pt) wire to connect to a Ga metal electrode in a 3-D printed droplet generator device, including a top view and top view detail of the device.

Figure 18:
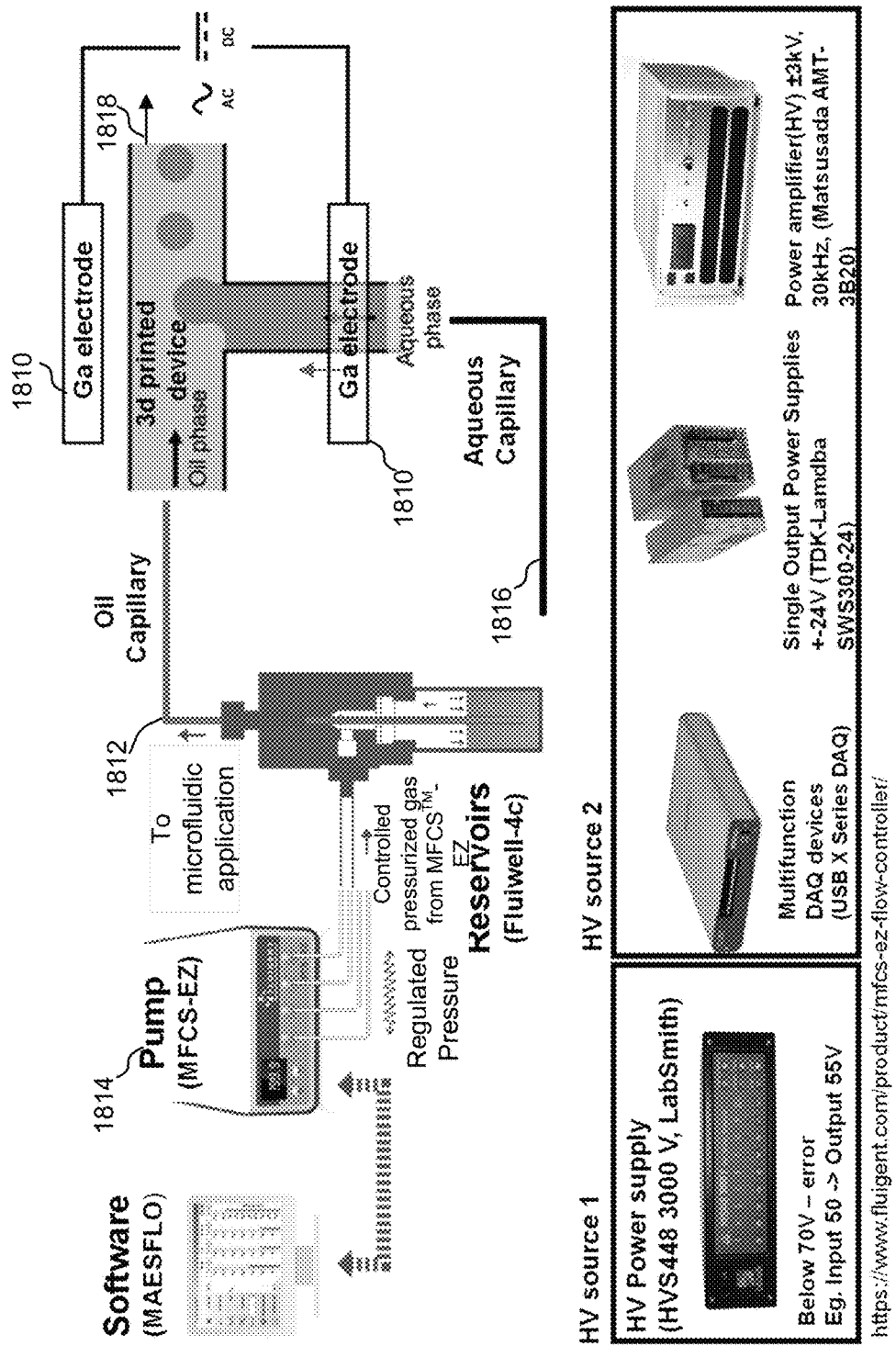
FIG. 18 is a diagram of an experimental setup for generating aqueous droplets into the flow of an oil medium, and controlling the frequency of the droplets in the oil by applying an AC or DC potential across the electrodes of a droplet generator, according to some embodiments.

FIG. 18 is a diagram of an experimental setup for generating aqueous droplets into the flow of an oil medium, and controlling the frequency of the droplets in the oil by applying an AC or DC potential across the electrodes 1810 of a droplet generator. The oil phase is forced into an oil capillary 1812 by a pump 1814. The aqueous phase is forced into an aqueous capillary 1816 by a pump (not shown). Aqueous droplets are formed in the oil and flow out of the droplet generator via a third capillary 1818. An electric field is induced by the applied potential, which modifies the rate of droplet generation. Flow rates in the system are controlled via the external pumps. The rate of generation of the aqueous droplets may be modified depending on the level of the applied potential and/or the frequency of the applied potential. For example, the applied electrical field may speed-up droplet generation. In some embodiments, the generation of a droplet may be triggered based on the frequency of a XFEL laser utilized, for example, in serial femtosecond crystallography (SFX) apparatus and process that utilizes an X-ray free electron laser (XFEL). For example, the applied potential may be controlled based on the frequency of the XFEL. In some embodiments, a function generator in combination with a voltage amplifier may generate the DC voltage or AC waveforms. The power source device may be connected via wires and conductive adhesive to the metal in the droplet generator, for example.

FIG. 19 includes a side view of a droplet generator device design with metal electrodes and results of an experiment for on demand droplet generation.

Figure 20:
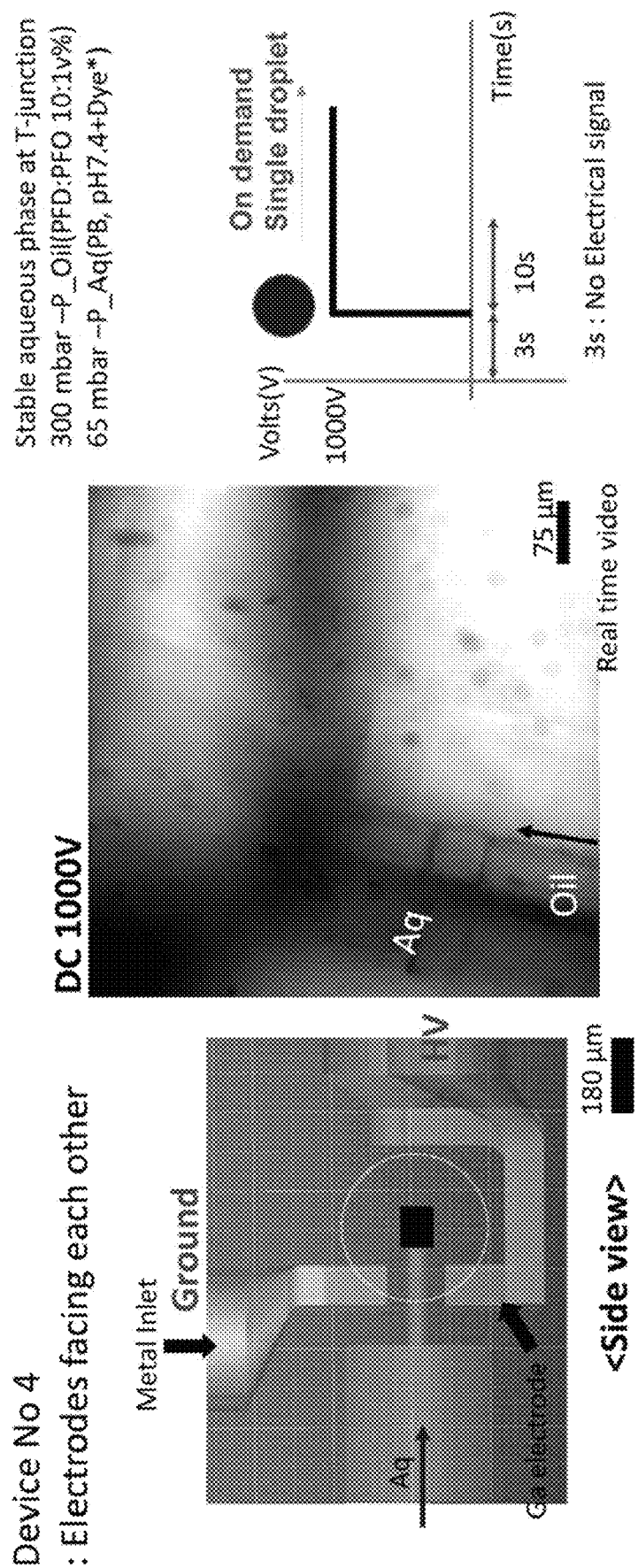
FIG. 20 includes a side view of a droplet generator device design with metal electrodes and results of an experiment for on demand droplet generation, according to some embodiments.

FIG. 20 includes a side view of a droplet generator device design with metal electrodes and results of an experiment for on demand droplet generation.

Figure 21:
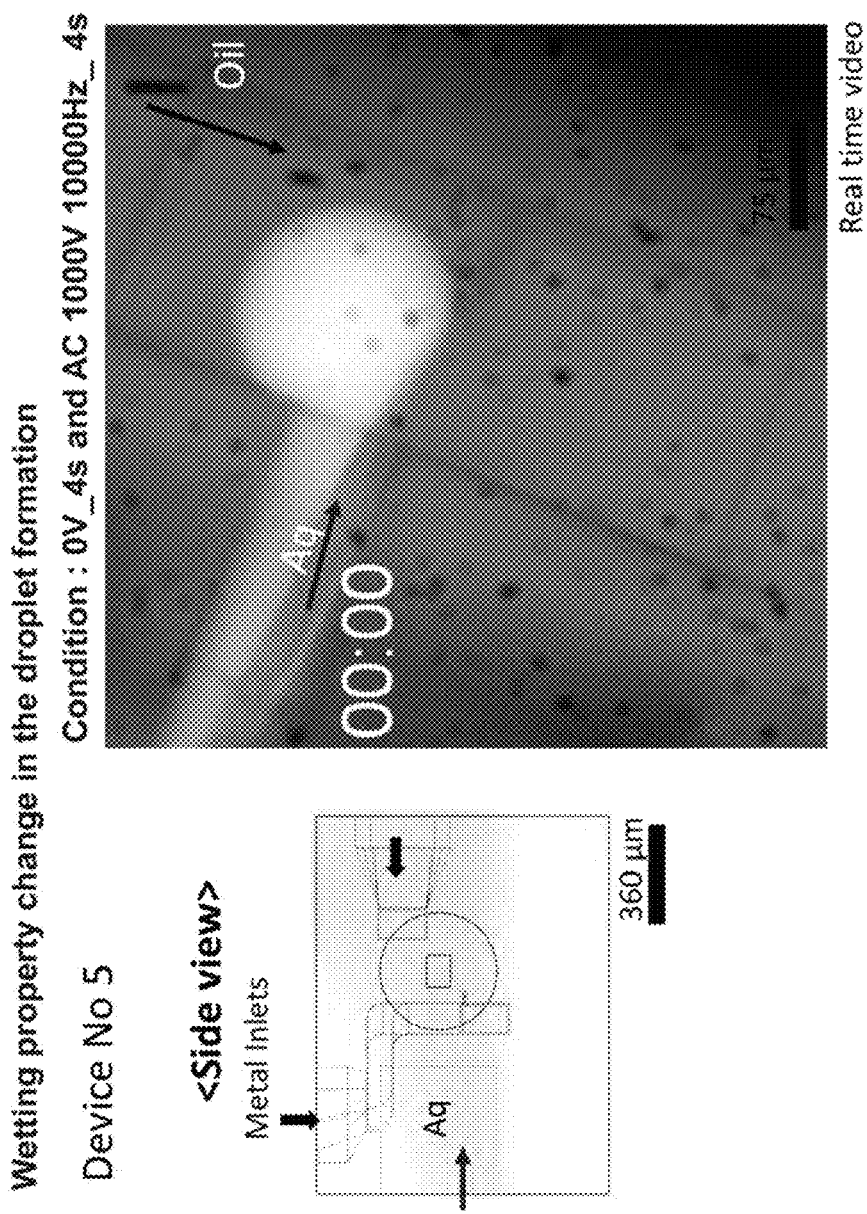
FIG. 21 represents the results of an experiment including a wetting property change in a droplet formation, according to some embodiments.

FIG. 21 represents the result of an experiment including a wetting property change in a droplet formation.

Based on experimental results utilizing device design 5, AC potentials can speed up droplet frequency. Pressure ratios induce a specific droplet frequency, which can be increased upon application of the AC potential. The frequency has been enhanced by up to a factor of 10. However, other layouts may provide a greater increase in frequency. Electric wetting phenomena and potentially dielectrophoretic effects may cause the complex response observed. Droplet frequency tuning was demonstrated at low pressure<15 psi, but also at higher pressures (~200 psi) compatible with serial femtosecond crystallography experimental flow rates.

Figure 22:
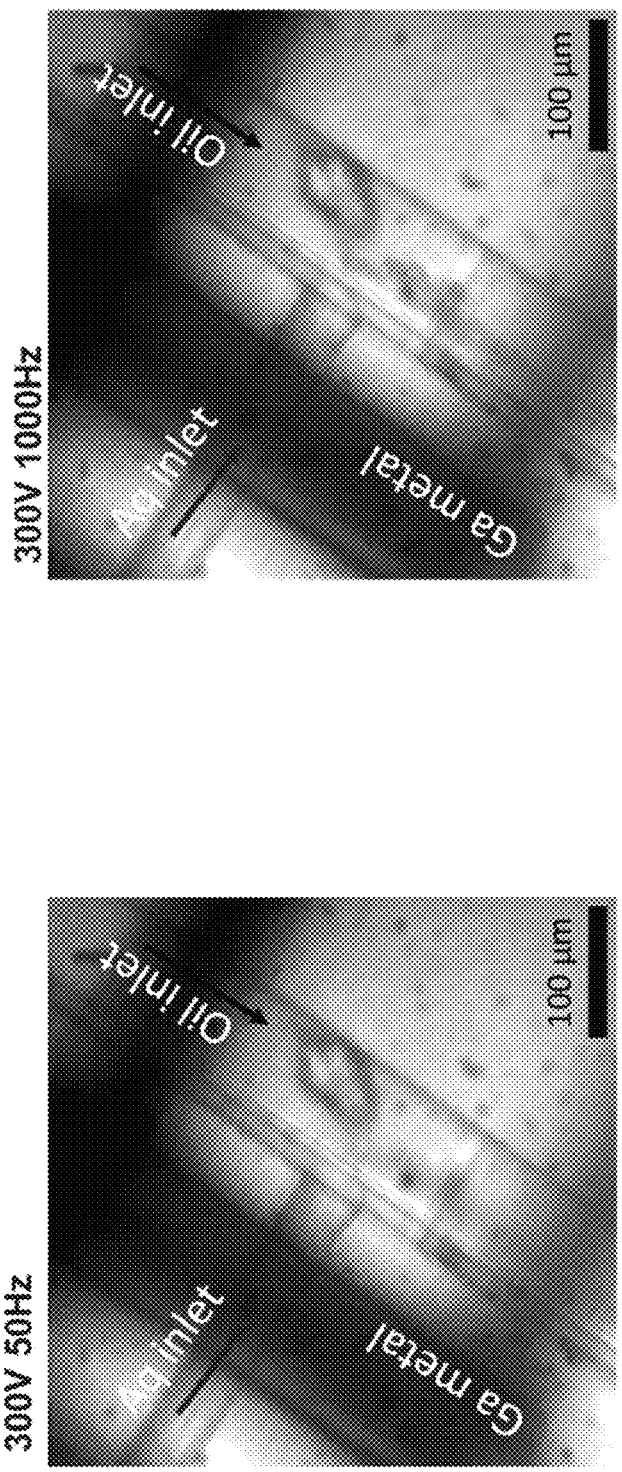
FIG. 22 illustrates images from results of an experiment utilizing the device shown in FIGS. 13, 19 and 20 for tuning droplet frequencies utilizing an applied potential, according to some embodiments.

FIG. 22 illustrates images from results of an experiment utilizing the device shown in FIG. 13 for tuning droplet frequencies utilizing an applied potential, according to some embodiments.

Figure 23:
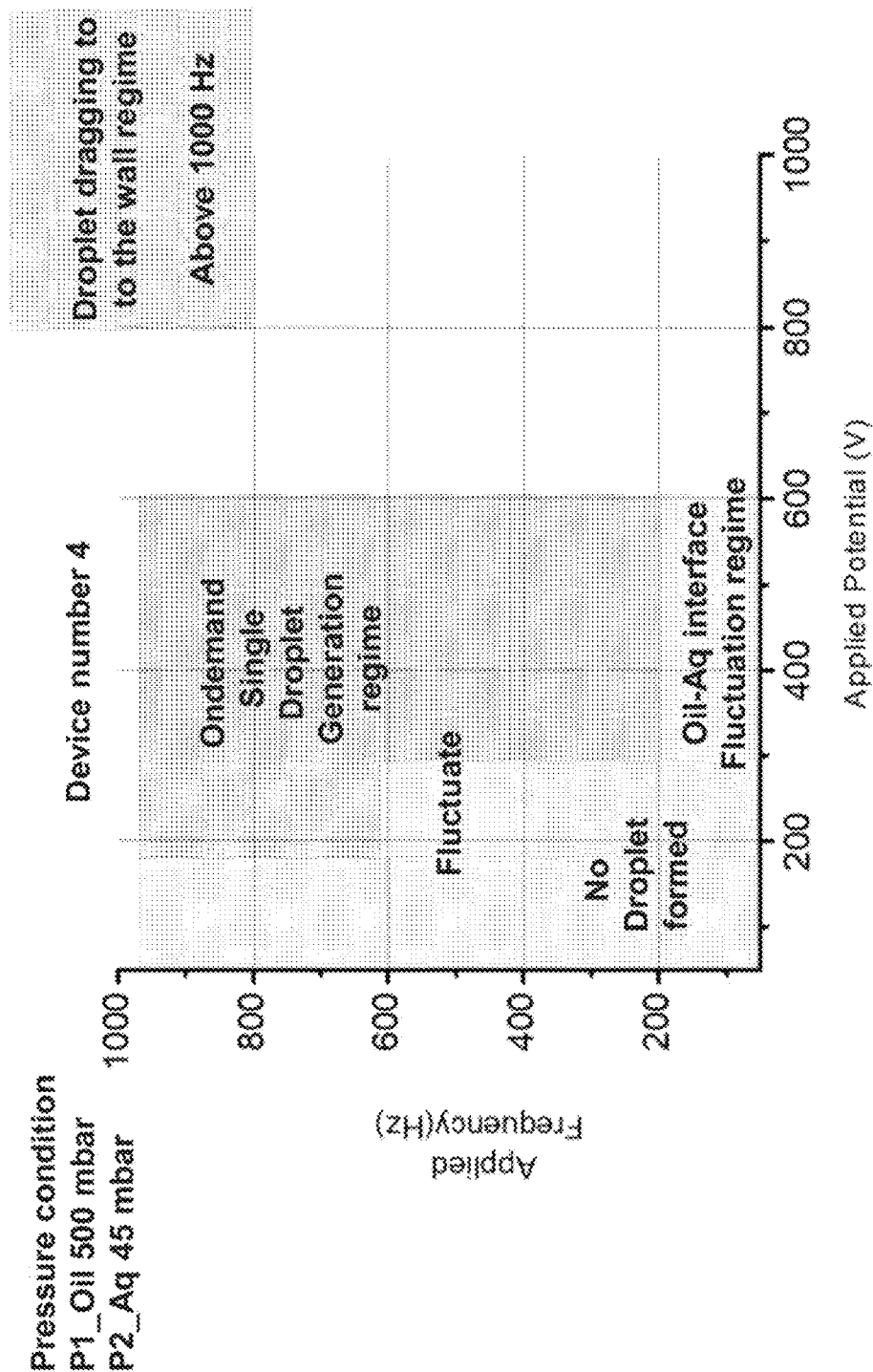
FIG. 23 represents a summary of the results of the tuning frequency experiment represented in FIG. 22, according to some embodiments.

FIG. 23 represents a summary of the results of the tuning frequency experiment represented in FIG. 22.

Based on experimental results utilizing device design 4, DC potentials can induce droplets on demand (droplet release in order of seconds). AC potentials can induce droplets on demand (also slow process).

Figure 24:
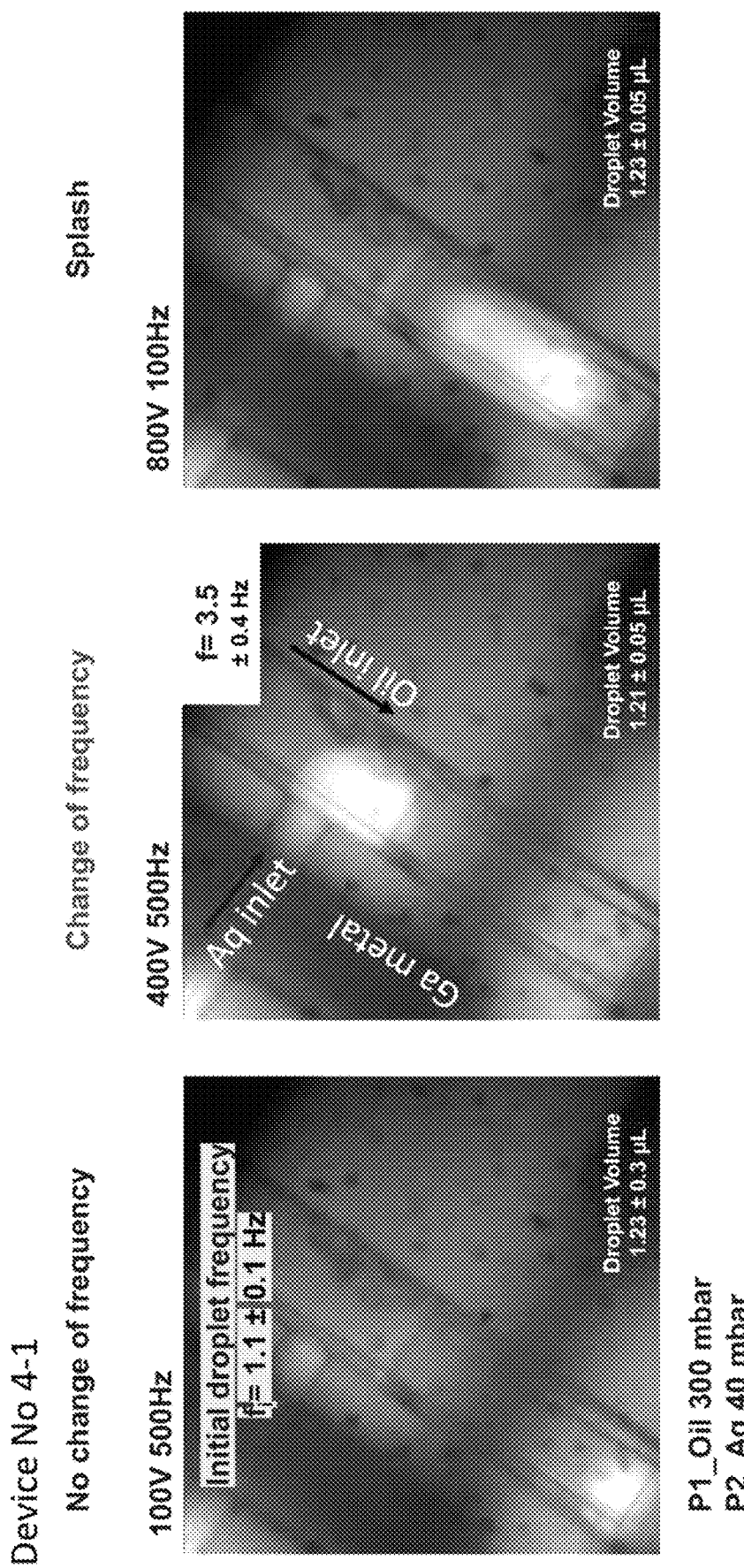
FIG. 24 illustrates images from the results of an experiment utilizing the devices shown in FIGS. 13, 19 and 20 for tuning droplet frequencies, according to some embodiments.

FIG. 24 illustrates images from the results of an experiment utilizing the devices shown in FIGS. 13, 19 and 20 for tuning droplet frequencies, according to some embodiments.

Figure 25:
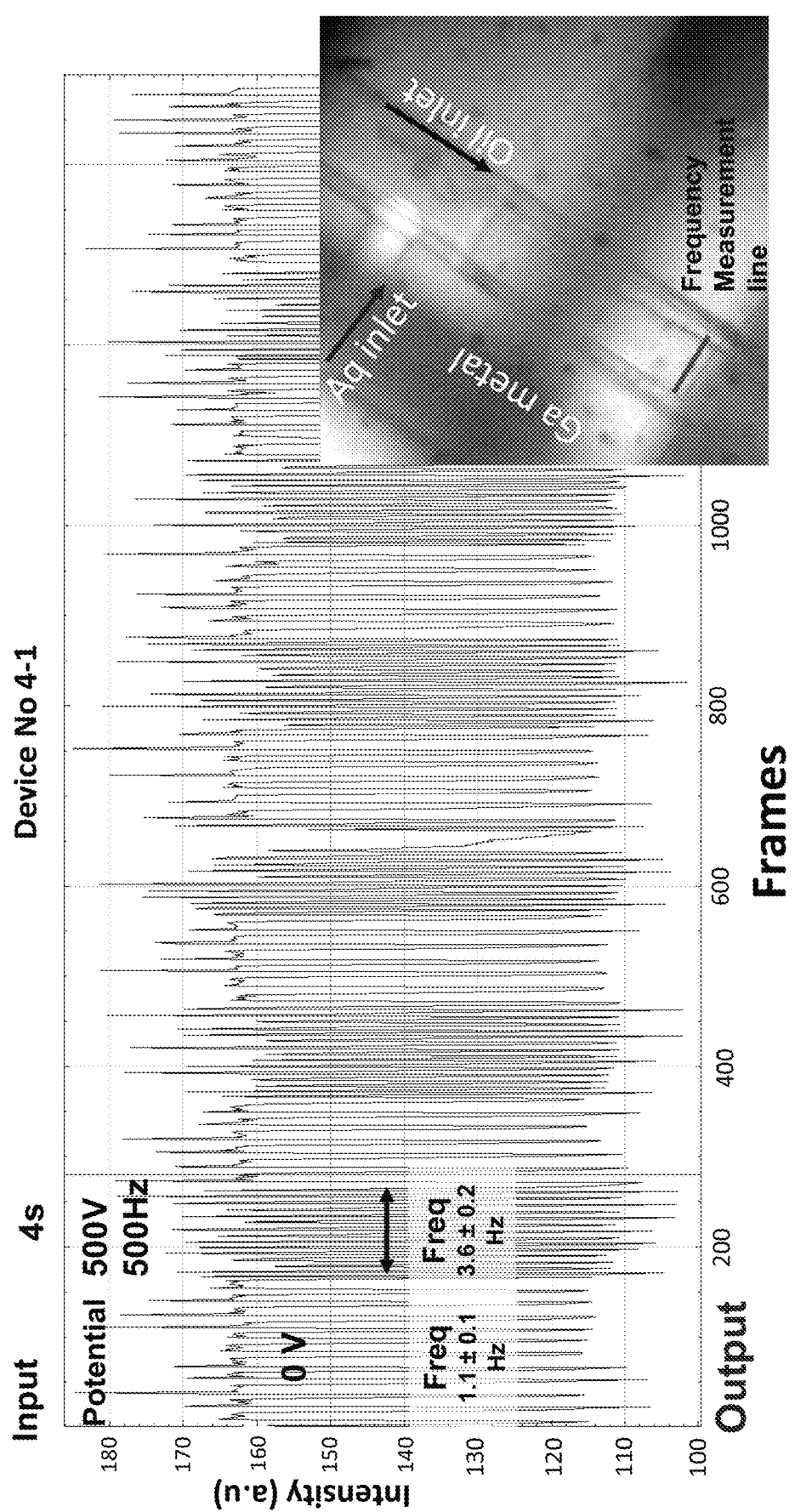
FIG. 25 represents the results of an experiment for tuning droplet frequencies, according to some embodiments.

FIG. 25 represents the results of an experiment for tuning droplet frequencies. See also FIGS. 56-76 that comprise a series of frames captured from a video showing this experiment in operation. The experiment was performed on the apparatus 4-1 shown in FIG. 13.

Figure 26:
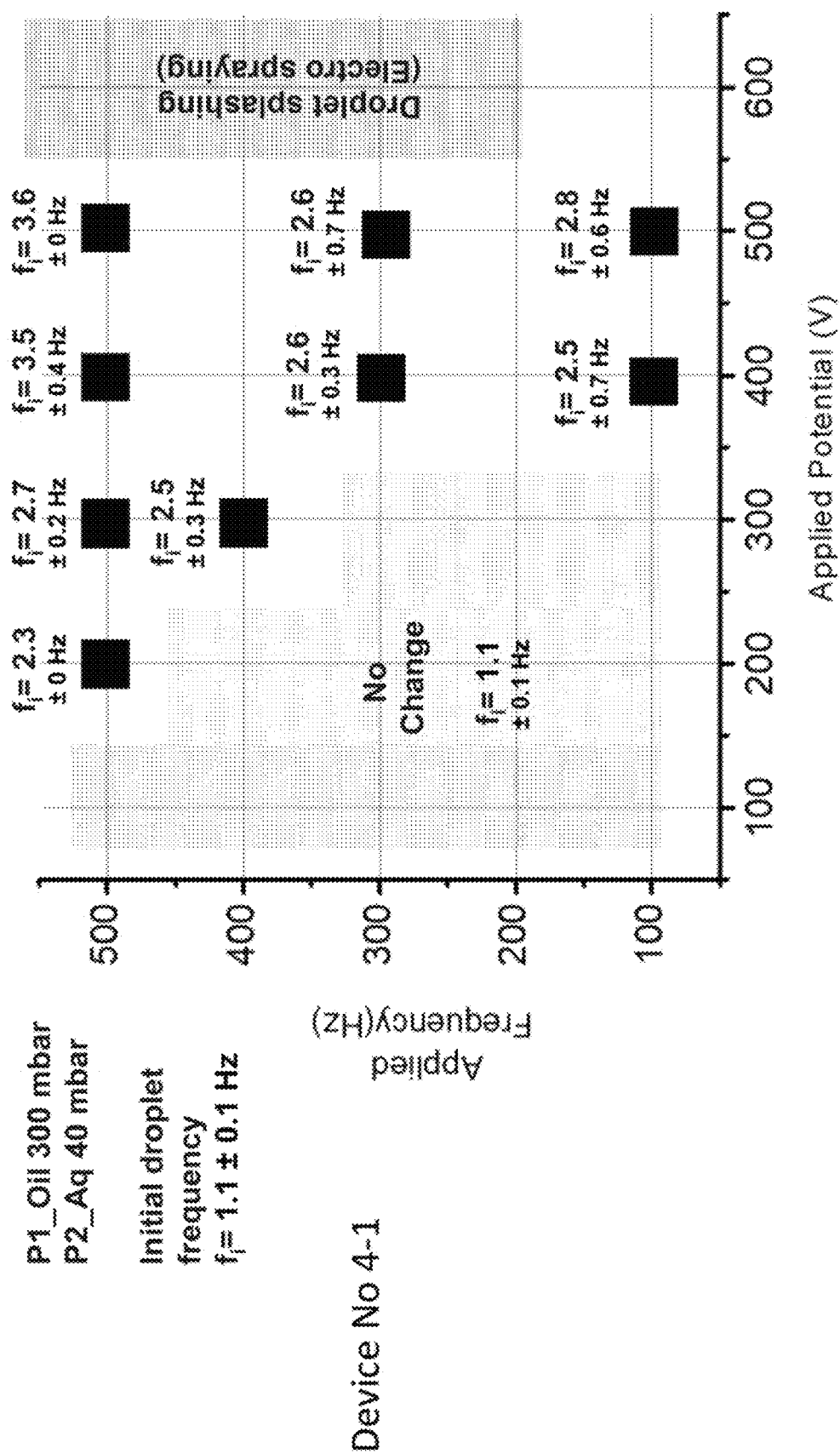
FIG. 26 represents the results of an experiment for tuning droplet frequencies, according to some embodiments.

FIG. 26 represents the results of an experiment for tuning droplet frequencies.

Figure 27:
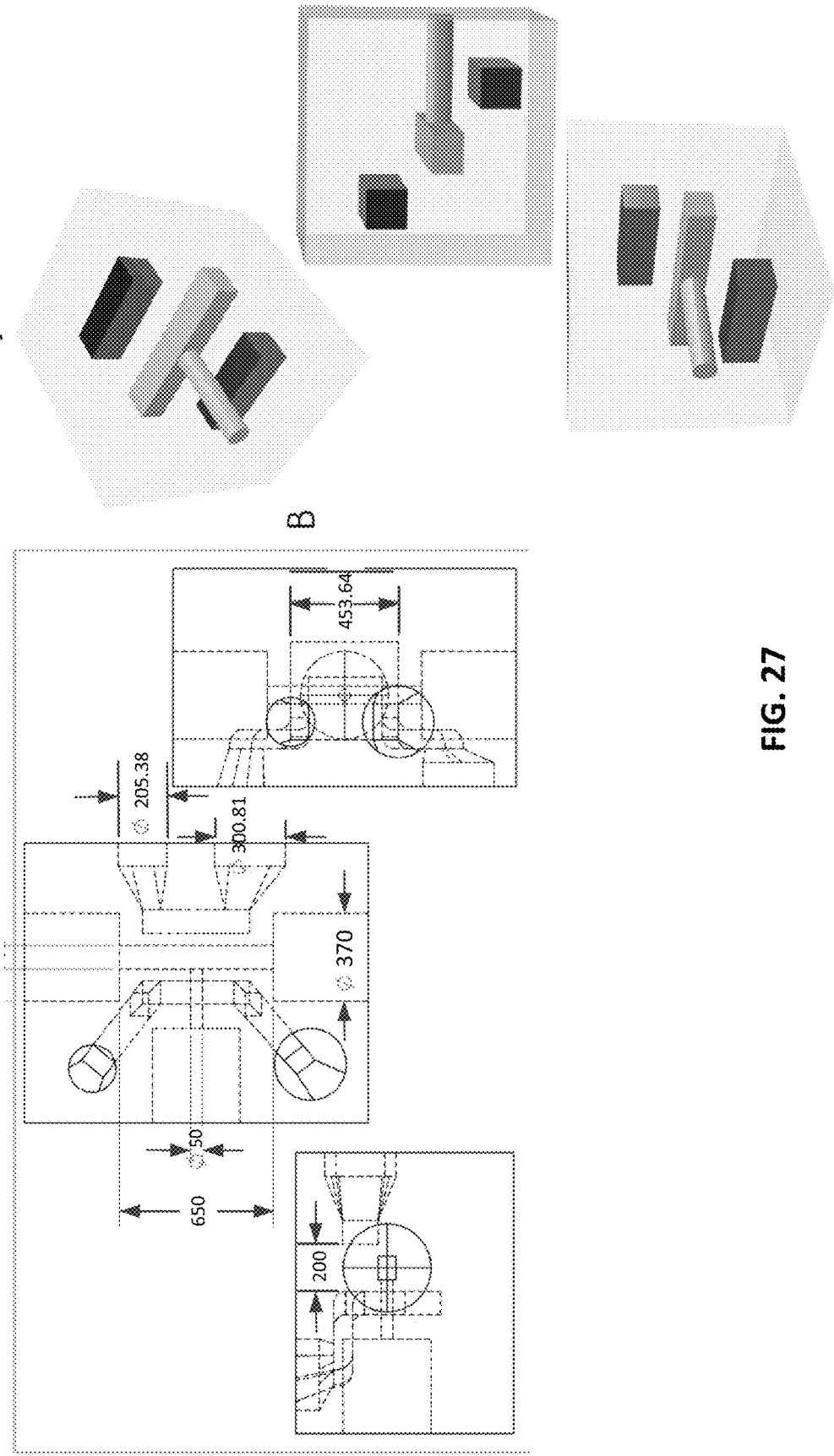
FIG. 27 represents the results of an experiment for a designed 3-D printed droplet generation device with Ga metal electrodes, according to some embodiments.

FIG. 27 represents the results of an experiment for a designed 3-D printed droplet generation device with Ga metal electrodes.

Figure 28:
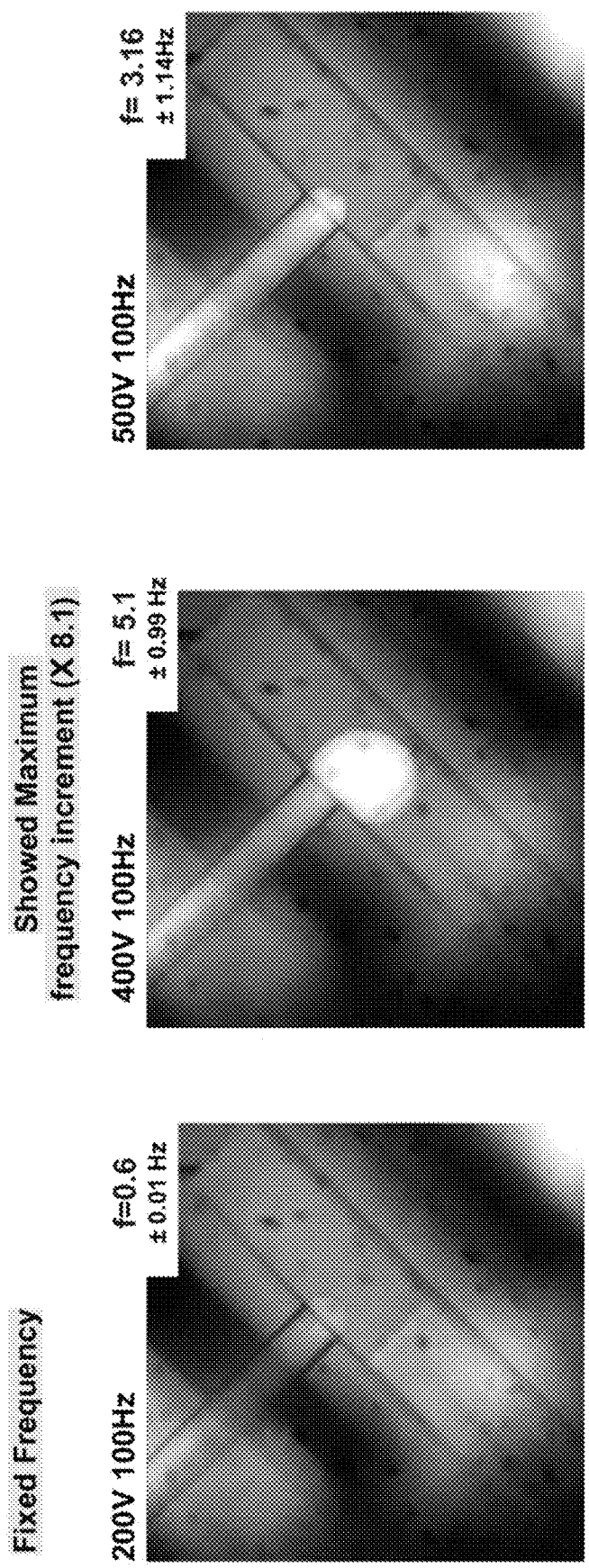
FIG. 28 illustrates images from experimental results for the droplet generation device design of FIG. 27, according to some embodiments.

FIG. 28 represents illustrates images from experimental results for the droplet generation device design of FIG. 27, according to some embodiments.

Figure 29:
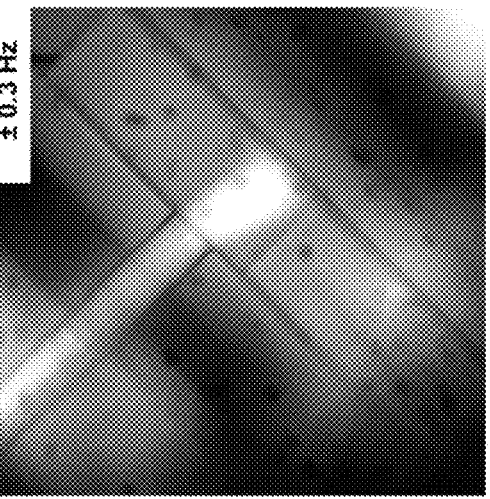
FIG. 29 illustrates images from experimental results for the droplet generation device design of FIG. 27, according to some embodiments.

FIG. 29 illustrates images from experimental results for the droplet generation device design of FIG. 27, according to some embodiments.

Figure 30:
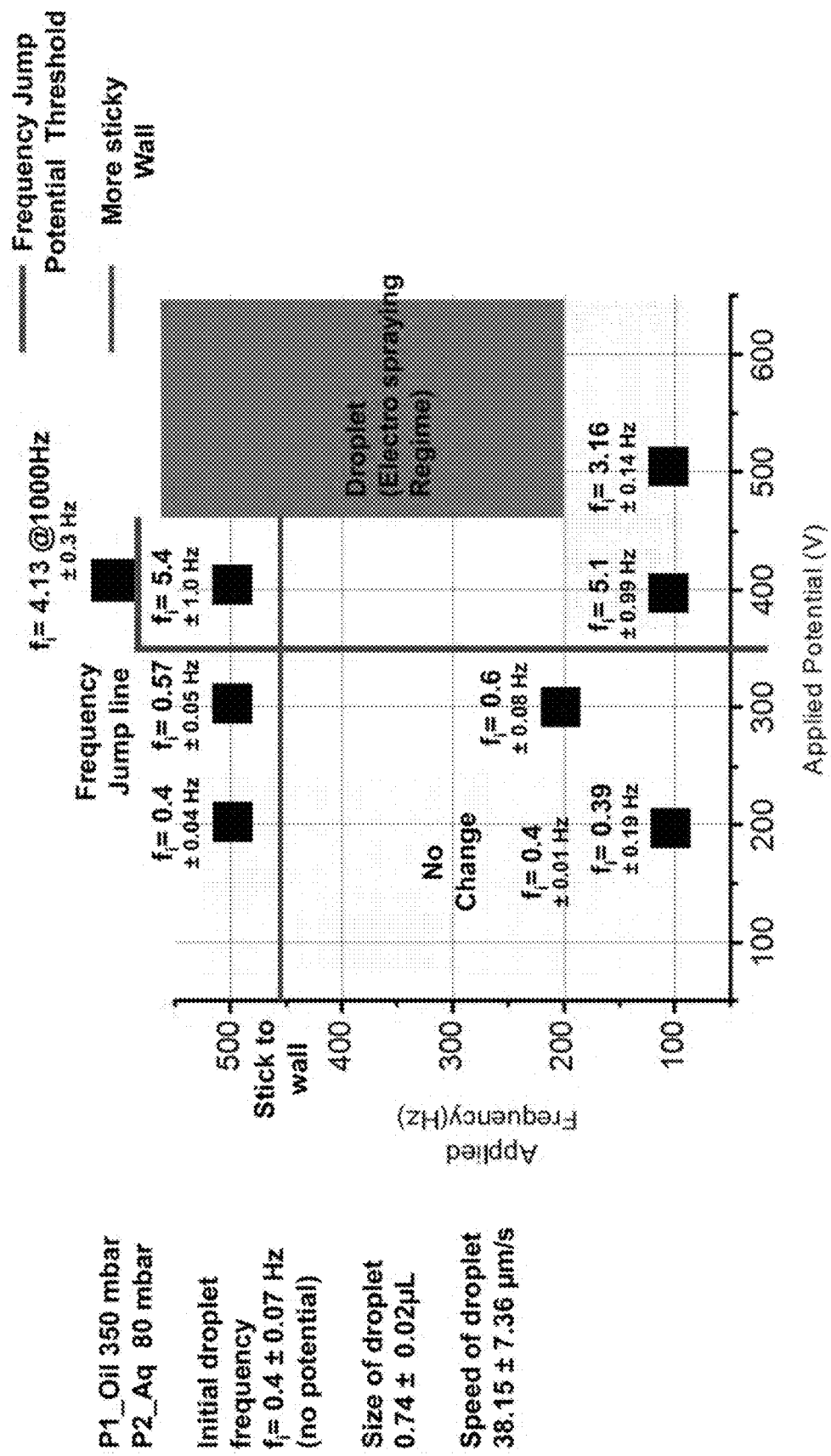
FIG. 30 represents a summary of experimental results for the droplet generation device design of FIG. 27, according to some embodiments.

FIG. 30 represents a summary of experimental results for the droplet generation device design of FIG. 27.

Figure 31:
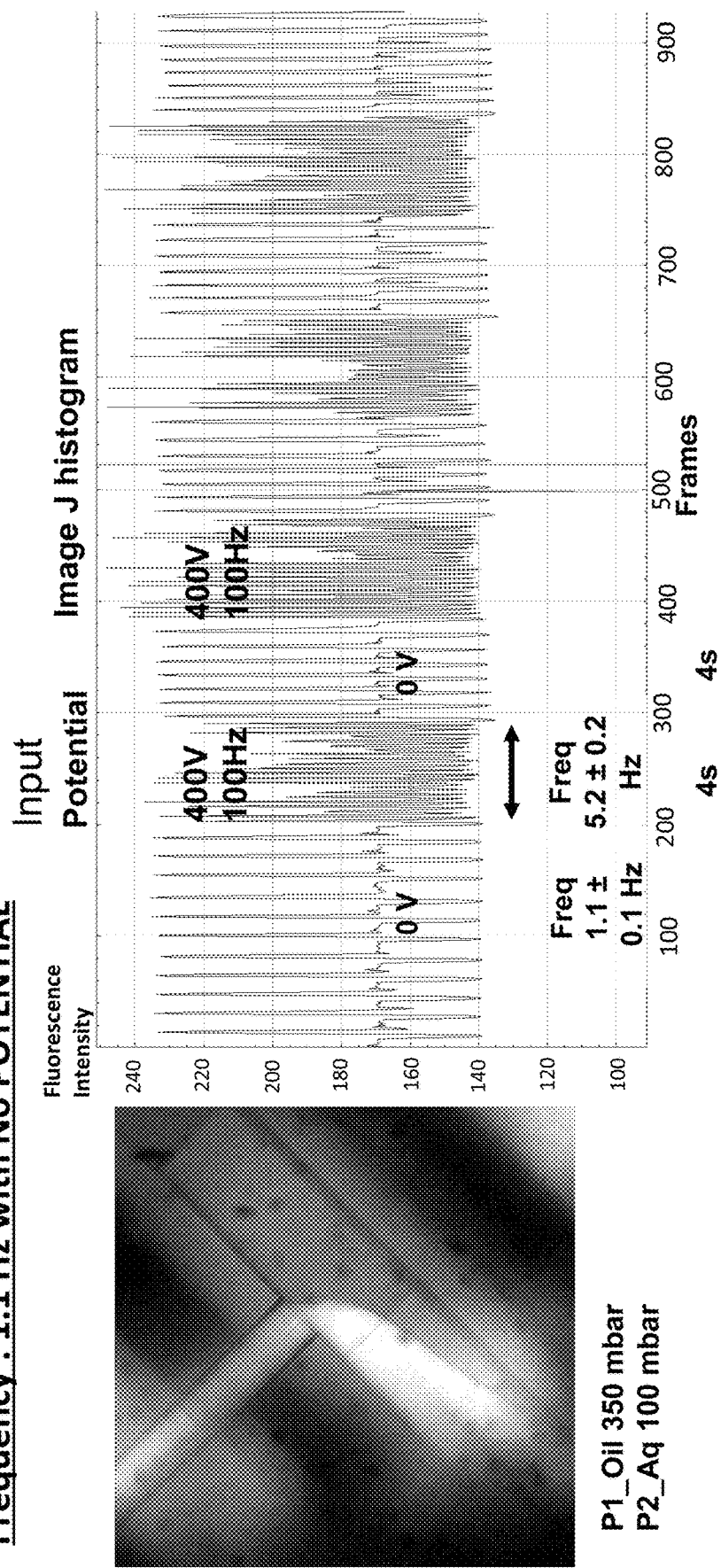
FIG. 31 illustrates an image from experimental results and a profile for applied potential for experiments using the droplet generation device design of FIG. 27, according to some embodiments.

FIG. 31 illustrates an image from experimental results and a profile for applied potential for experiments using the droplet generation device design of FIG. 27, according to some embodiments.

A system and method is provided for a metal electrode based 3D printed device for tuning droplet generation frequency. On demand droplet generation by electric triggering produces droplets that are generated based on electric trigger signals. Droplet phase may be shifted based on electric triggering where phase shifting of droplets generation frequency is tuned by electric trigger signals. Application of the system in European Free X-ray Electron Laser (EuXFEL) includes droplets containing KDO8 crystals tested for the phase shifting by an electric triggering method in EuXFEL.

Figure 32:
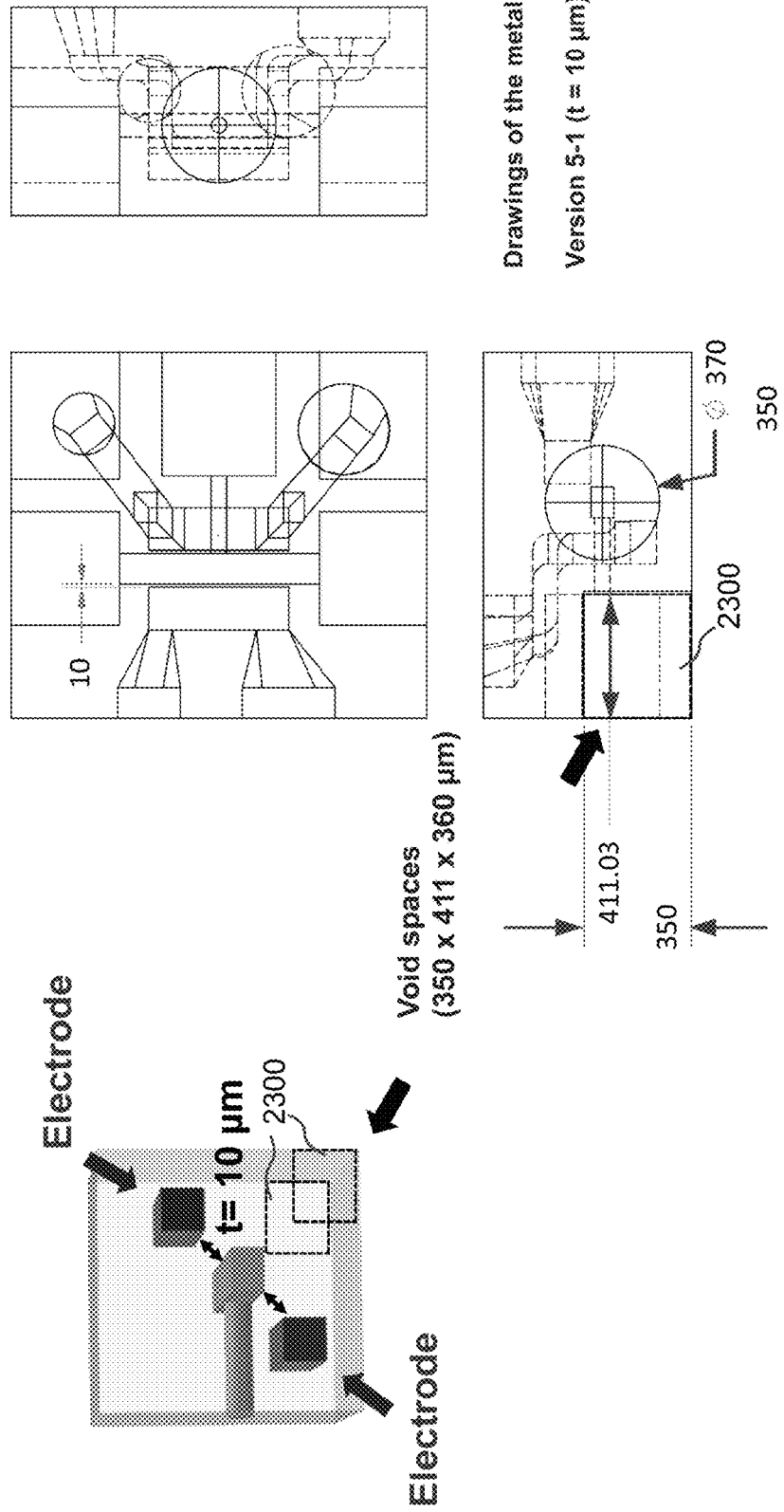
FIG. 32 illustrates metal electrode systems for on-demand droplet generation by electric triggering, according to some embodiments.

FIG. 32 illustrates metal electrode systems for on-demand droplet generation by electric triggering, according to some embodiments. A metal electrodes device version (5-1) includes a distance of t=10 μm, where t is the distance between the electrode and fluidic channel. Version (5-1) has added void spaces 2300 that reduce printing time at the corner of the device (green areas). 3D printing time is reduced from 12 hours per device to 8 hours per device. The distance t (red arrows) is reduced from 50 μm to 10 μm to reduce the applied voltage. The trigger threshold voltage is decreased from 1000 V to 600 V.

Figure 33:
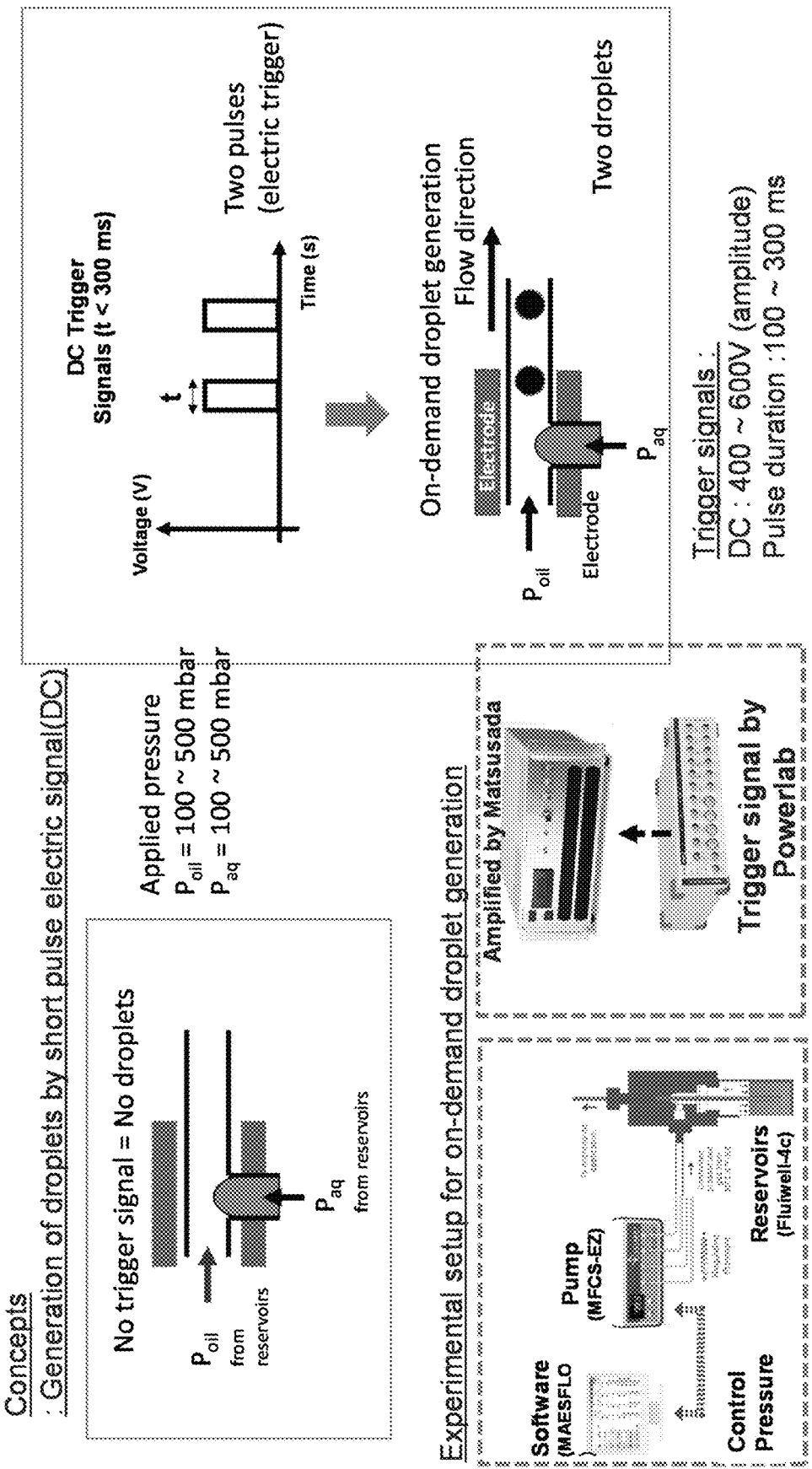
FIG. 33 illustrates methods and systems for on-demand droplet generation by electric triggering, according to some embodiments.

FIG. 33 illustrates methods and systems for on-demand droplet generation by electric triggering, according to some embodiments. In some embodiments, aqueous liquid droplets from an aqueous reservoir are generated or pumped into an oil liquid from an oil reservoir by short pulse electric DC signals.

FIG. 34 illustrates four short pulse trigger signals for on-demand droplet generation by electric triggering, according to some embodiments. Referring to FIG. 34, four short pulses are utilized to trigger the generation of four droplets. For example, a trigger pulse width of less than 300 ms may be utilized.

Figure 35:
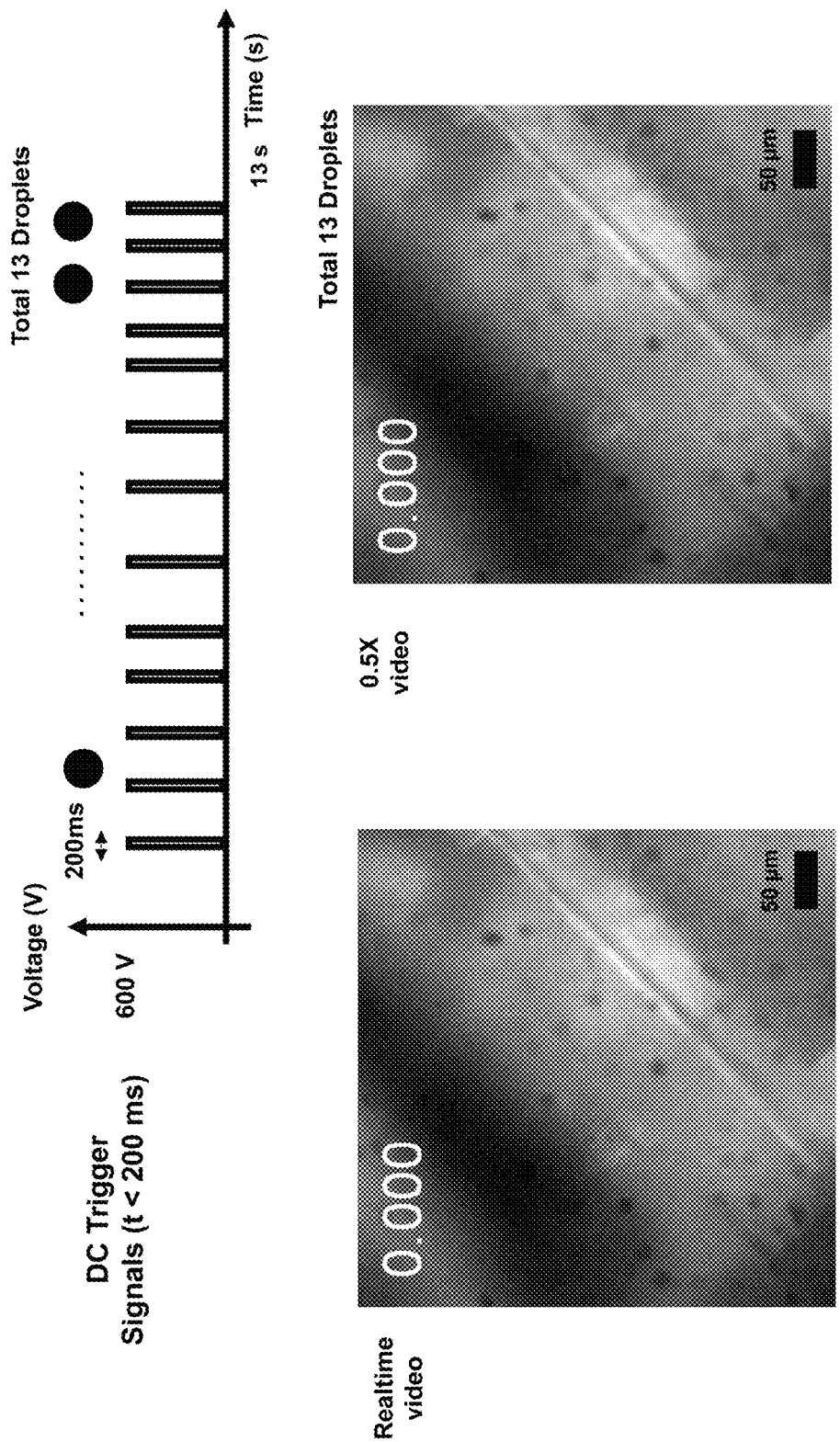
FIG. 35 illustrates thirteen short pulse trigger signals for on-demand droplet generation by electric triggering, according to some embodiments.

FIG. 35 illustrates thirteen short pulse trigger signals for on-demand droplet generation by electric triggering, according to some embodiments. Referring to FIG. 35, thirteen short pulses are utilized to trigger the generation of thirteen droplets. For example, a trigger pulse width of less than 200 ms may be utilized.

Figure 36:
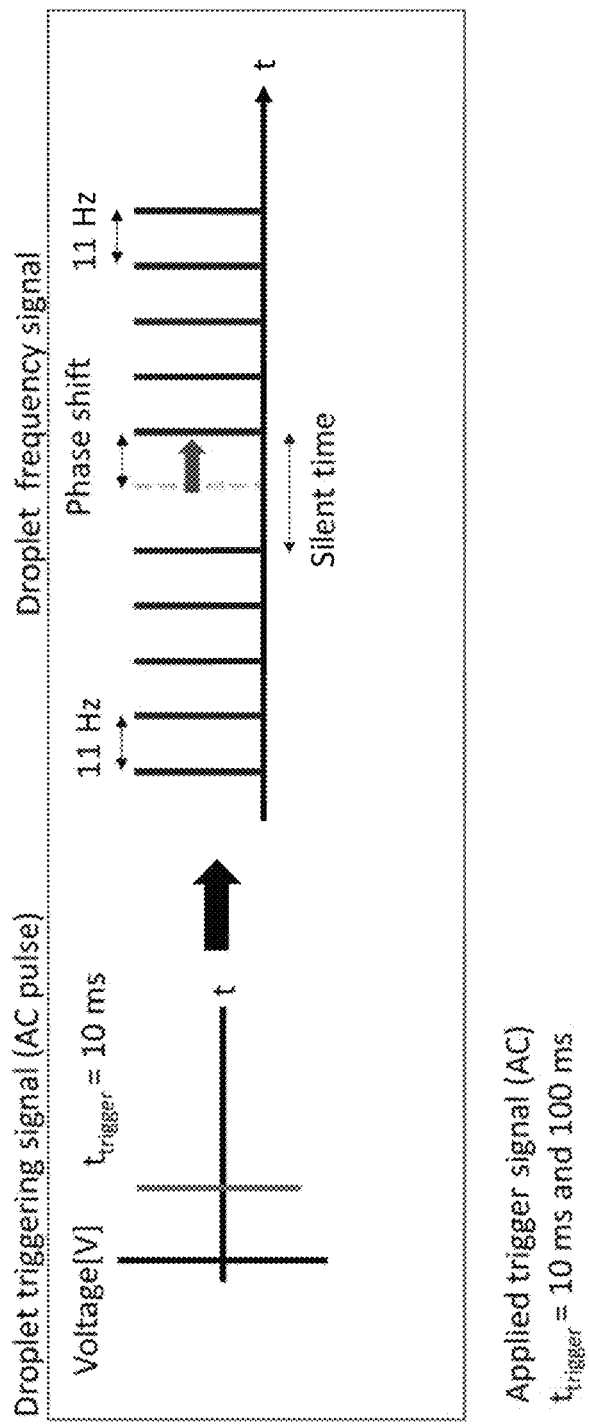
FIG. 36 illustrates droplet phase shift by electric triggering, according to some embodiments.

FIG. 36 illustrates on-demand droplet generation by electric triggering, according to some embodiments. Referring to FIG. 36, a relatively very short pulse is utilized to induce a phase shift of the droplet frequency where the phase shift trigger signal may be an AC electric signal. For example, a droplet triggering signal AC pulse of 10 ms or 100 ms may be applied where a droplet frequency signal is generated at 11 Hz.

Figure 37:
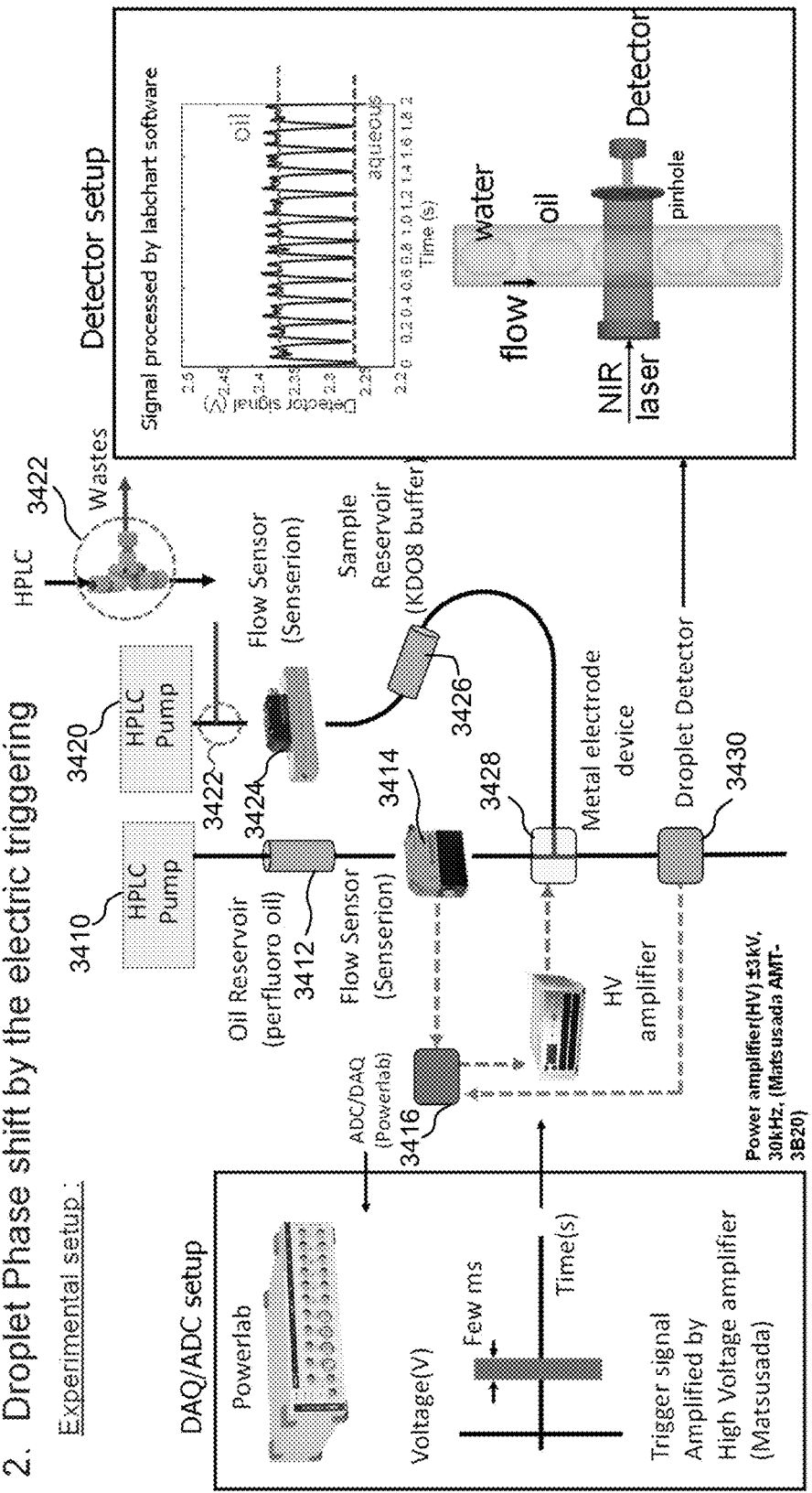

FIGS. 37 and 38 illustrate a system and method for droplet phase shifting by electric triggering, according to some embodiments. Referring to FIGS. 37 and 38, droplets are generated in a metal electrode device 3428 including a T junction that receives oil liquid via an oil line from an oil reservoir 3412 connected to a first HPLC pump 3410 and liquid received via an aqueous line from a sample reservoir 3426 that is connected to a second HPLC pump 3420. The liquid from the oil reservoir 3412 passes through a flow sensing system 3414 prior to reaching a first inlet of the metal electrode device 3428. A second flow sensor 3424 is placed between the second HPLC pump 3420 and the sample reservoir 3426. Flow sensor data is read by a data acquisition system (DAQ) 3416 and trigger signals are generated by a digital to analog converter (DAC) 3416, amplified, and sent to the metal electrode droplet generator 3428. Droplets output from the metal electrode device 3428 are detected in a droplet detector 3430.

T-split connectors 3422 are used for both of the aqueous (Aq) line and the oil line to reduce the fluctuation of flow rate originated from the HPLC pumps 3410 and 3420. Split ratio and hydraulic resistance can be calculated and tuned by the length and diameter of a capillary. Thus, droplets generation and generation frequency are consistent and stable.

In some embodiments, the DAQ 3416 and ADC 3416 may include a powerlab system and labchart software for measuring the flow rates from the flow rate sensors 3412 and 3424 and droplet signals from the droplet detector 3430. Both of flow rates and droplet signals can be detected easily.

The droplet detector 3430 is used for detecting droplet signals and the droplet generation frequency may be calculated using labchart software. Other calculations such as period of droplets, phase shift, and droplet width (volume) can also be calculated using labchart software.

Figure 39:
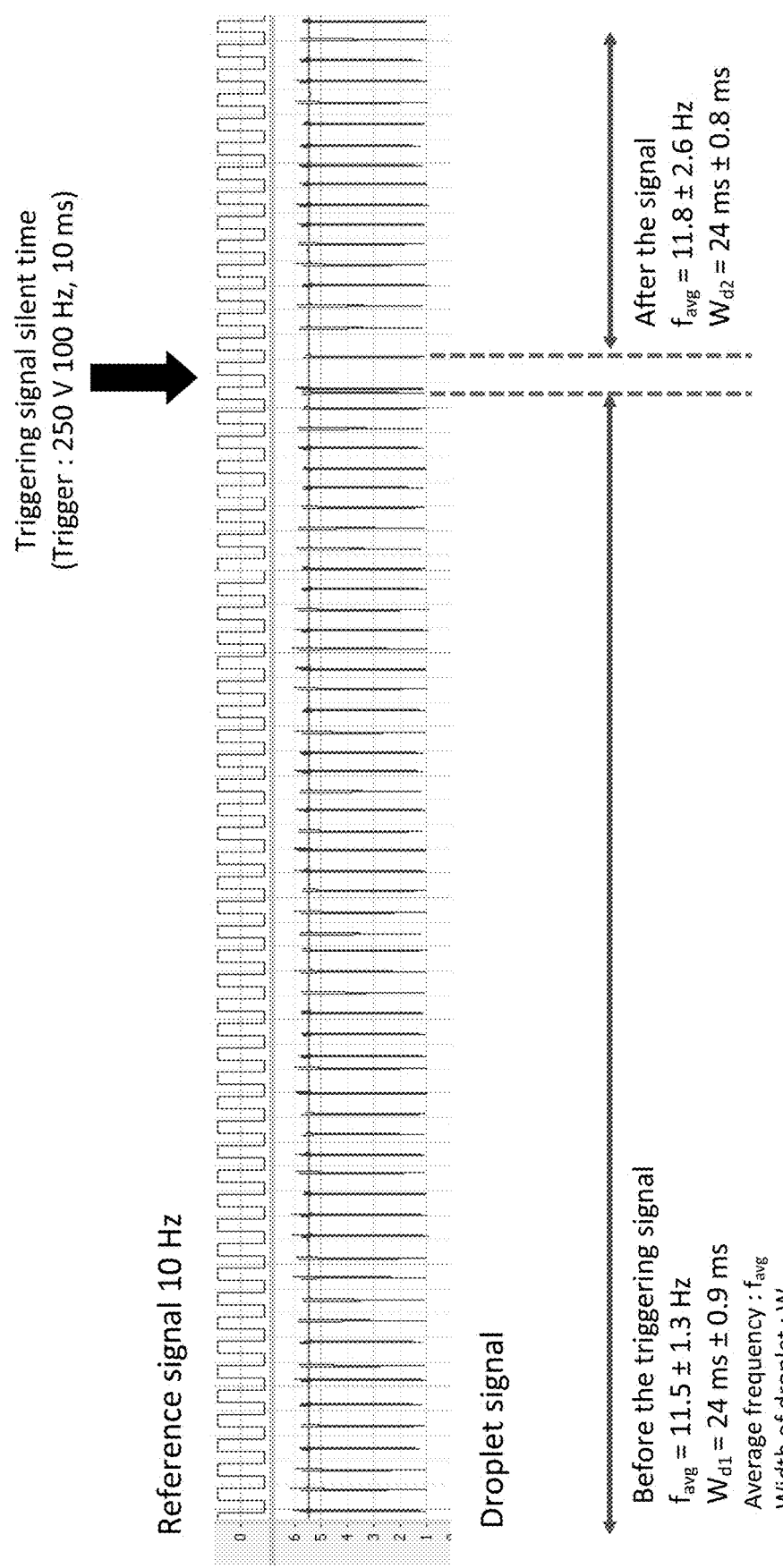
FIG. 39 illustrates droplet signal phase shift that is induced by an electric trigger, according to some embodiments.

FIG. 39 illustrates droplet signal phase shift that is induced by an electric trigger, according to some embodiments. An example short pulse trigger signal of 10 ms causes a phase shift in the droplet signal without changing the droplet width and frequency. The droplet width and frequency do not change (or are approximately the same) before and after the trigger signal.

Figure 40:
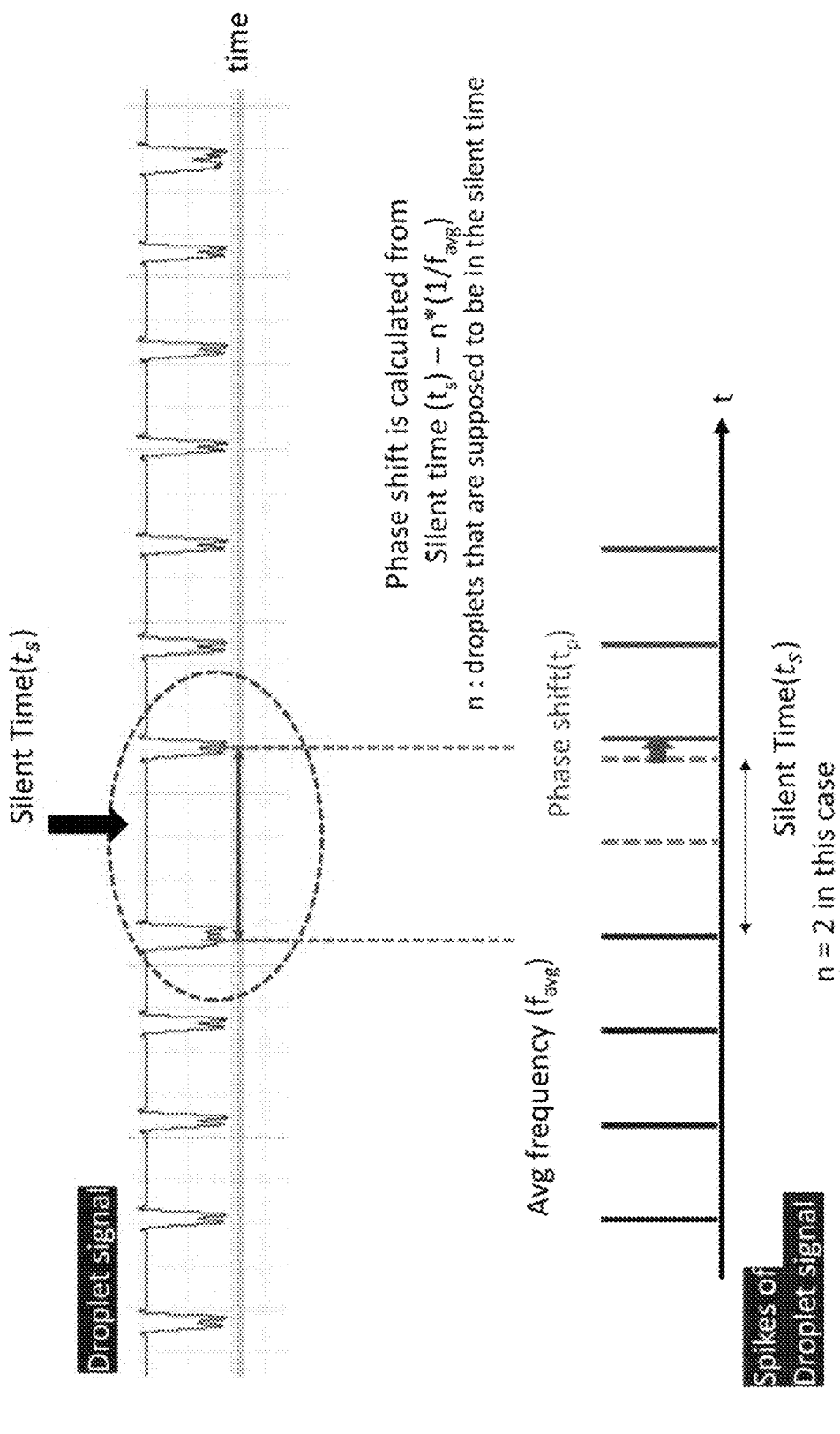
FIG. 40 illustrates droplet signal phase shift that is induced by an electric trigger, according to some embodiments.

FIG. 40 illustrates droplet signal phase shift that is induced by an electric trigger, according to some embodiments. A phase shift ($t_p$) may be calculated based on a silent time ($t_s$) in a droplet signal and the average frequency ($f_{avg}$) of the droplet signal as:

$$t_p = t_s - n*(1/f_{avg}) \quad (1)$$

where n is the number of droplets that should occur during the silent time $t_s$.

Figure 41:
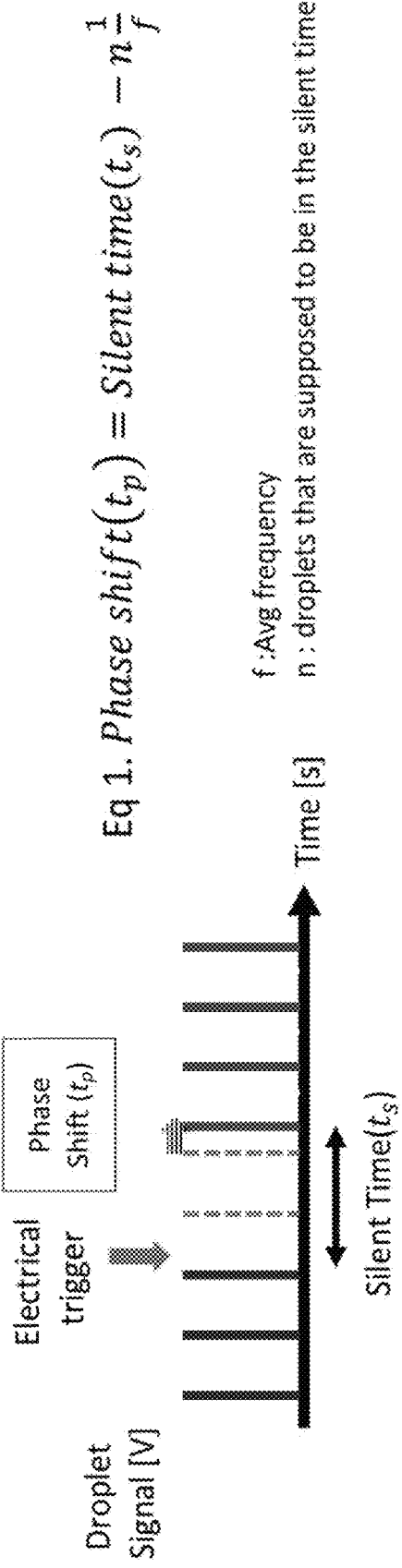
FIG. 41 illustrates results of droplet signal phase shifting induced by a manually started electric trigger with a 10 ms pulse width, according to some embodiments.
Figure 55:
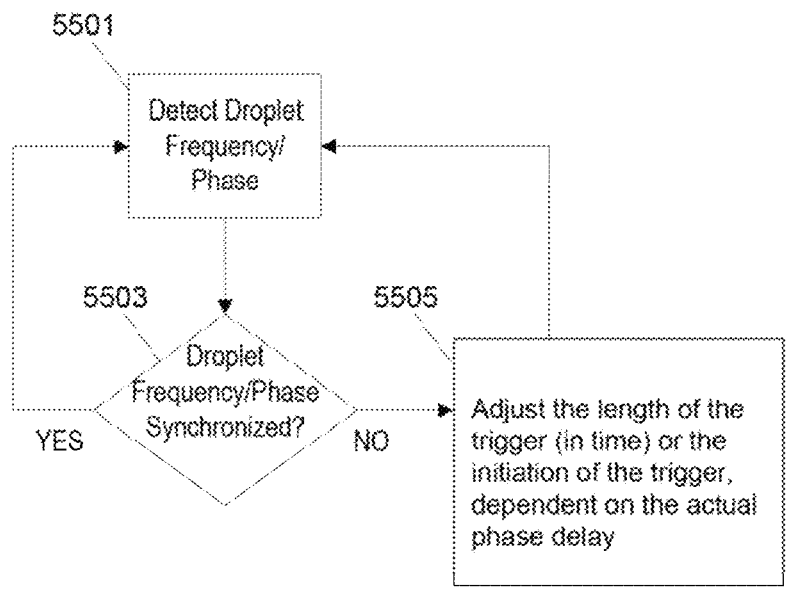
FIG. 55 illustrates a flow diagram for an electrical trigger where a length of the trigger (in time), the initiation of the trigger, an amplitude of an AC trigger signal, an amplitude of a DC trigger signal, and/or a frequency of an AC trigger signal is adjusted dependent on an actual phase delay.
Figure 56:
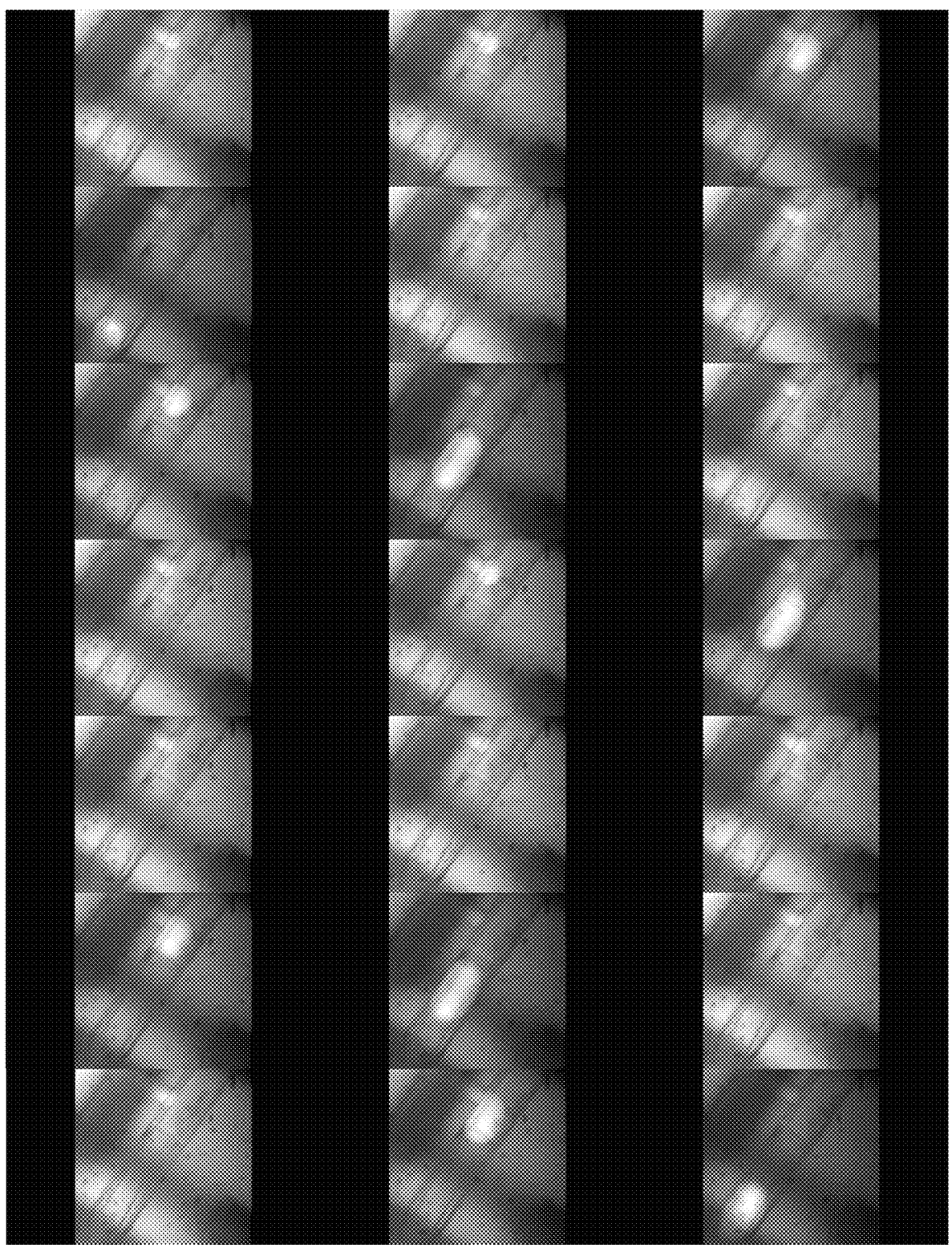
FIGS. 56-76 comprise a series of frames (every 10 frames) captured from a video showing an experiment in operation corresponding to the experimental results for droplet frequency tuning shown in FIG. 25 and the experiment device 4-1 shown in FIG. 13.
Figure 57:
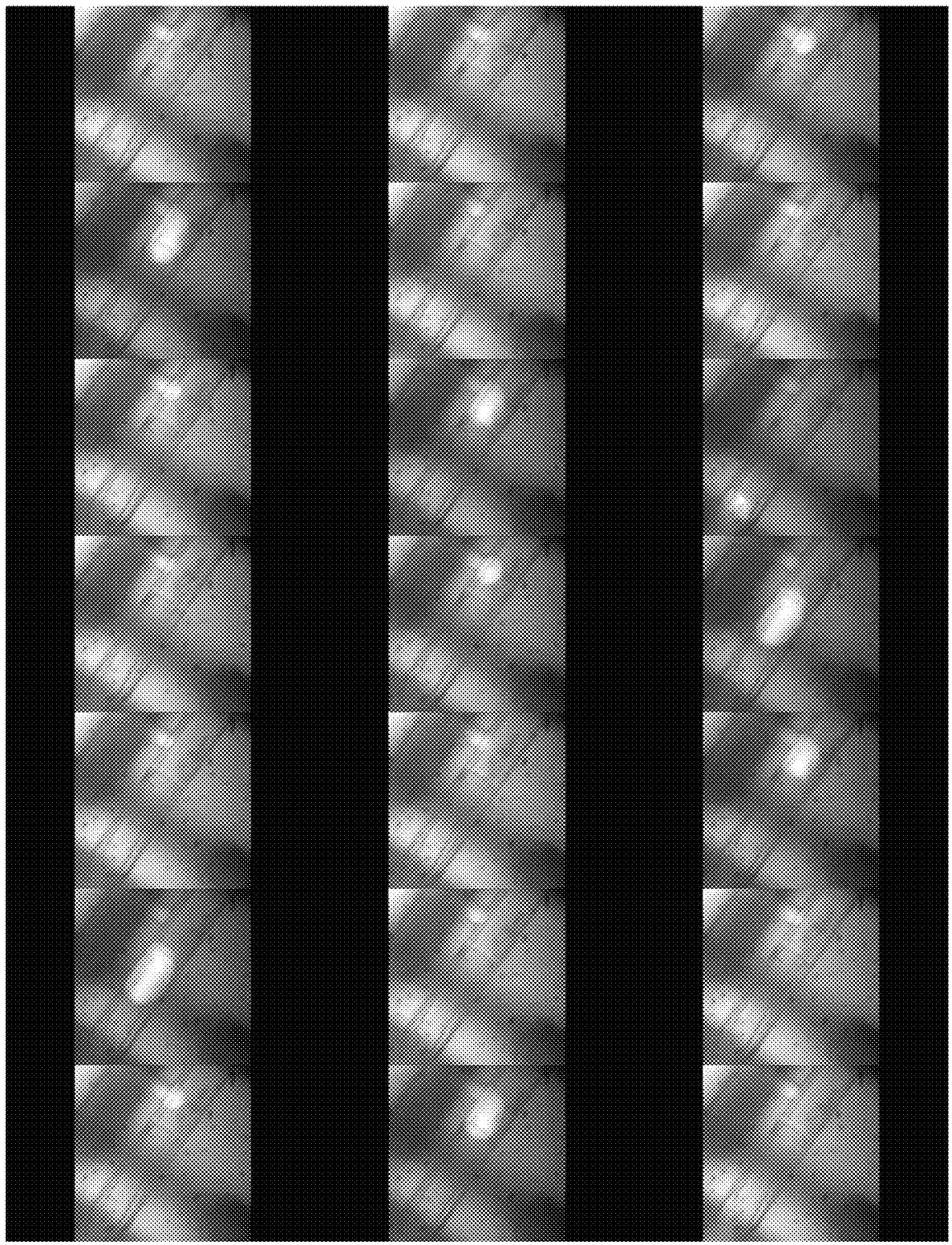
Figure 58:
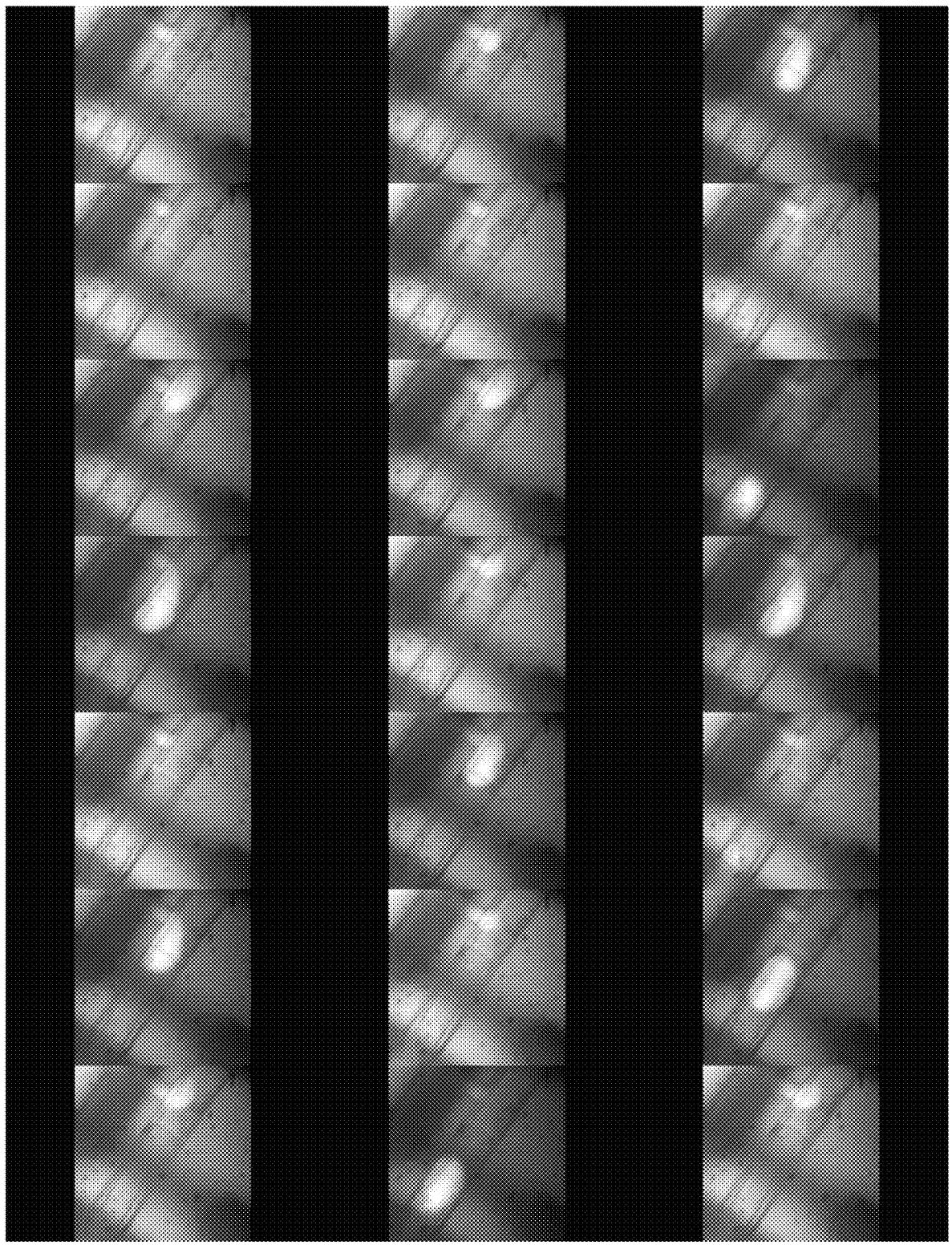
Figure 59:
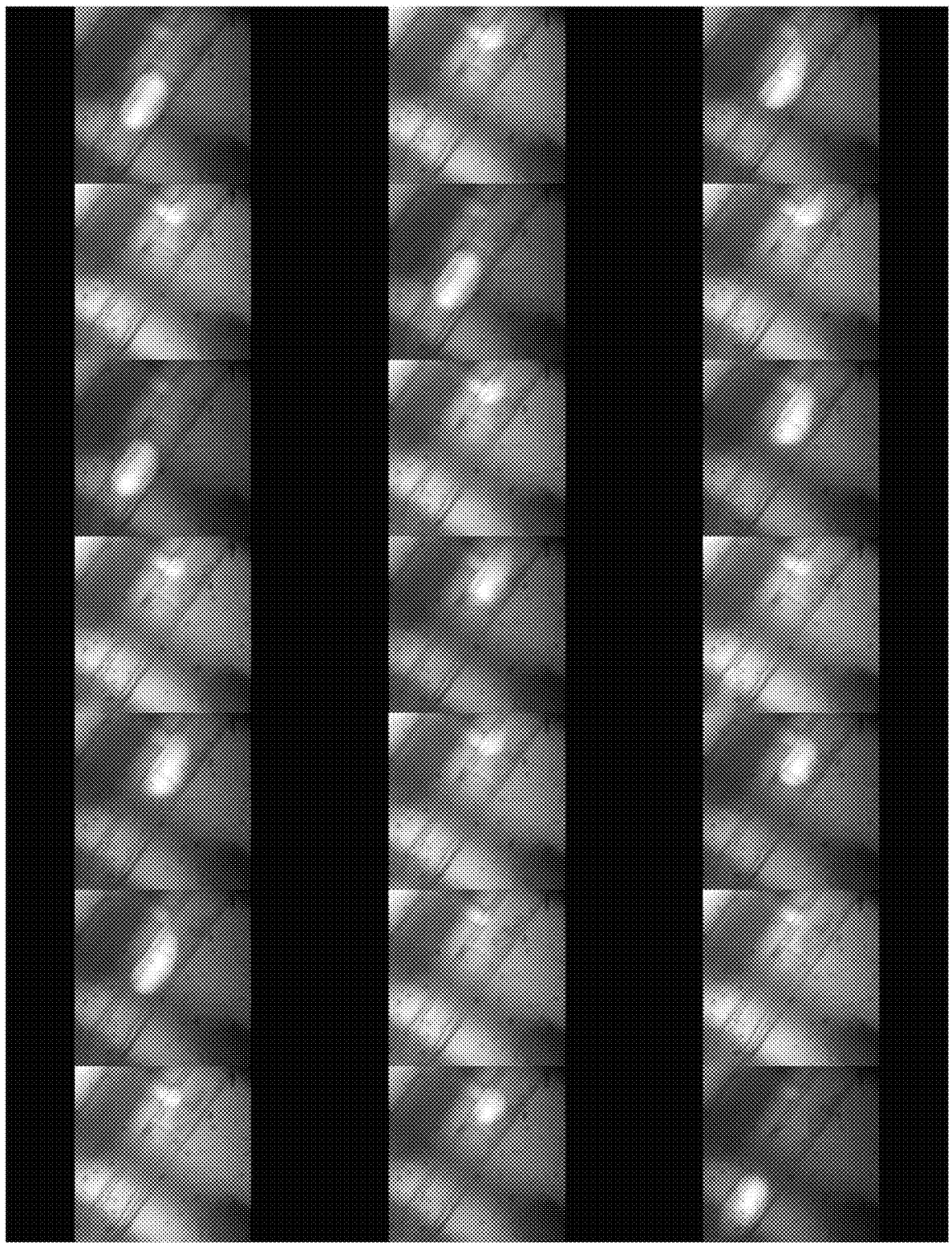
Figure 60:
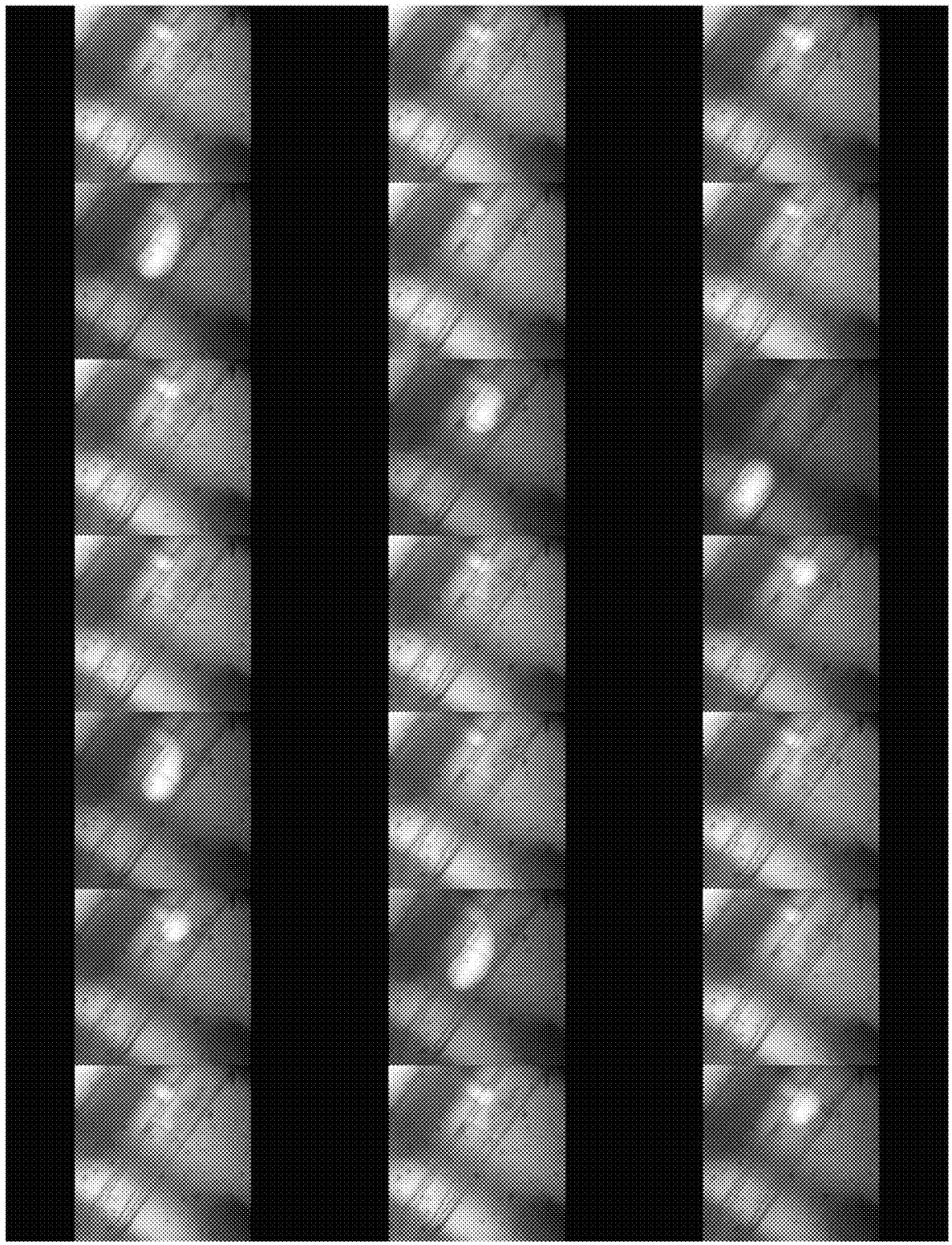
Figure 61:
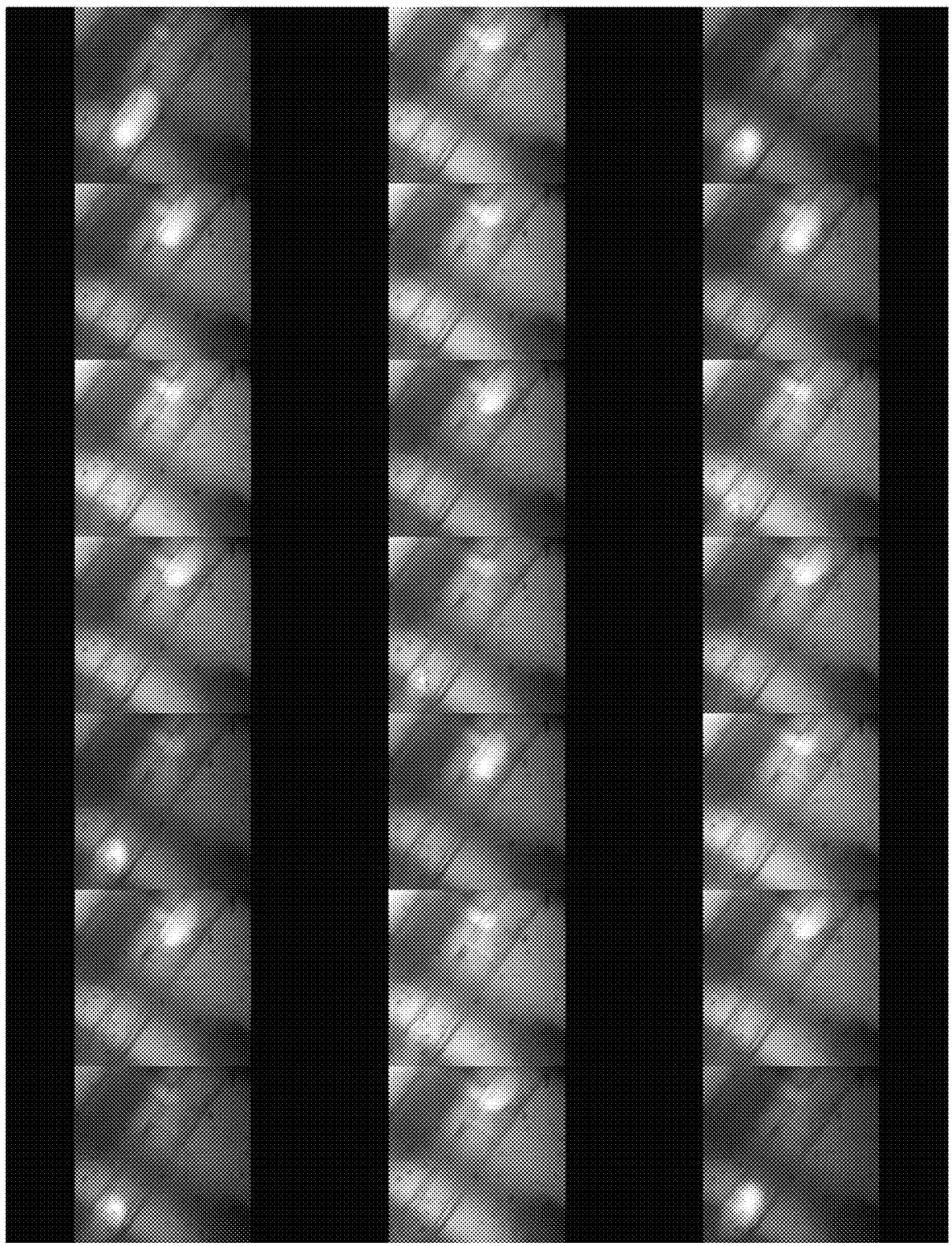
Figure 62:
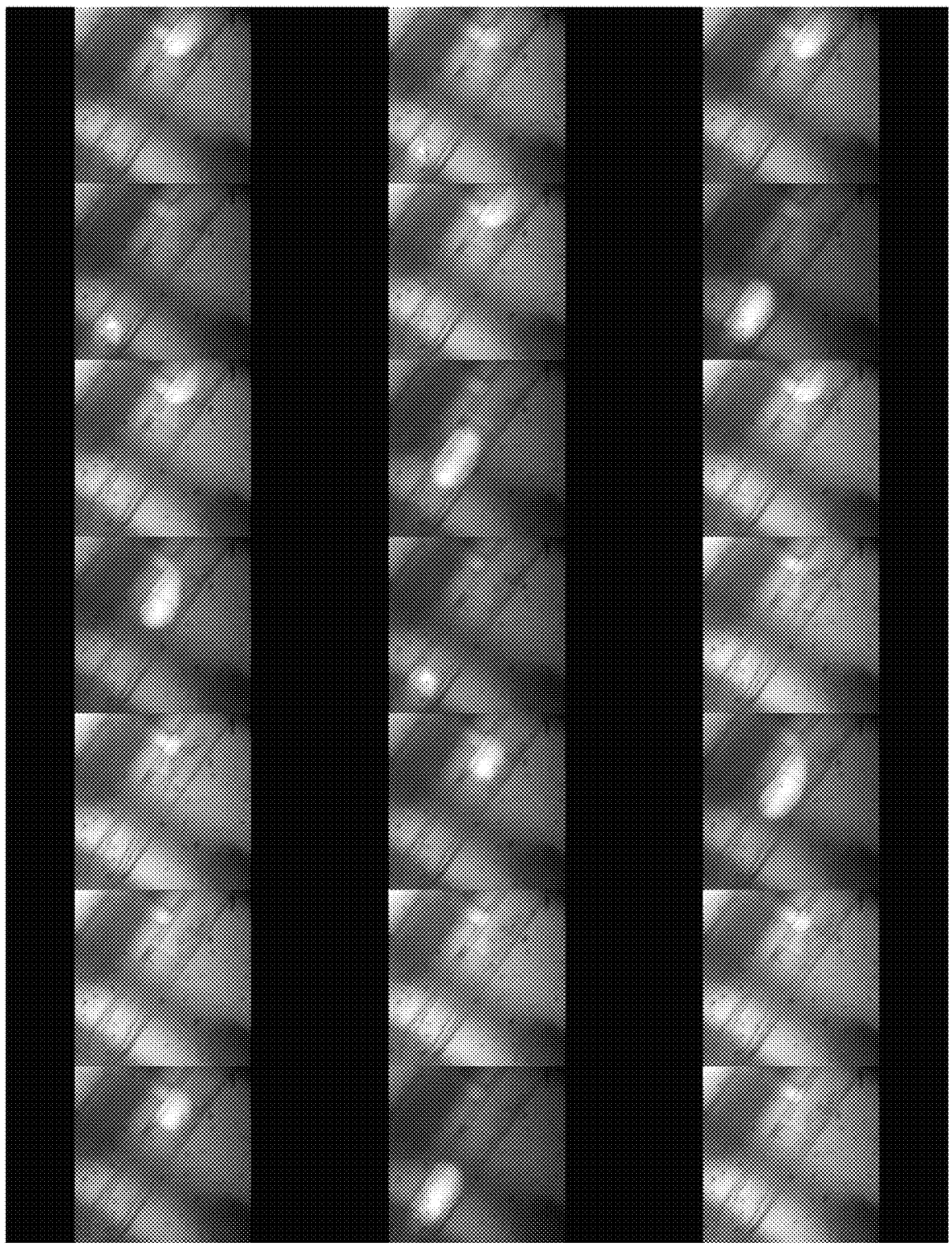
Figure 63:
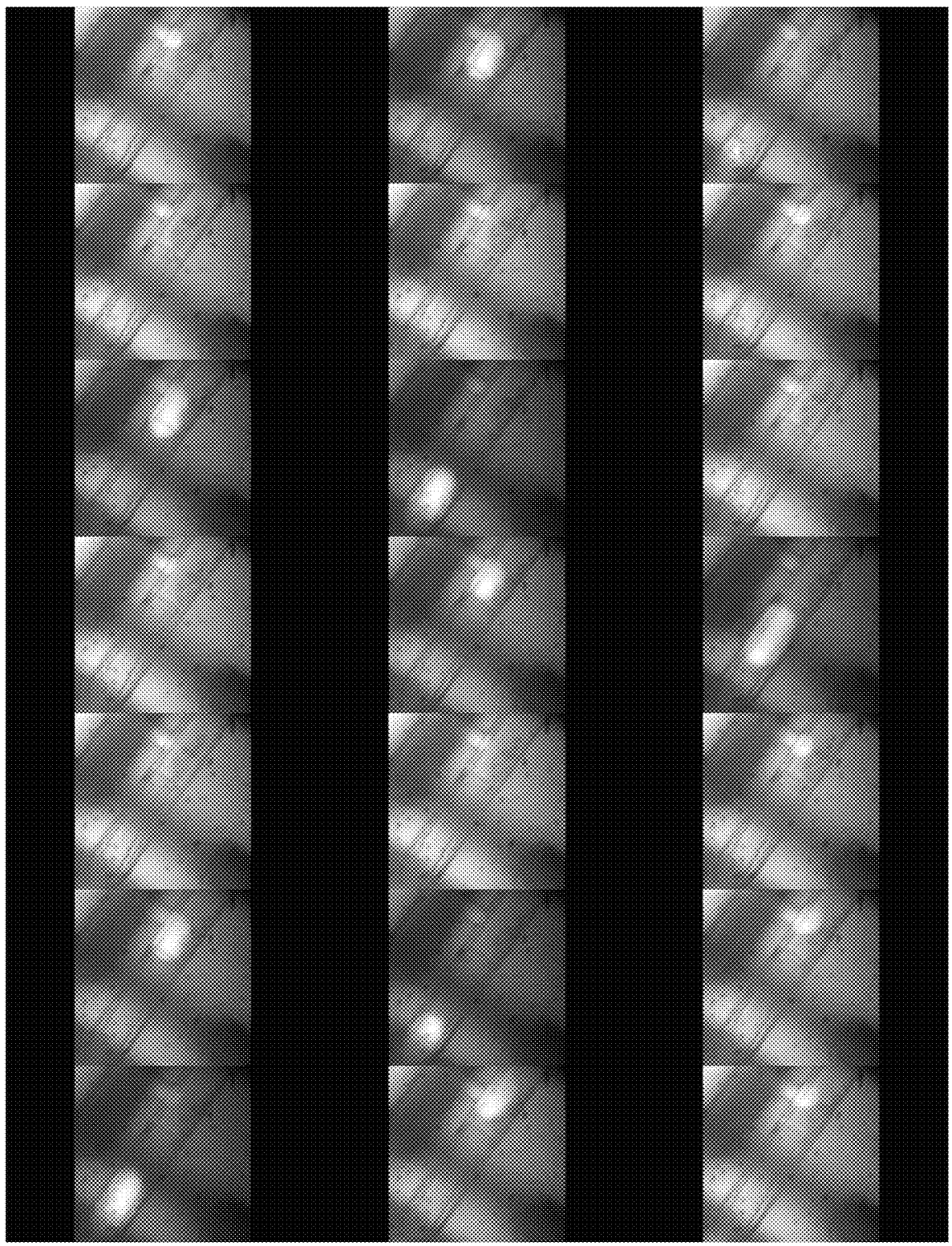
Figure 64:
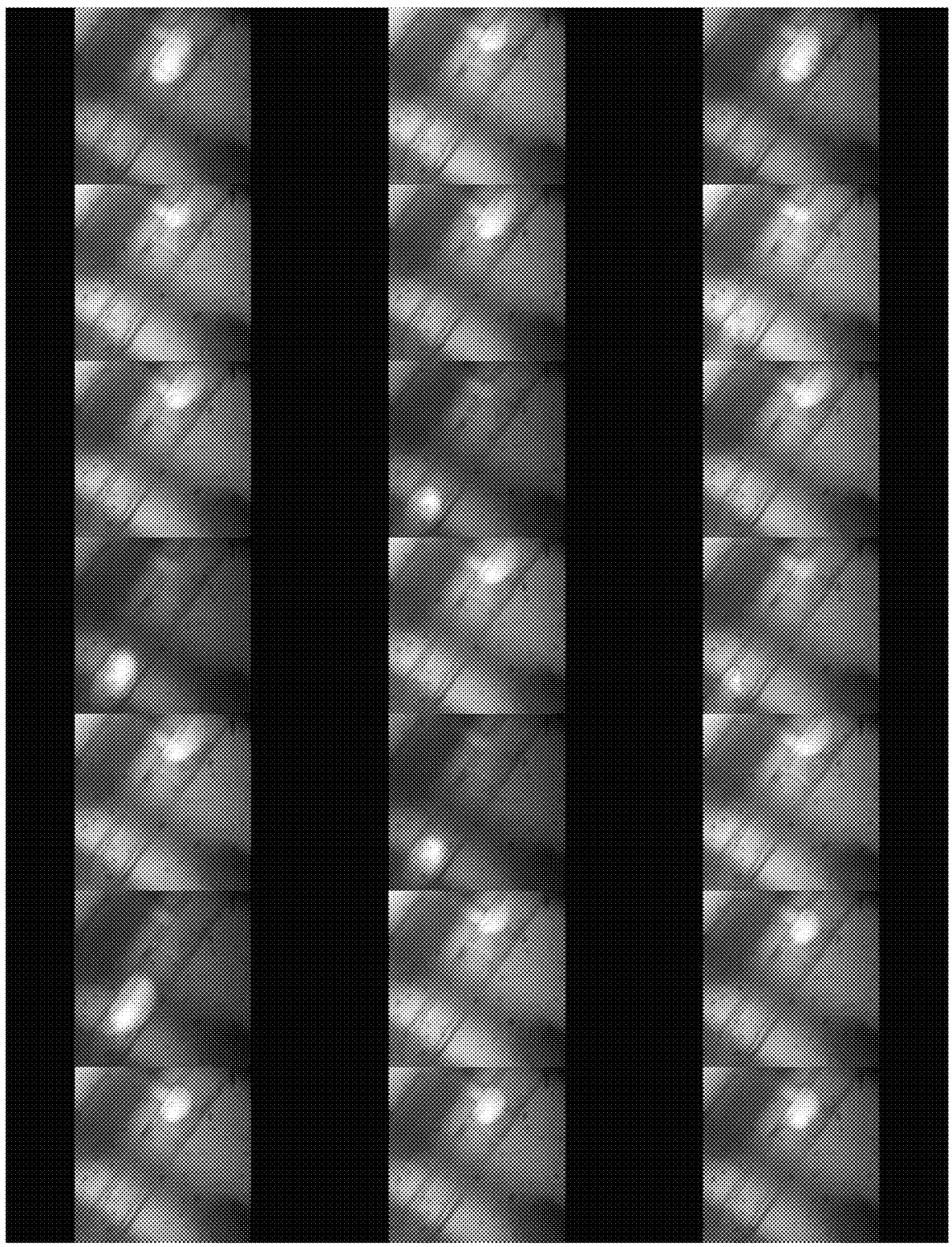
Figure 65:
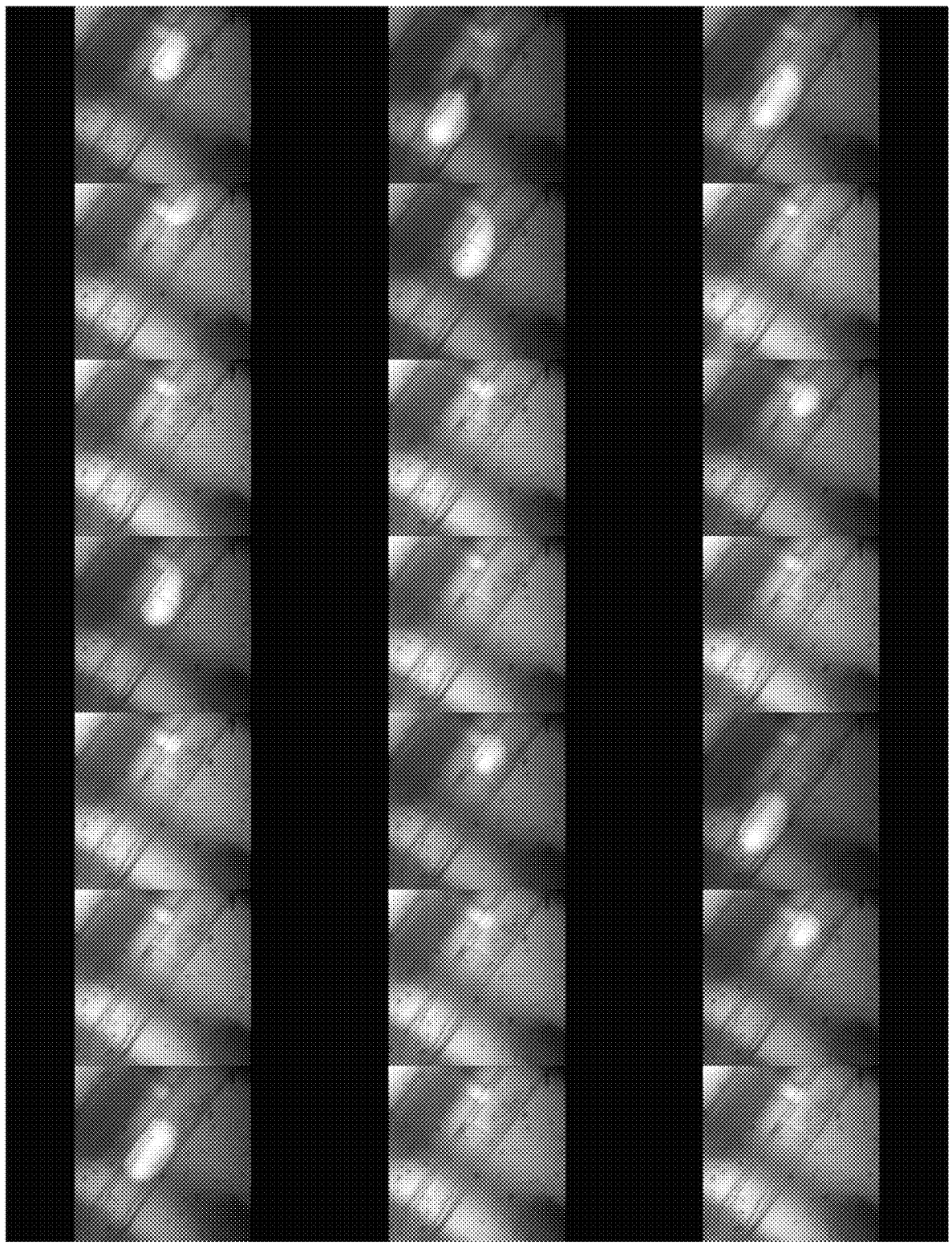
Figure 66:
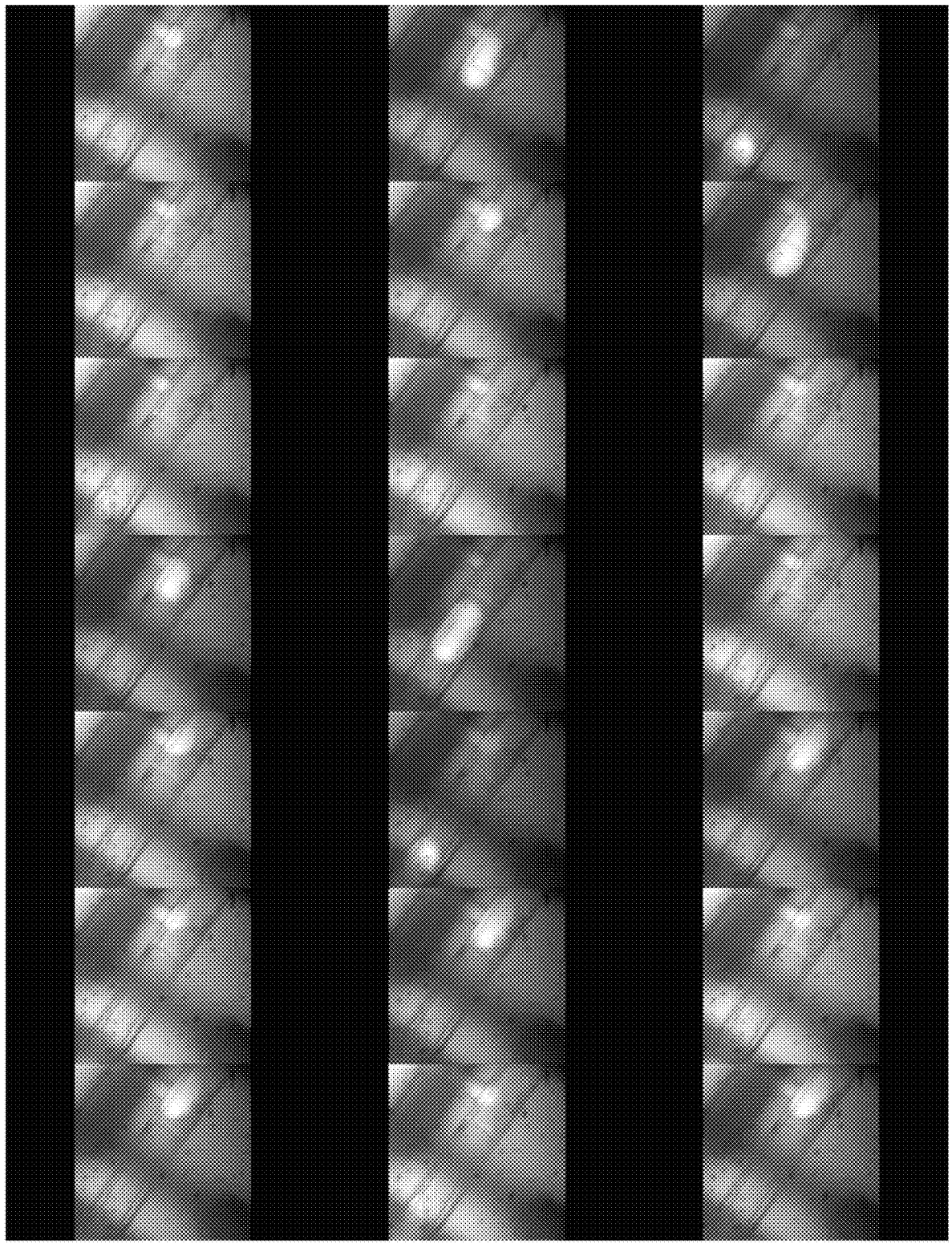
Figure 67:
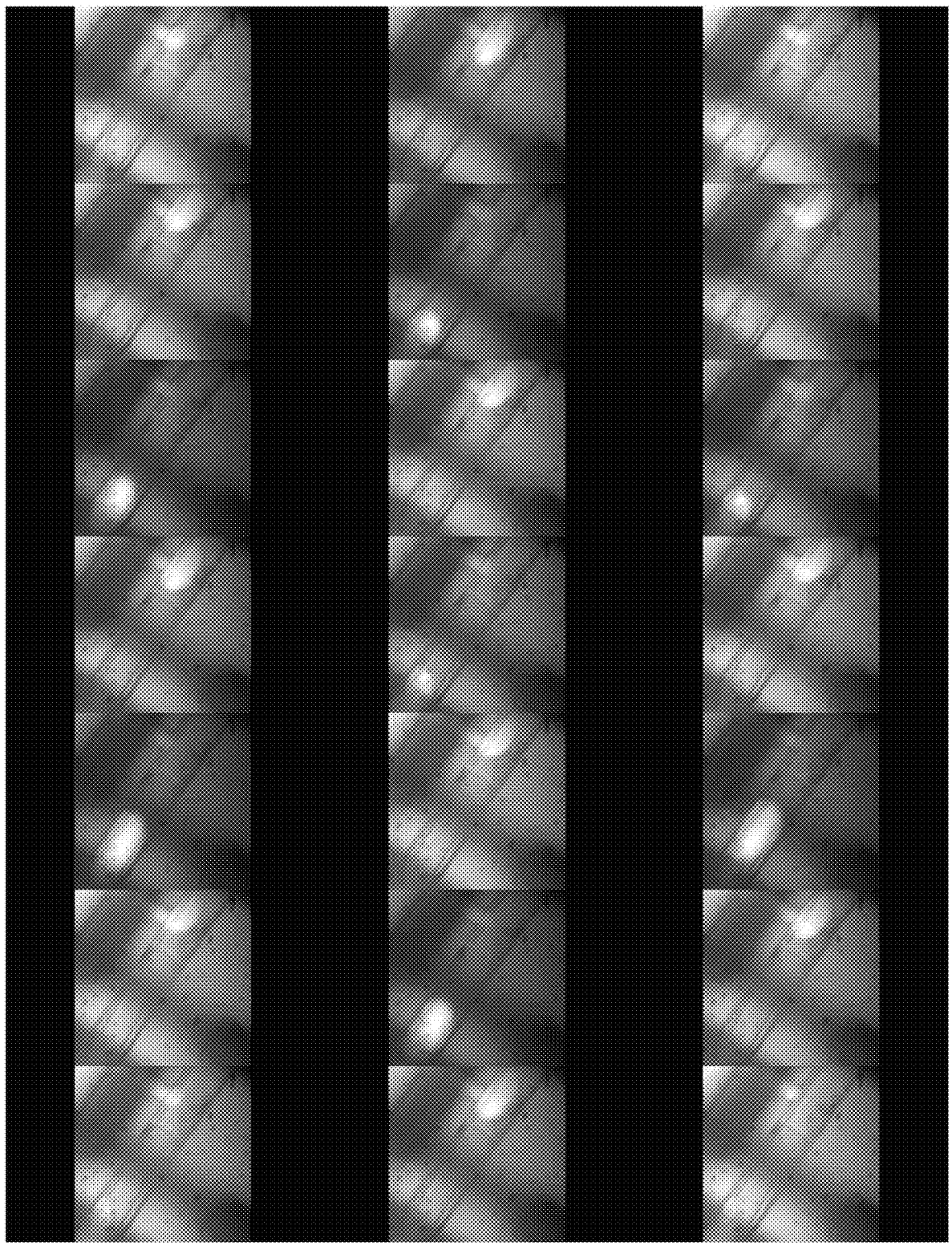
Figure 68:
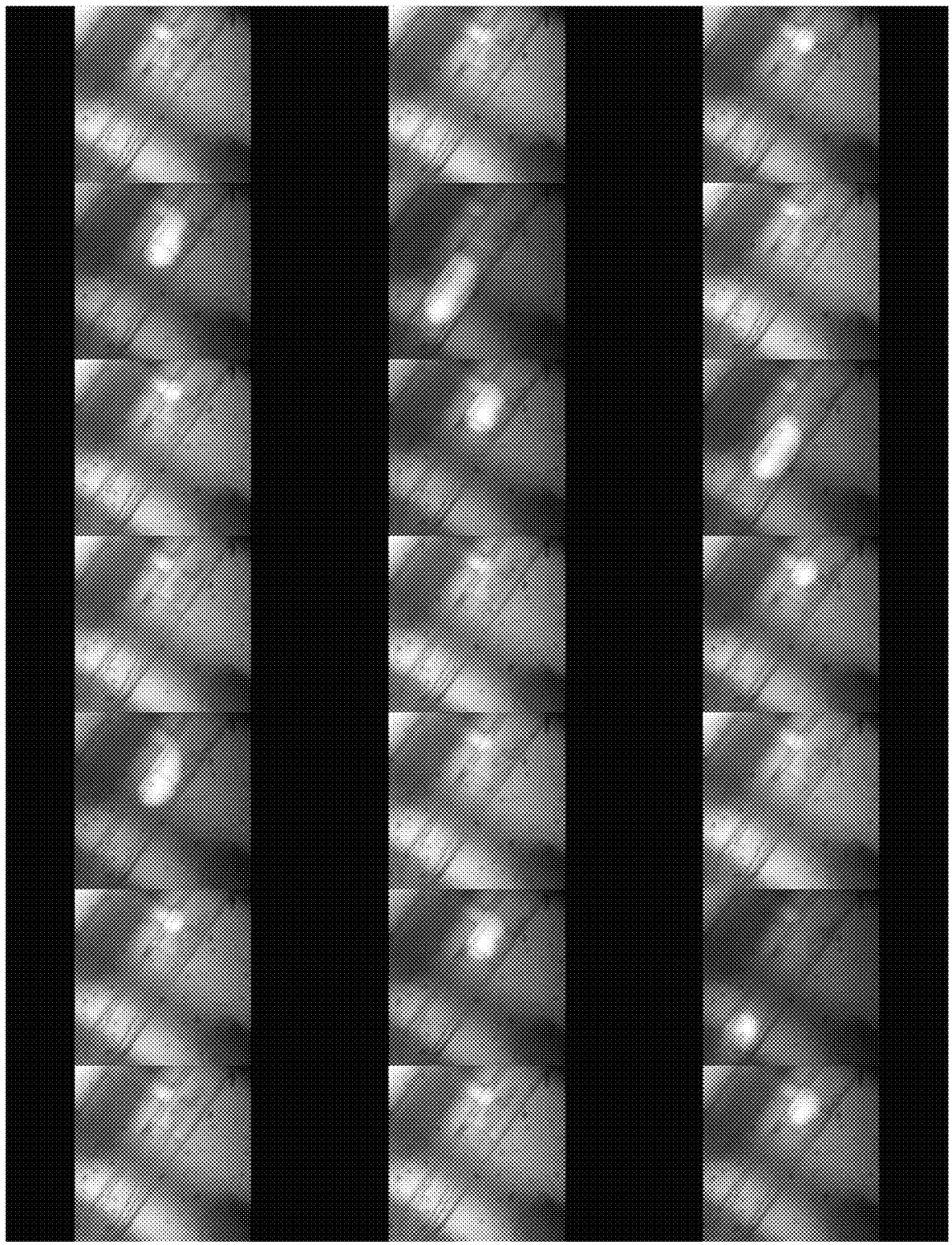
Figure 69:
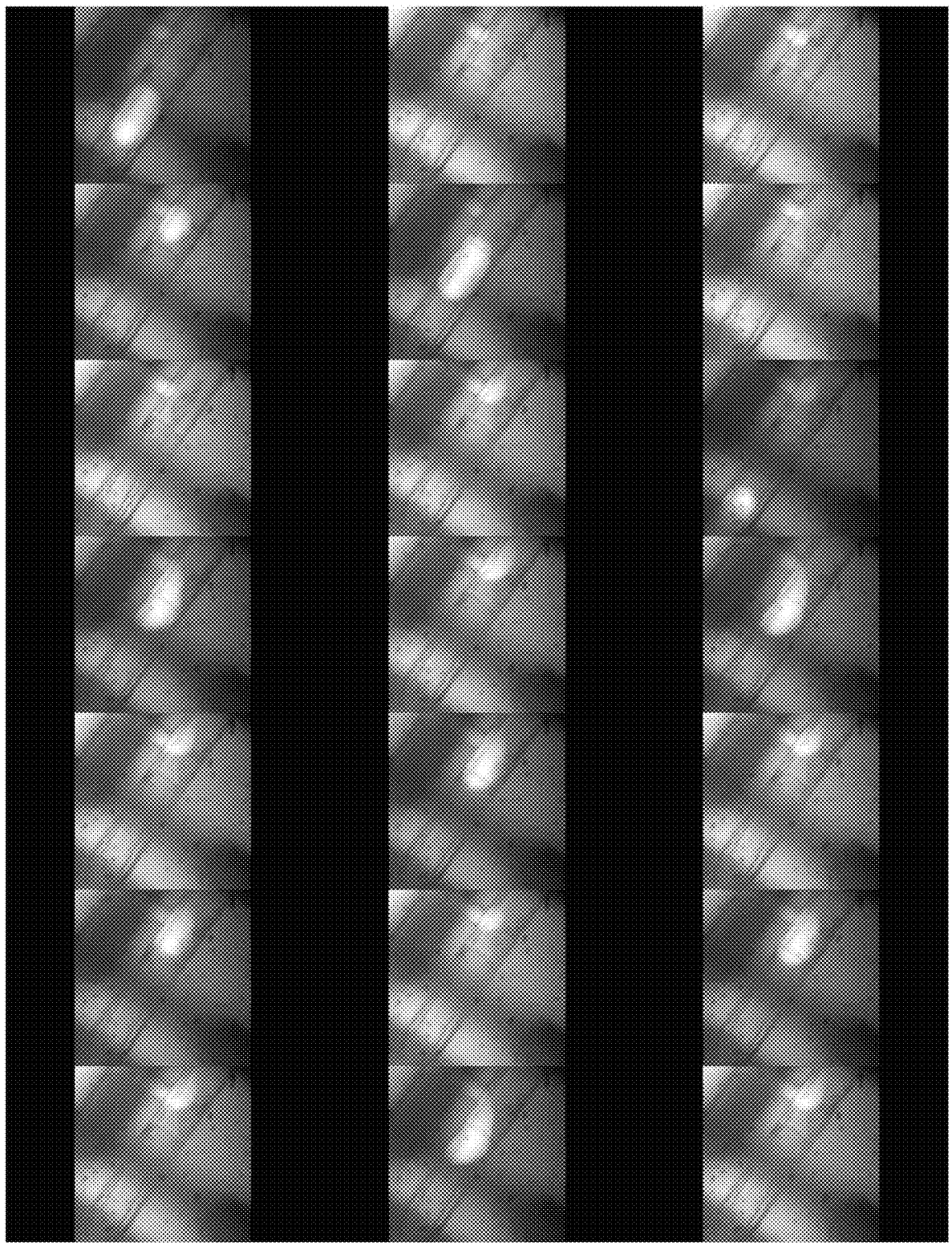
Figure 70:
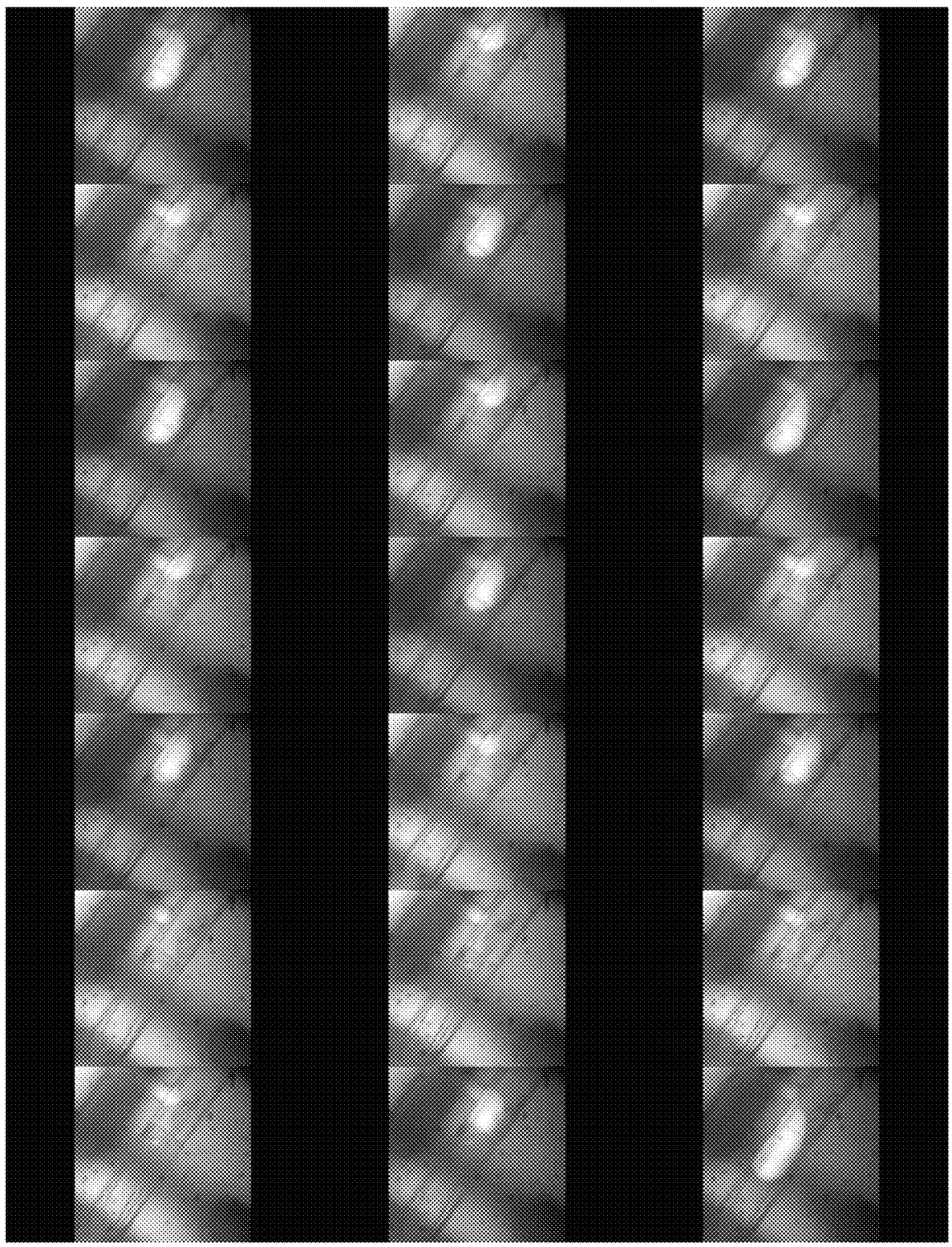
Figure 71:
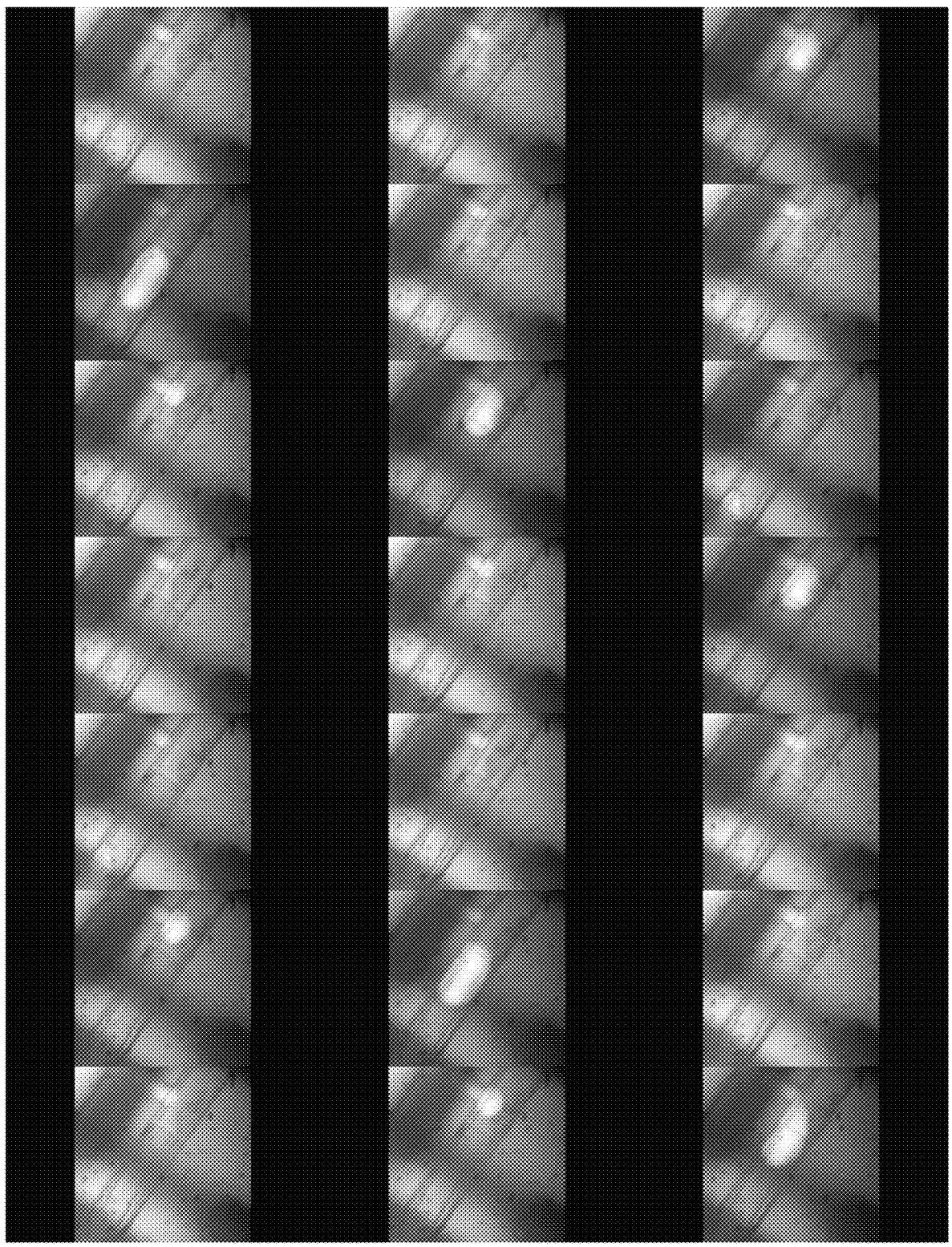
Figure 72:
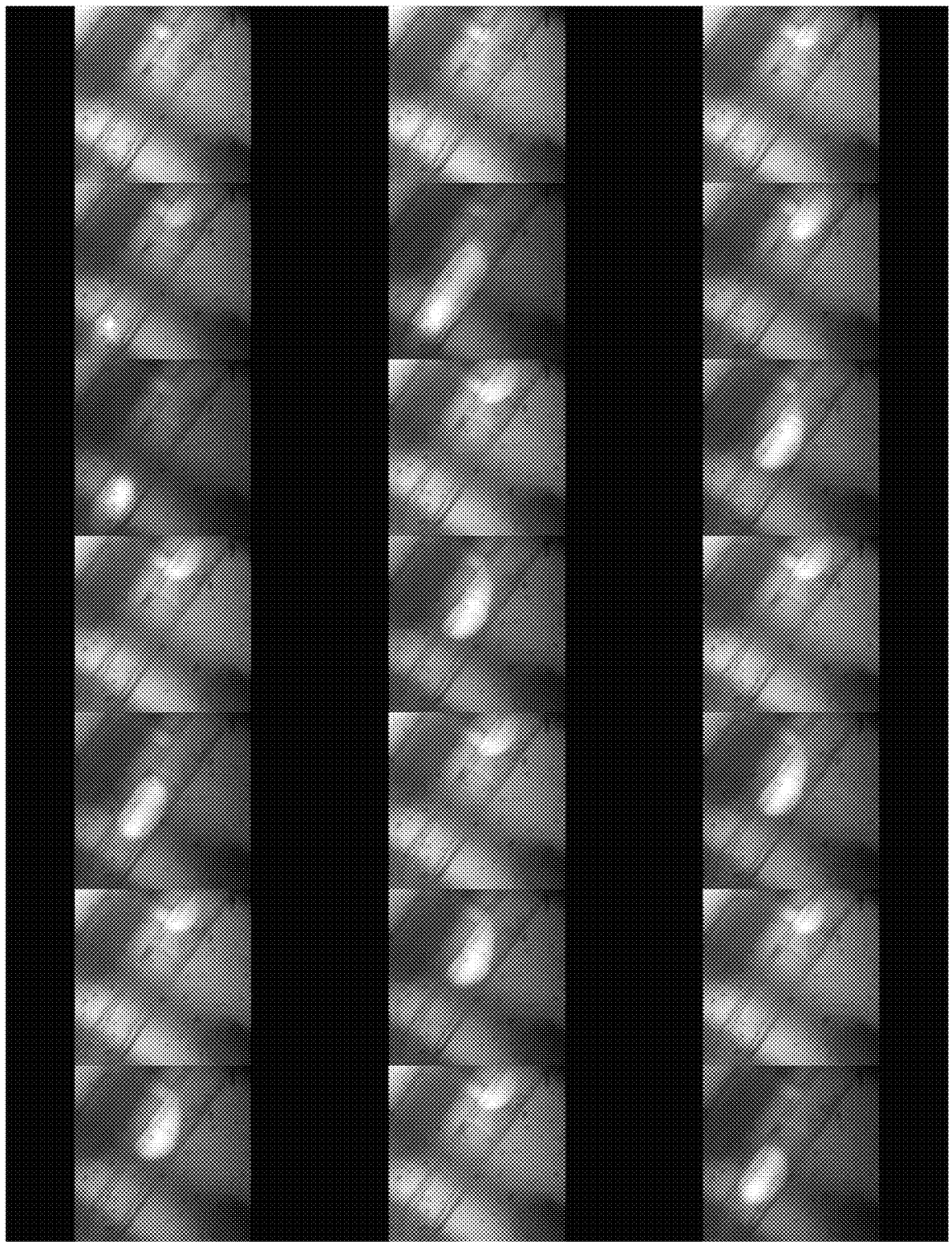
Figure 73:
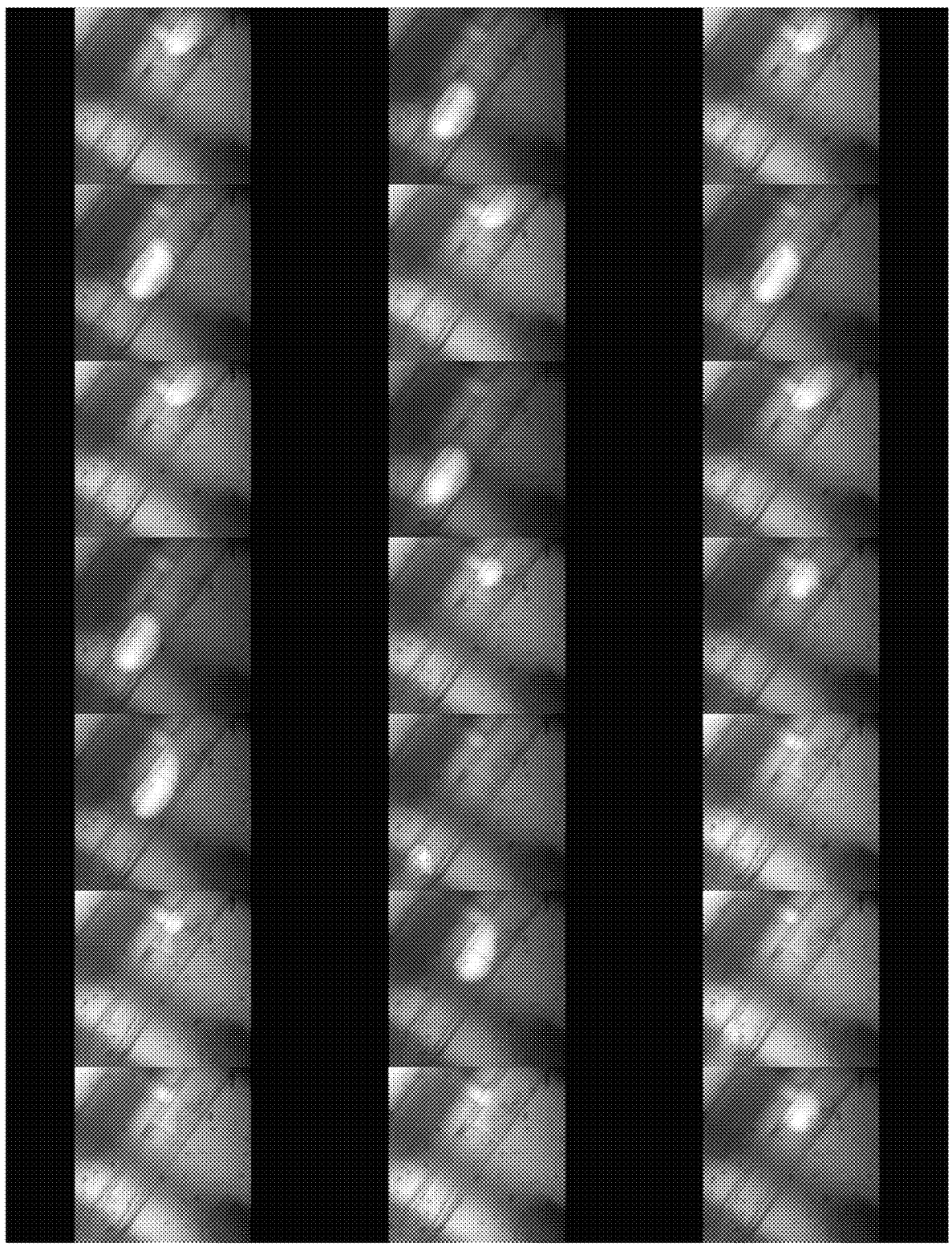
Figure 74:
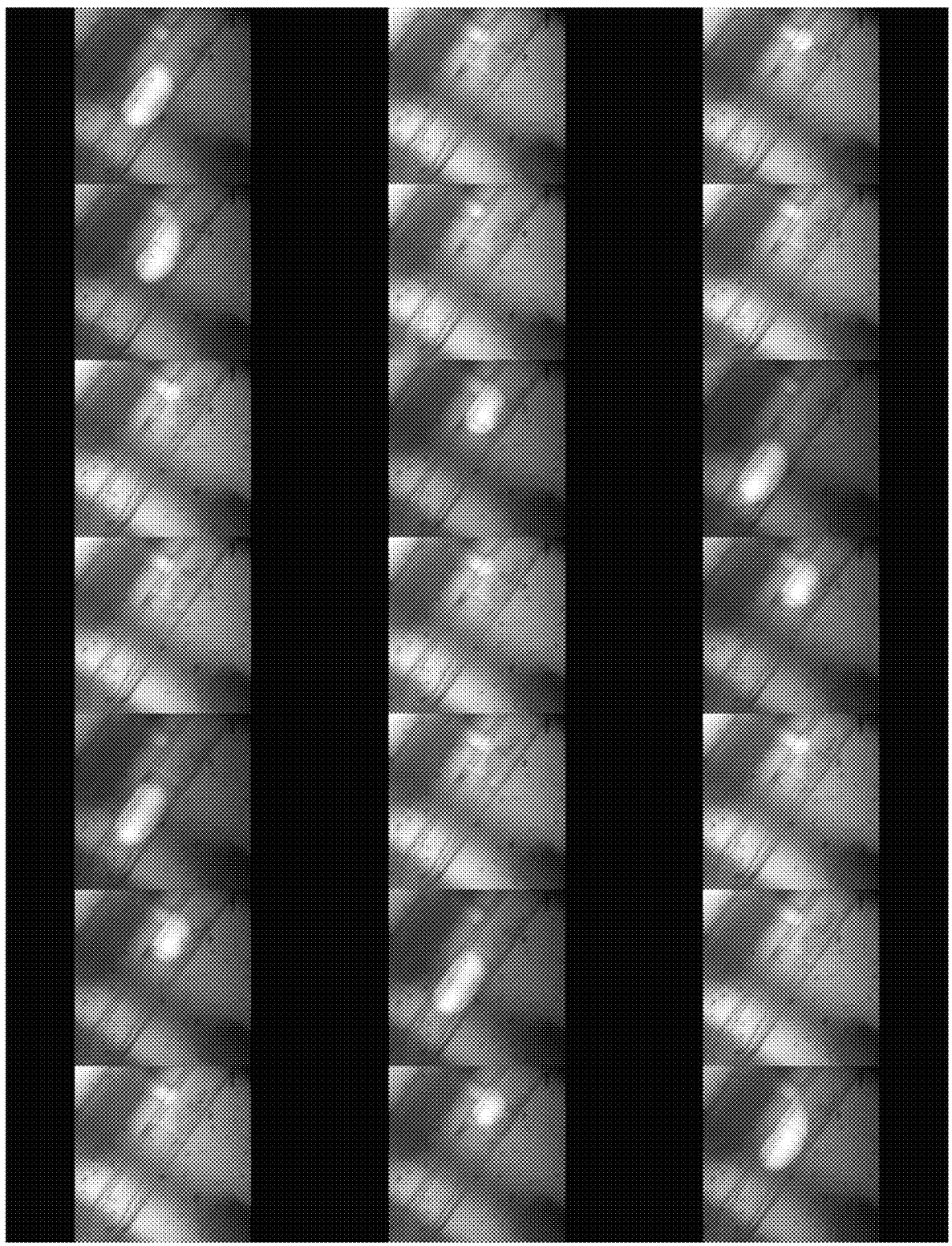
Figure 75:
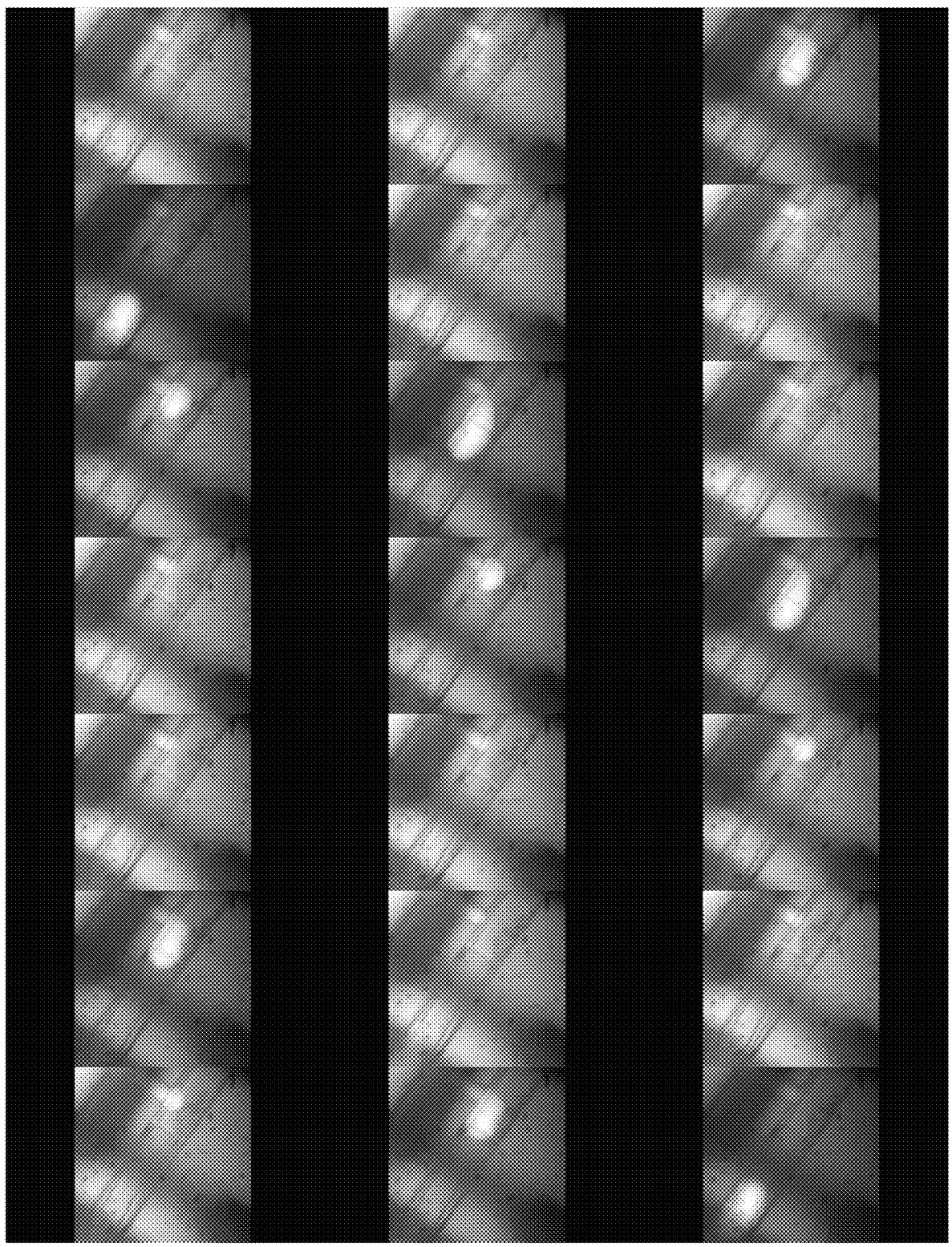
Figure 76:
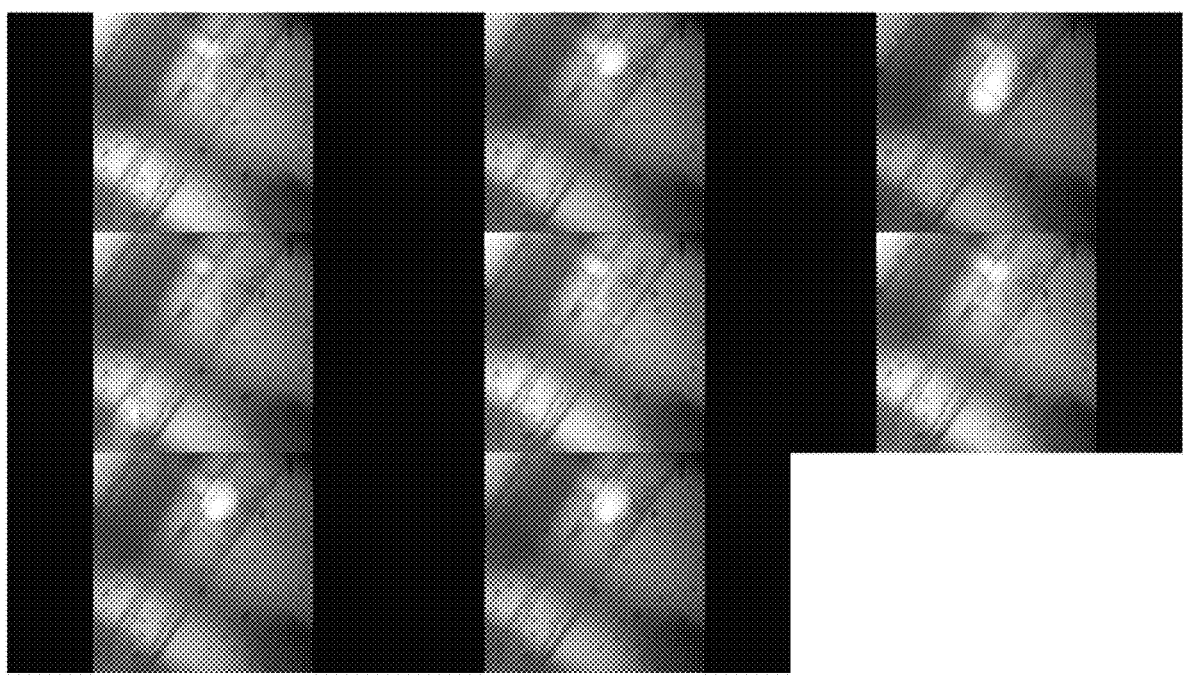

FIG. 41 illustrates results of droplet signal phase shifting induced by a manually started electric trigger with a 10 ms pulse width, according to some embodiments. A phase shift of approximately 3 ms to 88 ms is achieved with an electric triggering signal. The droplet width and frequency do not change before and after the trigger signal. The phase shift correlates with the start time of the trigger that was initiated manually at a random time. The results show the time resolution of the method down to a few milliseconds. This process can be automated with hardware and software components, similar to what is shown in FIG. 55.

Figure 42:
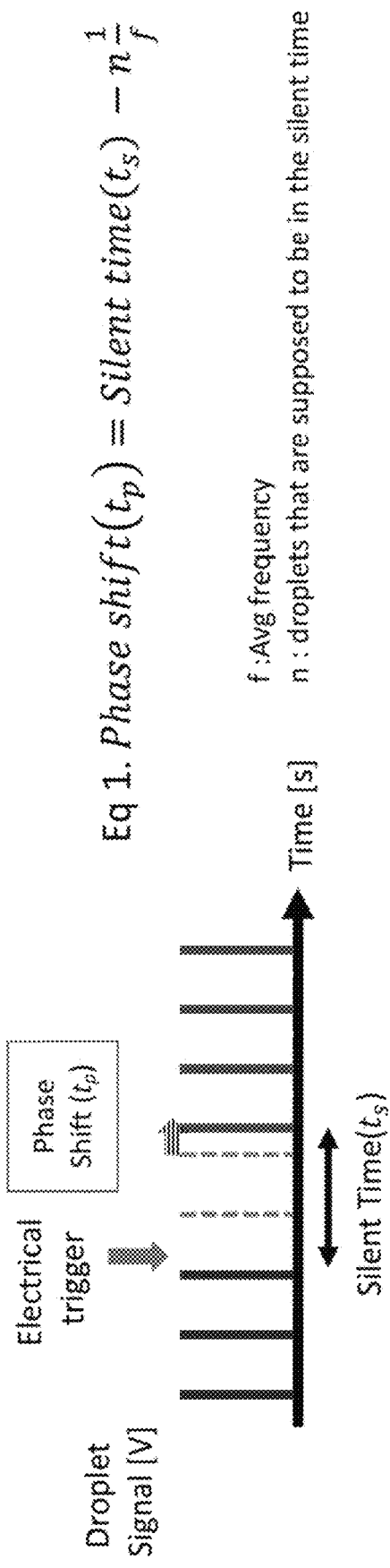
FIG. 42 illustrates results of droplet signal phase shifting induced by an electric trigger with a 100 ms pulse width, according to some embodiments

FIG. 42 illustrates results of droplet signal phase shifting induced by an electric trigger with a 100 ms pulse width, according to some embodiments. A phase shift of approximately 3 ms to 88 ms is achieved with an electric triggering signal. The droplet width and frequency do not change before and after the trigger signal.

Figure 43:
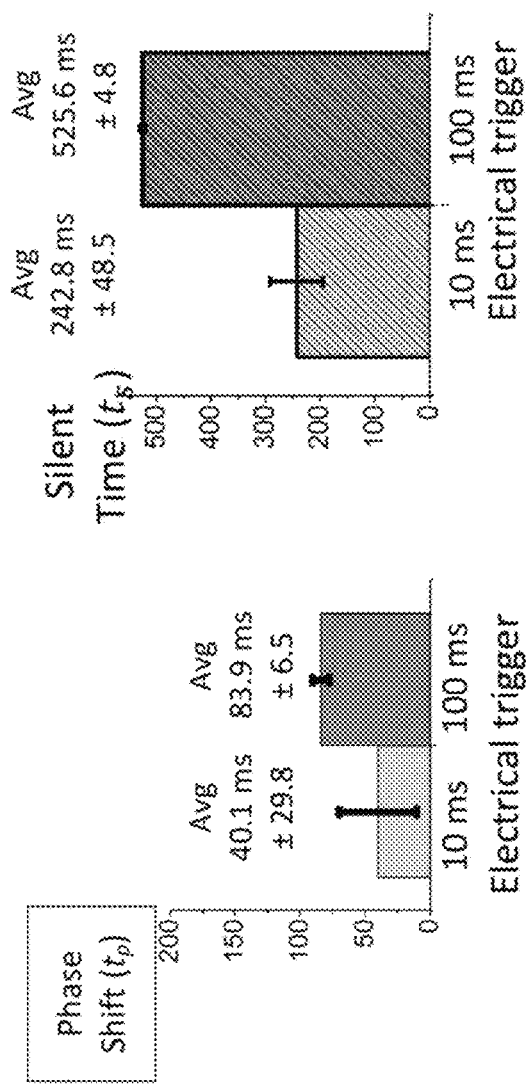
FIG. 43 illustrates phase shift size differences for droplet signal phase shifting induced by electric triggers with 10 ms and 100 ms pulse widths, according to some embodiments.

FIG. 43 illustrates phase shift size differences for droplet signal phase shifting induced by electric triggers with 10 ms and 100 ms pulse widths, according to some embodiments. A 100 ms pulse width trigger causes a larger phase shift and larger silent time as compared to a 10 ms pulse width trigger. Phase shifts of approximately 3 ms to 88 ms are achieved by electric triggering signal pulse durations of 10 ms and 100 ms respectively. There are no changes in droplet width and frequency seen before and after the trigger signal.

FIG. 44 illustrates droplet signal frequency (Hz) and droplet widths (ms) before and after 10 ms and 100 ms trigger signal pulse widths, according to some embodiments.

Figure 45:
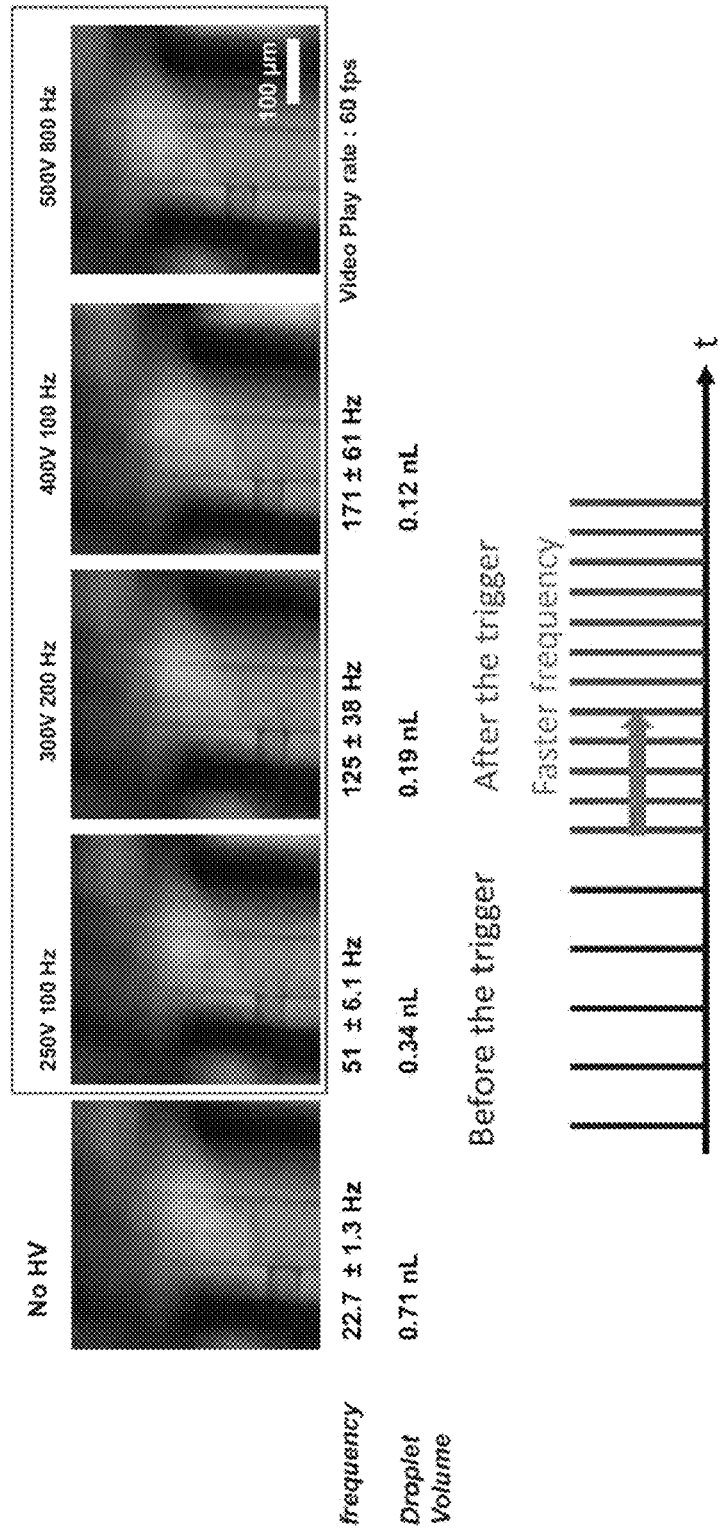
FIG. 45 illustrates still images taken from the results of multiple experiments for determining droplet signal frequencies (Hz) and droplet volumes generated before and after trigger by a continuous electric signal pulse of greater than 1 s, according to some embodiments.

FIG. 45 illustrates still images taken from the results of multiple experiments for determining droplet signal frequencies (Hz) and droplet volumes generated before and after trigger by a continuous electric signal pulse of greater than 1 s, according to some embodiments.

Figure 46:
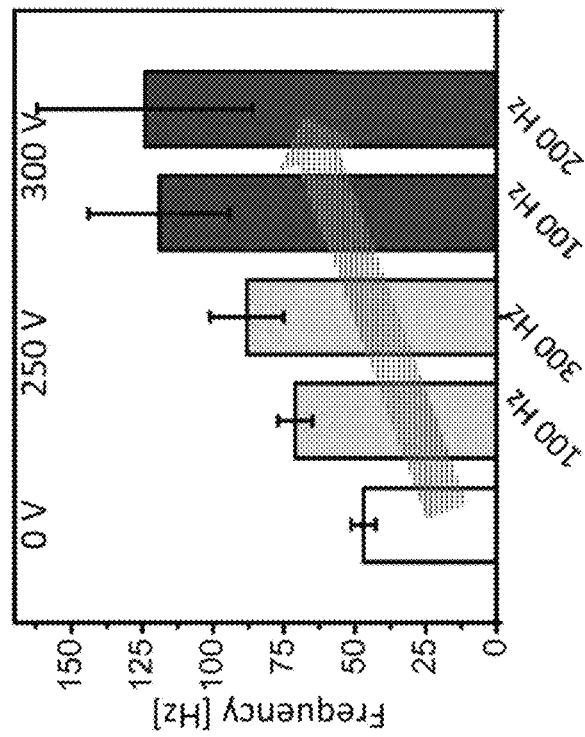
FIG. 46 illustrates droplet signal frequencies (Hz) generated by a continuous electric signal pulse of greater than 1 s for multiple voltage levels, according to some embodiments.

FIG. 46 illustrates droplet signal frequencies (Hz) generated by a continuous electric signal pulse of greater than 1 s for multiple voltage levels, according to some embodiments. By applying a continuous signal, the droplet generation frequency is increased up to ×2.5. Above 300 V, an electro-spraying effect is observed.

Figure 47:
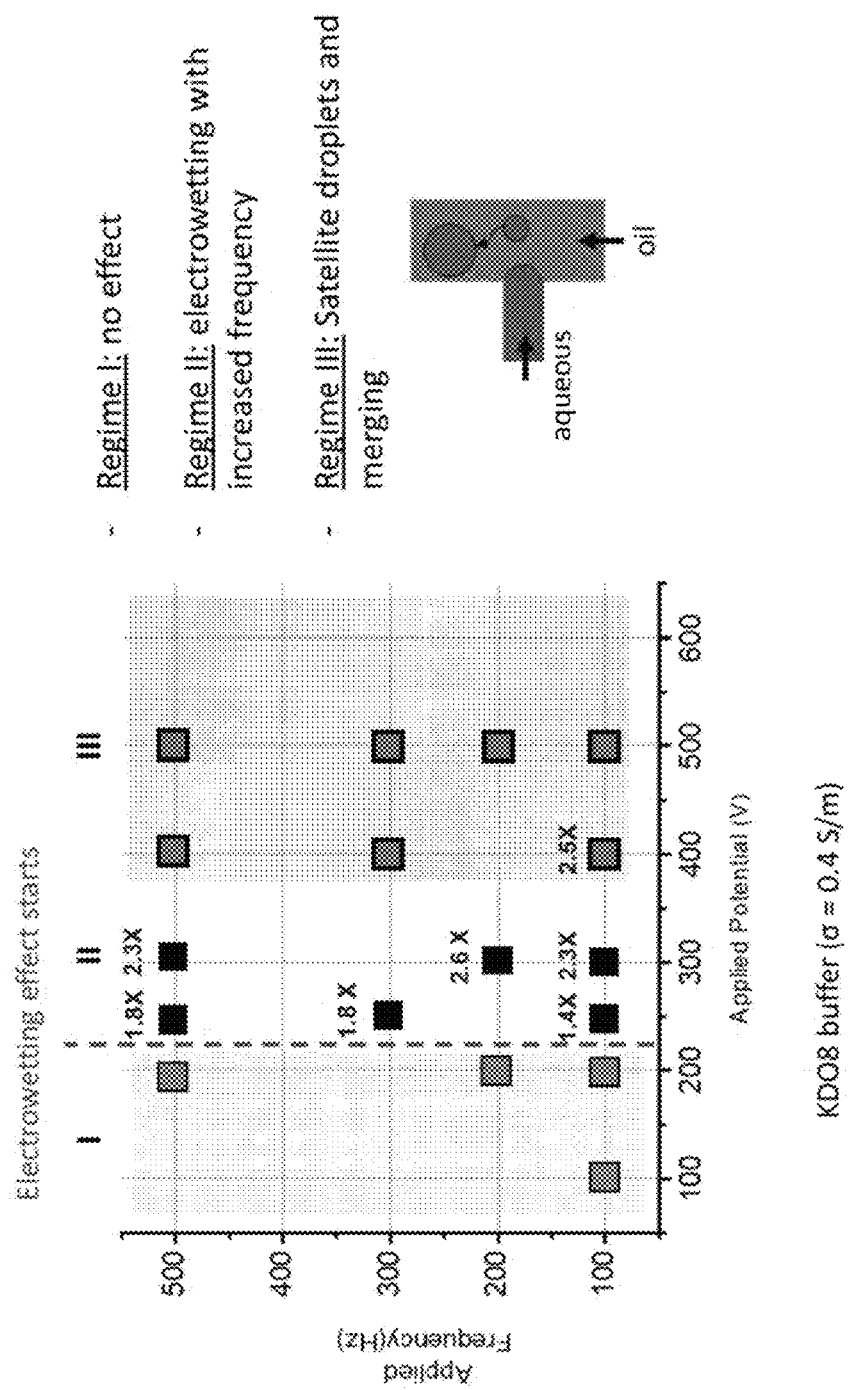
FIG. 47 is a graph indicting electrowetting effects and the occurrence of satellite droplets relative to increasing applied potential and increasing applied frequency, according to some embodiments.

FIG. 47 is a graph indicting electrowetting effects and the occurrence of satellite droplets relative to increasing applied potential and increasing applied frequency, according to some embodiments.

Figure 48:
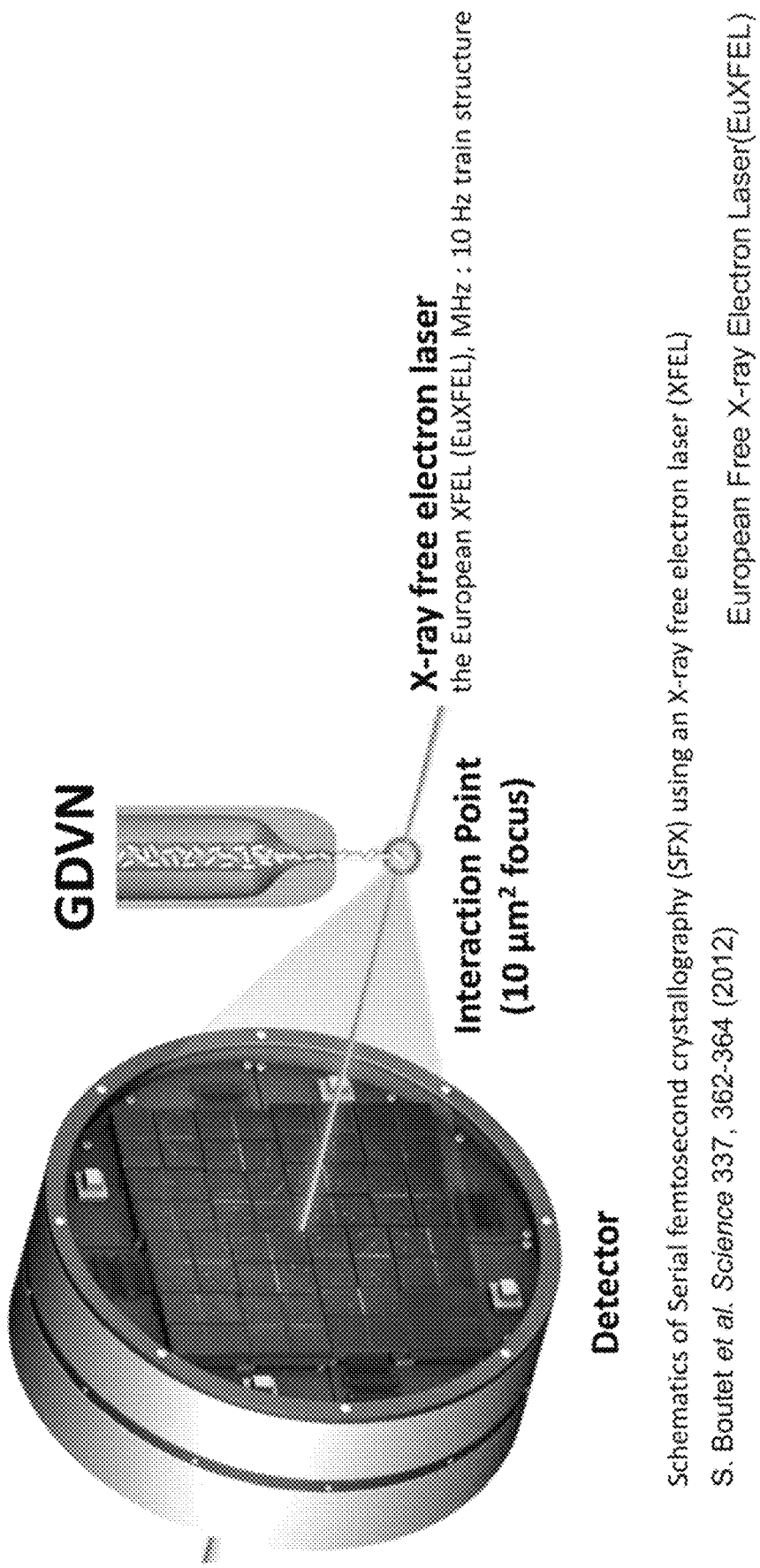
FIG. 48 illustrates an example of a serial femtosecond crystallography (SFX) system using the European Free X-ray Electron Laser (EuXFEL) for application of on-demand droplet generation, according to some embodiments.

FIG. 48 illustrates an example of a serial femtosecond crystallography (SFX) system using the European Free X-ray Electron Laser (EuXFEL) for application of on-demand droplet generation, according to some embodiments. SFX using an X-ray free electron laser (XFEL) may be used to determine protein structures. SFX with XFEL's include resource intensive methods that require large amounts of protein crystals, for example, up to 1 g of protein. Gas dynamic virtual nozzles (GDVNs) may be used to inject a continuous stream of protein crystals into the path of the XFEL. However, pulsed X-rays such as 120 Hz at LCLS 10 MHz bursts in a 10 Hz train structure at EuXFEL), result in significant wastage of injected protein crystals between pulses. Therefore, the frequency of the generated droplets should match the pulse structure of the XFEL. A significant challenge to this method of reducing sample consumption is matching the phase of droplet generation with the phase of the X-ray pulses.

Figure 49:
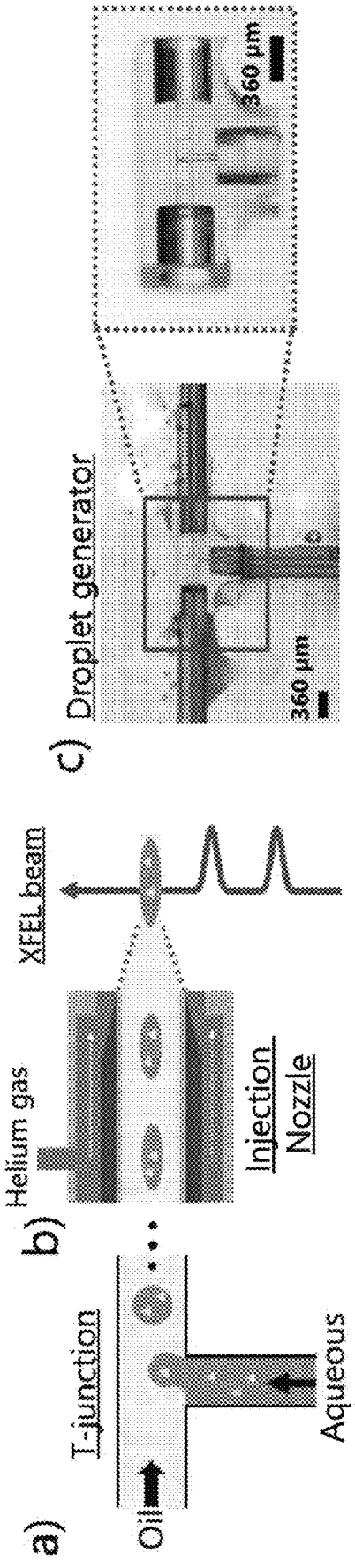
FIG. 49 illustrates application of on-demand droplet generation by electric triggering to XFEL or other pulsed X-ray sources, according to some embodiments.

FIG. 49 illustrates application of on-demand droplet generation by electric triggering to XFEL or other pulsed X-ray sources, according to some embodiments. Droplets containing protein crystals and XFEL signal are synchronized to reveal protein crystal structures and to reduce the amount of protein sample crystals required for serial femtosecond crystallography.

Figure 50:
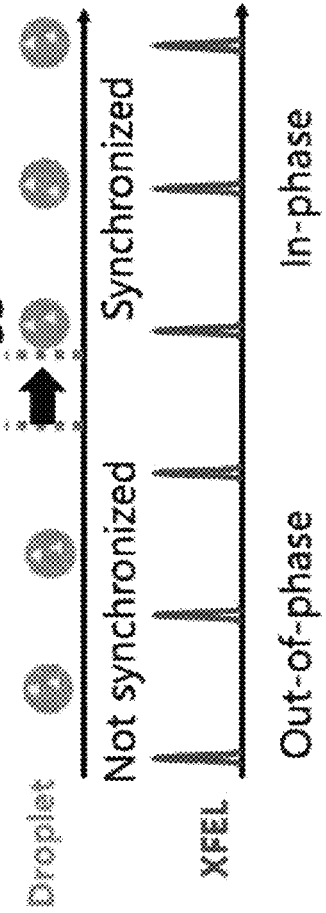
FIG. 50 illustrates an application of droplet frequency phase shifting by electric trigger utilizing a gallium electrode device for adjusting droplet phase, according to some embodiments.

FIG. 50 illustrates an application of droplet frequency phase shifting by electric trigger utilizing a gallium electrode device for adjusting droplet phase, according to some embodiments. Droplet generation frequency and phase can be modulated by electric triggering. A metal electrode inserted in the droplet generator can improve droplet synchronization with X-ray pulses. Electric trigger experiments were tested at the EuXFEL, which is located in Hamburg, Germany. A metal electrode device can be used to trigger the droplets and for synchronizing the droplet frequency with the XFEL signal by an electric trigger. The droplet generation frequency and XFEL frequency may be synchronized by causing a phase shift in the generated droplets.

Figure 51:
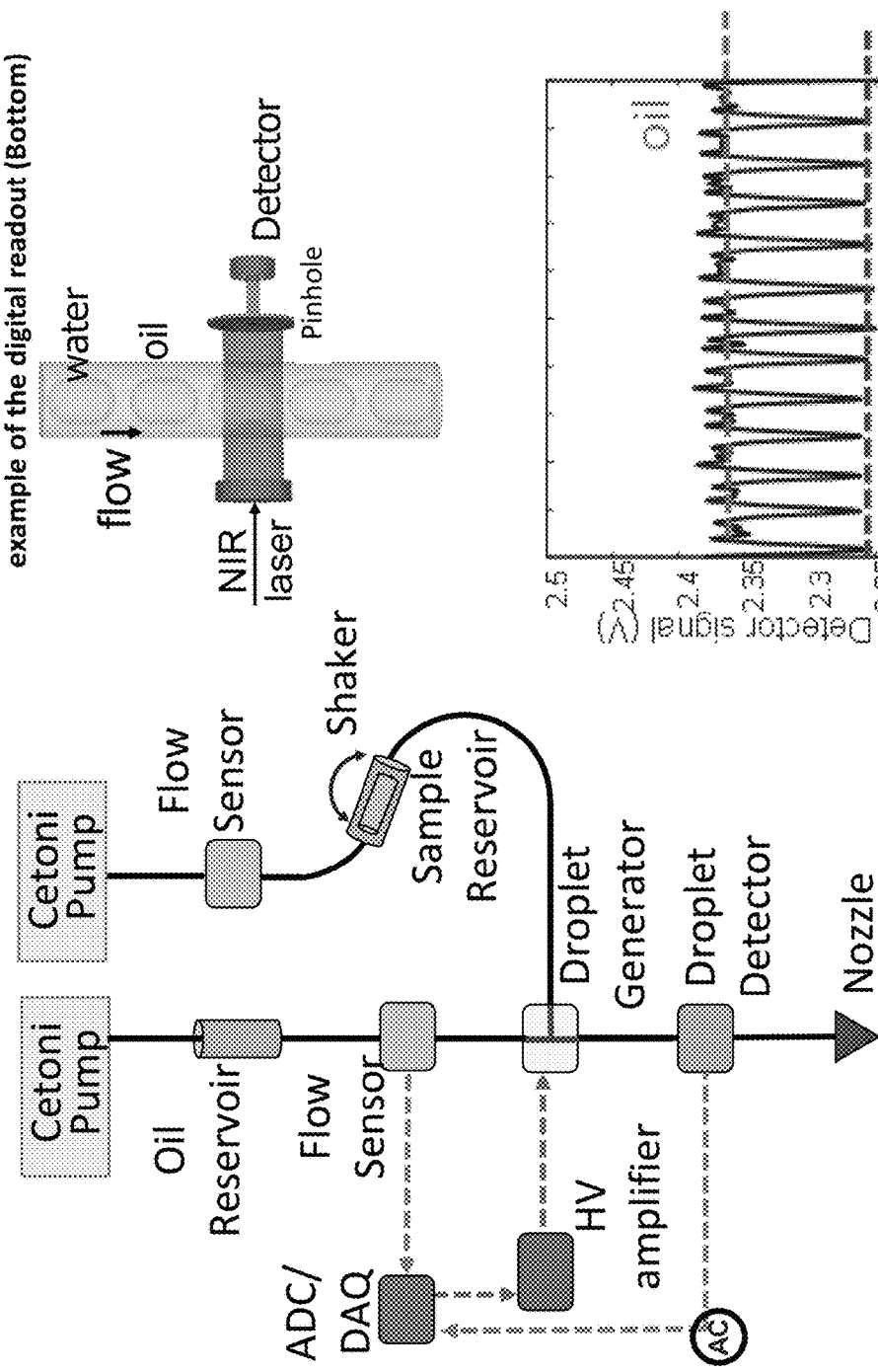
FIG. 51 is a schematic diagram of an electrically triggered droplet workflow at a EuXFEL beamline experiment station, according to some embodiments.

FIG. 51 illustrates a schematic diagram of an electrically triggered droplet workflow at a beamline experiment station in EuXFEL, according to some embodiments. The experiment set-up includes a real-time droplet detector and an example of a digital readout from the droplet detector.

FIG. 52 includes a photograph of an experimental setup in EuXFEL, an AC trigger pulse signal trace, and a droplet response, according to some embodiments. Possible AC voltages that are applied for electrical droplet triggering and frequency tuning include 100V, 200V, 250V and 300V, at 300 Hz. Droplet responses confirmed that the droplets were triggered by the trigger AC pulse signal of the electrical trace.

Figure 53:
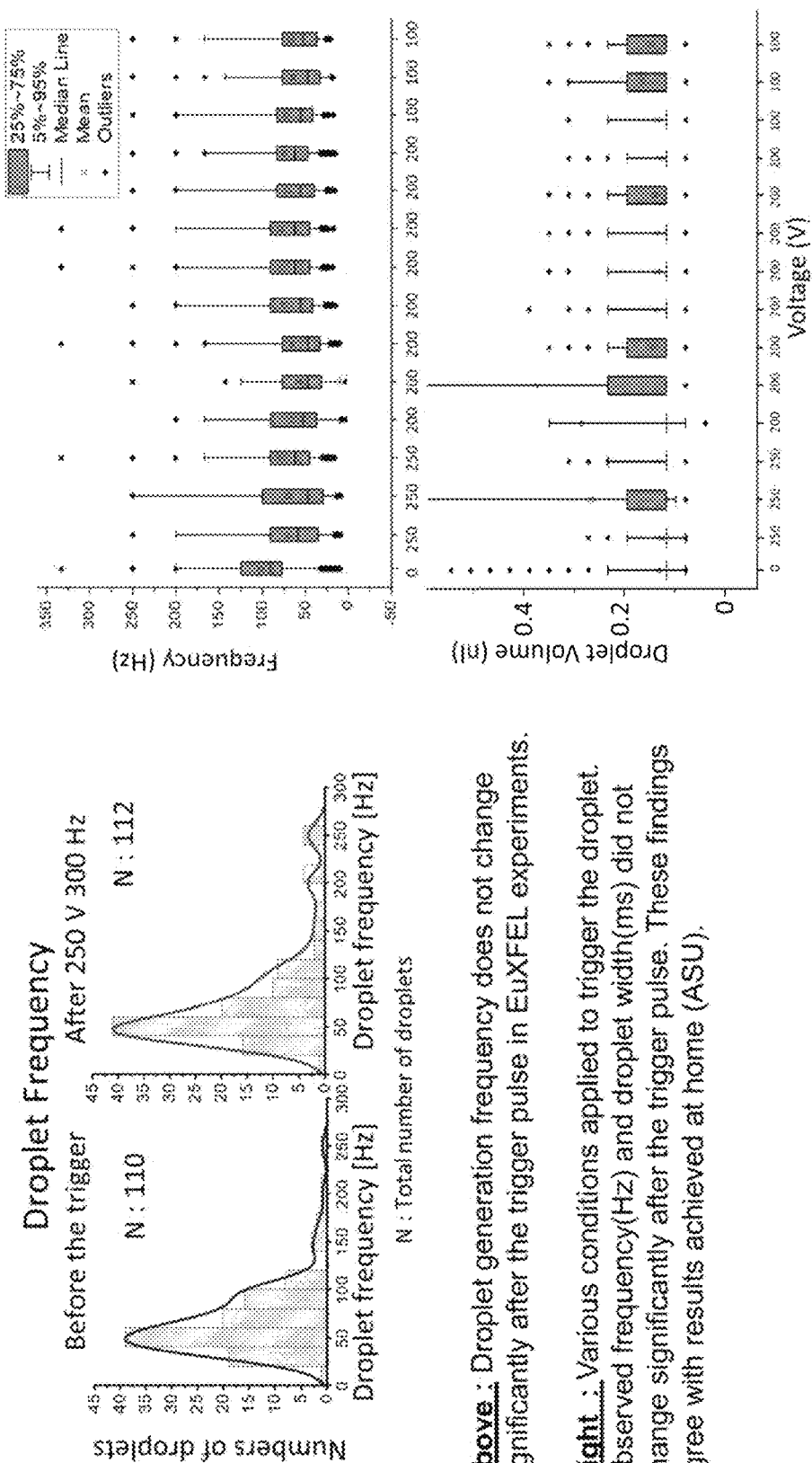
FIG. 53 illustrates a comparison of droplet frequencies before and after a trigger pulse is applied, according to some embodiments.

FIG. 53 illustrates a comparison of droplet frequencies before and after a trigger pulse is applied, according to some embodiments. Droplet generation frequency does not change significantly after the trigger pulse in EuXFEL experiments. Various conditions were applied to triggering of the droplets. Observed frequency (Hz) and droplet width (ms) did not change significantly after the trigger pulse. These findings agree with results achieved at Arizona State University.

FIG. 54 illustrates protein crystal buffer information, according to some embodiments FIG. 55 illustrates a flow diagram for an electrical trigger where a length of the trigger (in time) is adjusted or the initiation of the trigger is adjusted dependent on an actual droplet phase delay. In step 5501 a droplet frequency or droplet phase is detected by the droplet detector 3430, shown in FIG. 37. In step 5503, if the droplet frequency or phase is not synchronized with the laser of the detector, the DAQ and ADC 3416 adjusts the length of the trigger in time, or the initiation time of the trigger depending on the detected droplet frequency or phase to synchronize the droplets with the droplet detector's laser. In some embodiments, the amplitude of an applied AC signal, the amplitude of an applied DC signal, and/or a frequency of an applied AC signal of the electrical trigger can be adjusted based on the actual droplet phase delay.

FIGS. 56-76 comprise a series of frames captured from a video showing an experiment in operation corresponding to the experimental results for droplet frequency tuning shown in FIG. 25 and the experiment device 4-1 shown in FIG. 13. The video frames should be read in rows from left to right, and then from the top of the page to the bottom of the page.

In summary, water-in-oil droplets were created using a 3D-printed droplet generator with integrated Ga electrodes using two DC short pulse signals that trigger the generation of droplets (i.e., on-demand droplet generation). A short pulse trigger, for example, of 10 ms or 100 ms causes a droplet phase shift with no change in droplet frequency and droplet width. Also, a long pulse trigger, for example, greater than 1 s, induces a droplet frequency increase.

Although the invention has been described in detail with reference to certain preferred embodiments, variations and modifications exist within the scope and spirit of one or more independent aspects of the invention as described.

What is claimed is:

1. A system for synchronizing water droplet phase of a microfluidic water droplet-in-oil stream with a phase of an x-ray free electron laser, the system comprising:
    a microfluidic T-junction phase synchronizer, the microfluidic T-junction phase synchronizer interfaced to:
        an upstream water-in-oil droplet generator device at a first inlet of the microfluidic T-junction phase synchronizer via a first capillary;
        a downstream water droplet detector at an outlet of the microfluidic T-junction phase synchronizer via a second capillary; and
        an upstream sacrificial oil source at a second inlet of the microfluidic T-junction phase synchronizer via a third capillary;
        wherein the microfluidic T-junction phase synchronizer
            injects sacrificial oil received at the second inlet from the upstream sacrificial oil source into a microfluidic water droplet-in-oil stream received at the first inlet from the upstream water in oil droplet generator device, and
            outputs the microfluidic water droplet-in-oil stream to the downstream droplet detector;
    a controller configured to adjust the water droplet phase of the microfluidic water droplet-in-oil stream by controllably adjusting a flow rate of the sacrificial oil injected by the microfluidic T-junction phase synchronizer into the microfluidic water droplet-in-oil stream; and
    a flow rate control splitting junction with a first output interfaced to the second inlet of the microfluidic T-junction phase synchronizer and an input interfaced to the sacrificial oil source, wherein the controller is configured to control the flow rate of the injected sacrificial oil by operating the flow rate control splitting junction,
    wherein the flow rate control splitting junction includes a second output interfaced to an excess oil reservoir, and wherein the controller is configured to operate the flow rate control splitting junction to control a proportion of the sacrificial oil flow through the flow rate control splitting junction that is directed to the second inlet of the microfluidic T-junction phase synchronizer and a proportion of the sacrificial oil that is directed to the excess oil reservoir.

2. The system of claim 1, wherein the controller is configured to adjust the flow rate of the sacrificial oil injected by the microfluidic T-junction phase synchronizer into the microfluidic water droplet-in-oil stream by
    determining, based on an output signal from the downstream droplet detector, a phase difference between the water droplet phase of the water droplet-in-oil stream output by the outlet of the microfluidic T-junction phase synchronizer and the phase of the x-ray free electron laser, and
    adjusting the flow rate of the sacrificial oil to inject the sacrificial oil at a flow rate that counteracts the phase difference.

3. The system of claim 1, wherein the controller is configured to adjust the flow rate of the sacrificial oil injection based on real-time feedback received from the downstream droplet detector.

4. The system of claim 1, further comprising a controllable sacrificial oil pump, wherein the controller is further configured to adjust the flow rate of the sacrificial oil through the flow rate control splitting junction by controllably adjusting the sacrificial oil pump.

5. The system of claim 1, wherein the downstream water droplet detector includes a downstream x-ray free electron laser water droplet detector.

6. The system of claim 1, further comprising the downstream water droplet detector, wherein the downstream water droplet detector includes
    a laser configured to project a laser beam through the microfluidic water droplet-in-oil stream output of the outlet of the microfluidic T-junction phase synchronizer, and
    a photodetector configured to detect an absorbance of the laser beam by the microfluidic water droplet-in-oil stream output.

7. The system of claim 1, further comprising:
    the upstream water-in-oil droplet generator device including at least one metal electrode and a droplet generator T-junction, the droplet generator T-junction including
        an oil phase inlet channel,
        an aqueous phase inlet channel, and
        an output channel for outputting the microfluidic water droplet-in-oil stream that is provided to the first inlet of the microfluidic T-junction phase synchronizer,
    wherein the at least one metal electrode is operable to induce an electric field to control the generation of droplets in the microfluidic water droplet-in-oil stream.

8. The system of claim 7, wherein the oil phase inlet channel, the aqueous phase inlet channel, and the droplet flow outlet channel of the upstream water-in-oil droplet generator device are connected at the droplet generator T-junction, and wherein the droplet generator T-junction includes a linear channel section in which the oil phase inlet channel is coaxially coupled to the droplet flow outlet channel.

9. The system of claim 8, wherein the at least one metal electrode includes two embedded non-contact electrodes positioned on opposite sides of the linear channel section of the droplet generator T-junction such that the two embedded non-contact electrodes are arranged on an axis that intersects the linear channel section at a location where the aqueous phase inlet channel connects to the oil phase inlet channel.

10. The system of claim 9, wherein a potential applied across the two embedded non-contact electrodes initiates generation of water-in-oil droplets or determines a rate of generation of the water-in-oil droplets.

11. The system of claim 9, wherein the two embedded non-contact electrodes comprise gallium.

12. The system of claim 9, further comprising a controller, wherein the controller is configured to cause a DC pulse triggering signal to be applied to the droplet generator T-junction by the two embedded non-contact electrodes.

13. The system of claim 12, wherein an applied DC pulse triggering signal durations of 10 ms and 100 ms causes a water droplet phase shift of 3 ms to 88 ms.

14. The system of claim 12, wherein the controller is configured to adjust a phase of water droplets in the output channel of the droplet generator T-junction by repeatedly applying the DC pulse triggering signal for a duration less than or equal to 100 ms until a desired water droplet phase shift is detected.

15. The system of claim 9, further comprising a controller, wherein the controller is configured to regulate droplet formation and frequency by causing an AC signal to be applied to the droplet generator T-junction by the two embedded non-contact electrodes.

16. A serial femtosecond crystallography system comprising:
- the system of claim 1;
- the x-ray free electron laser;
- a nozzle coupled to the outlet of the microfluidic T-junction phase synchronizer by the third capillary, the nozzle configured to expel the microfluidic water droplet-in-oil stream from the outlet through a path of an x-ray beam emitted by the x-ray free electron laser; and
- a detector configured to detect crystal characteristics of a crystal in an aqueous sample droplet in the microfluidic water droplet-in-oil stream when the x-ray beam emitted by the x-ray free electron laser impinges on the crystal.

* * * * *